(12) United States Patent
Kawabata et al.

(10) Patent No.: US 8,198,665 B2
(45) Date of Patent: Jun. 12, 2012

(54) SEMICONDUCTOR STORAGE DEVICE AND MANUFACTURING METHOD THEREOF

(75) Inventors: Kenji Kawabata, Yokohama (JP); Hisataka Meguro, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 861 days.

(21) Appl. No.: 12/245,396

(22) Filed: Oct. 3, 2008

(65) Prior Publication Data

US 2009/0096004 A1 Apr. 16, 2009

(30) Foreign Application Priority Data

Oct. 5, 2007 (JP) ................. 2007-262471

(51) Int. Cl.
 *H01L 29/788* (2006.01)
 *H01L 21/336* (2006.01)

(52) U.S. Cl. .................................................... 257/314

(58) Field of Classification Search ........... 257/E21.409, 257/751, 774, 762, 200, 758, 288, 298, 776, 257/E21.586, E21.579, 773, 374, 499–564, 257/763, 737, 68–71, 296–309, 905–908, 257/E27.084–E27.097, E27.075, 295, E21.646–E21.66, 257/314–326, E27.078, E29.3–E29.309, 257/E21.179–E21.182, E21.209–E21.21, 257/E21.422, E21.423, E21.679–E21.694; 257/E21.662, E21.666–E21.678, 225–234, 257/390, E27.076; 977/700, 707, 708, 709, 977/712, 720–723, 759, 773; 438/762, 275–278, 438/639, 643, 687, 637, 785, 582, 299, 15, 438/3, 669, 709, 703, 597, 448, 396, 253, 438/200, 622
See application file for complete search history.

(56) References Cited

U.S. PATENT DOCUMENTS

| | | | |
|---|---|---|---|
| 6,285,055 B1 | 9/2001 | Gosain et al. | |
| 6,323,504 B1 | 11/2001 | Shin et al. | |
| 6,894,352 B2 | 5/2005 | Hu et al. | |
| 2004/0266109 A1* | 12/2004 | Ogura et al. | 438/260 |
| 2005/0173751 A1* | 8/2005 | Ishii et al. | 257/314 |
| 2007/0210368 A1* | 9/2007 | Cho et al. | 257/314 |
| 2008/0116499 A1* | 5/2008 | Ou et al. | 257/314 |
| 2008/0266960 A1* | 10/2008 | Kuo | 365/185.12 |

FOREIGN PATENT DOCUMENTS

| | | |
|---|---|---|
| JP | 2004-343128 | 12/2004 |
| JP | 2006-196622 | 7/2006 |

OTHER PUBLICATIONS

Kawabata, K., "Semiconductor Storage Element and Manufacturing Method Thereof," U.S. Appl. No. 11/947,428, filed Nov. 29, 2007.
Yano, K. et al., "Single-Electron Memory for Giga-to-Tera Bit Storage," Proceedings of the IEEE, vol. 87, No. 4, pp. 633-651, (Apr. 1999).
Gopalakrishnan, K. et al., "The Micro to Nano Addressing Block (MNAB)," 2005 IEEE International Electron Device Meeting, Lecture No. 19.4, 4 pages, (2005).

* cited by examiner

*Primary Examiner* — Dao H Nguyen
*Assistant Examiner* — Tram H Nguyen
(74) *Attorney, Agent, or Firm* — Finnegan, Henderson, Farabow, Garrett & Dunner, L.L.P.

(57) ABSTRACT

A semiconductor storage device includes: a substrate having a semiconductor layer at least on a surface thereof; and a plurality of quantum dot elements forming a charge storage layer formed above the semiconductor layer via a first insulating film that becomes a tunnel insulating film in such a manner that the quantum dot elements are connected with a bit line in series, wherein each quantum dot element forms a single electron memory.

13 Claims, 61 Drawing Sheets

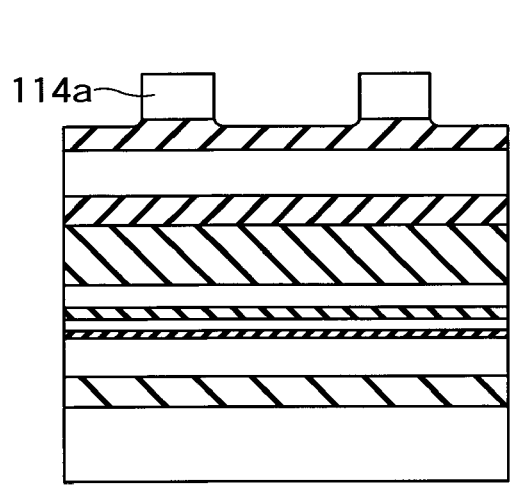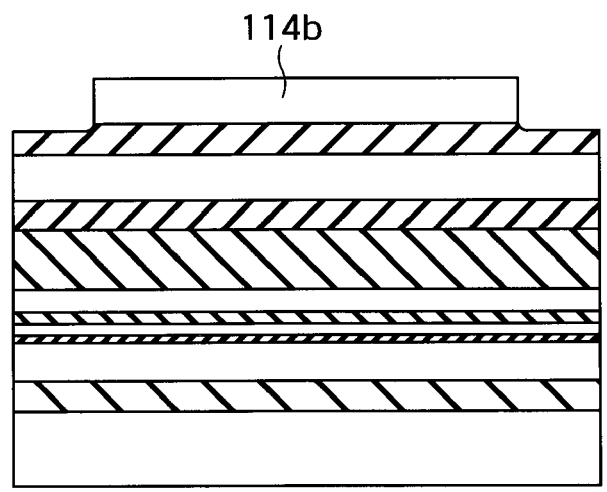
FIG. 39A　　　　　FIG. 39B
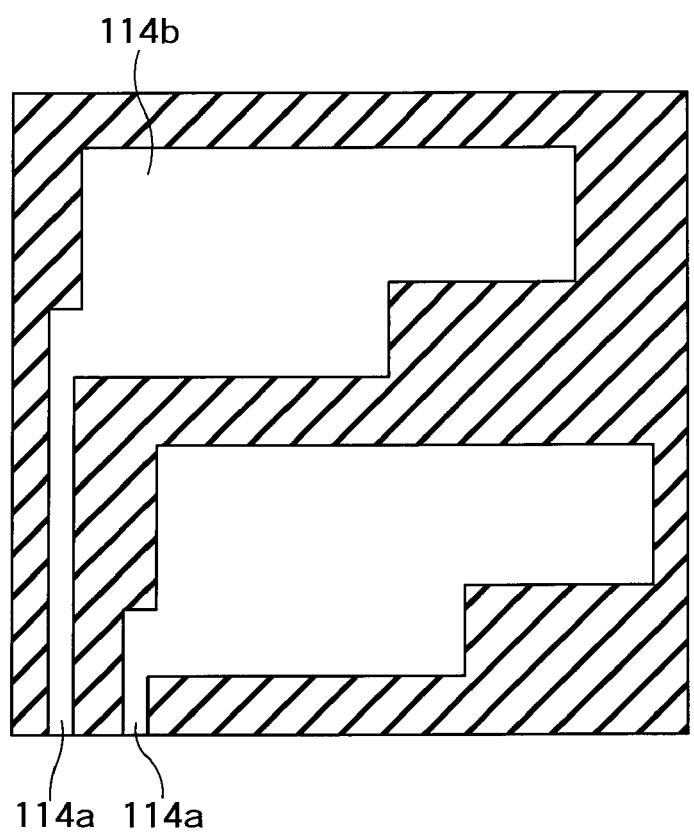
FIG. 39C

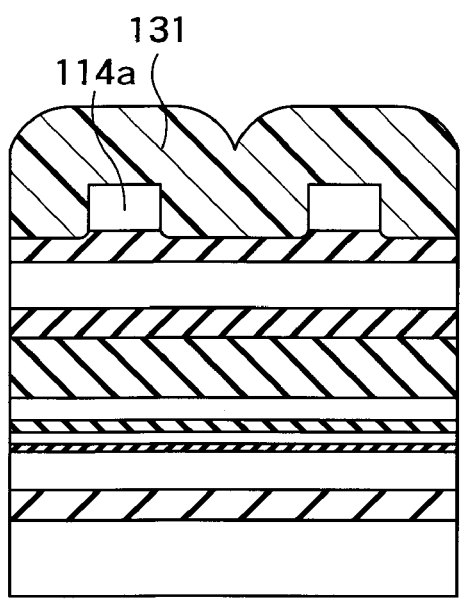
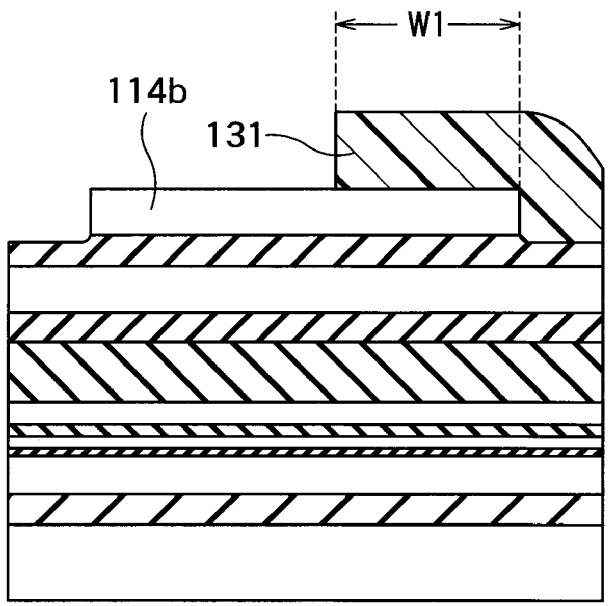
FIG. 40A  FIG. 40B
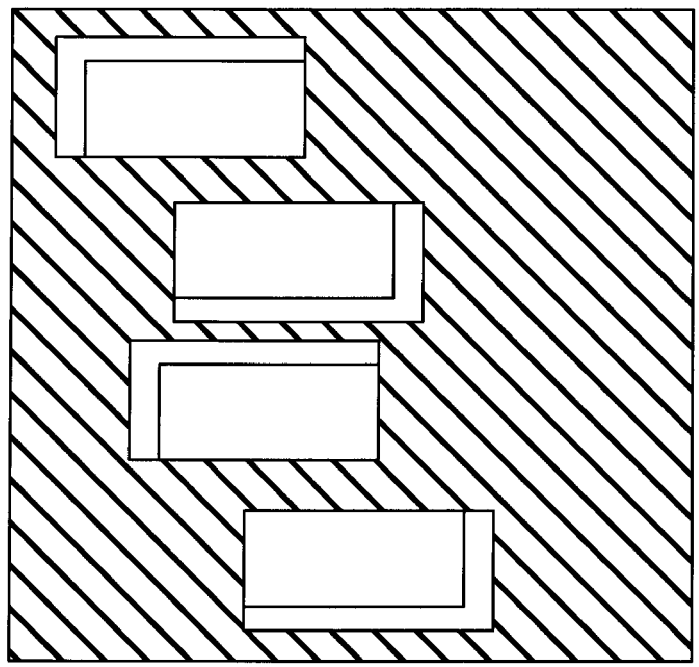
FIG. 40C

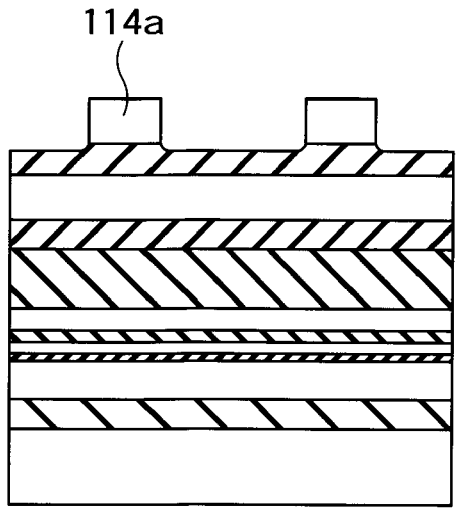
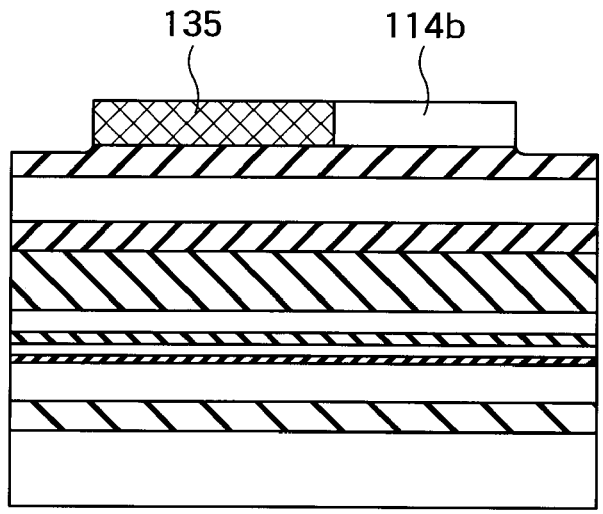
FIG. 42A  FIG. 42B
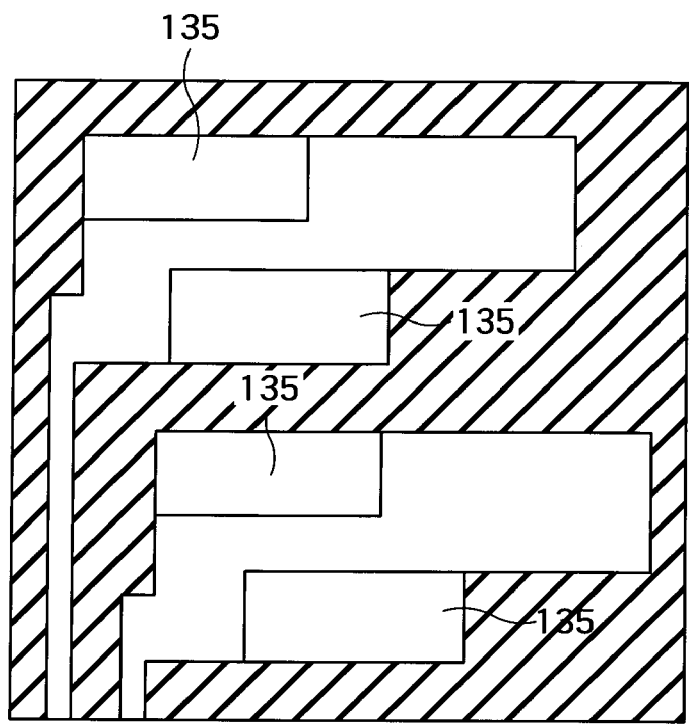
FIG. 42C

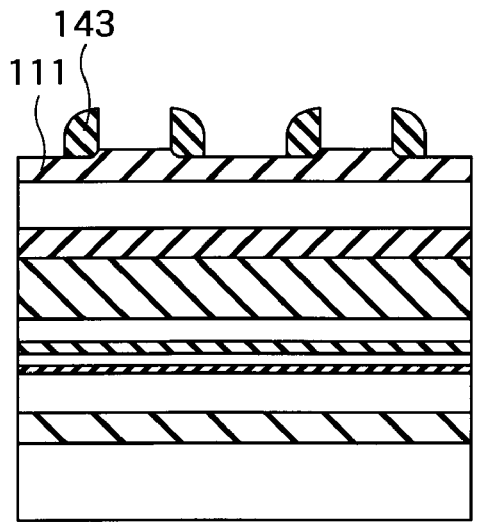
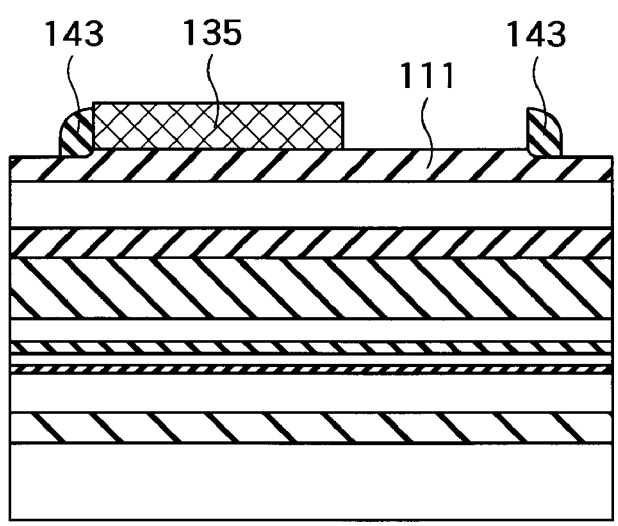
FIG. 45A    FIG. 45B
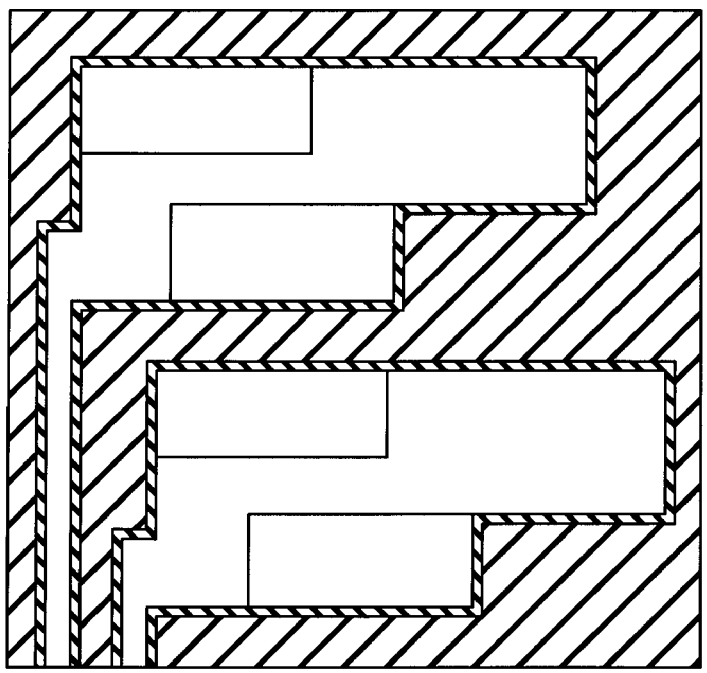
FIG. 45C

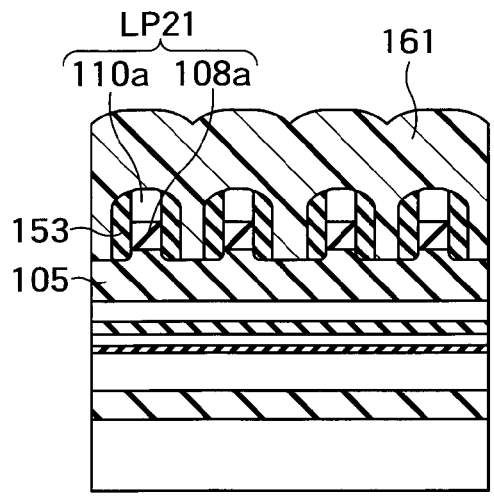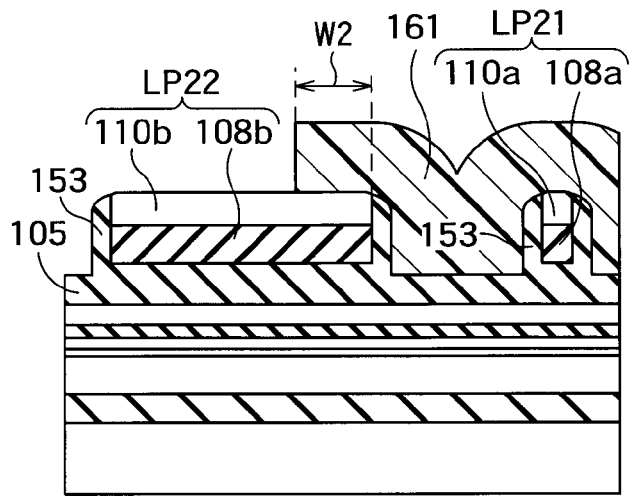
FIG. 52A  FIG. 52B
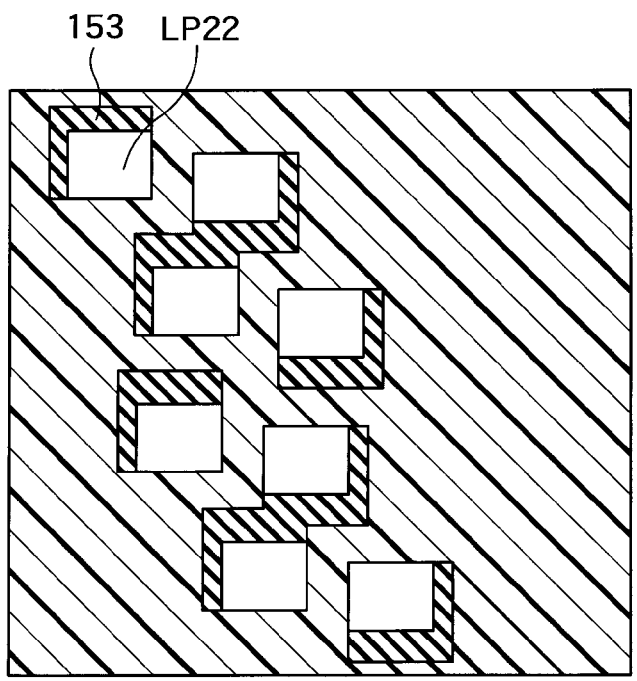
FIG. 52C

SEMICONDUCTOR STORAGE DEVICE AND MANUFACTURING METHOD THEREOF

CROSS REFERENCE TO RELATED APPLICATION

This application claims benefit of priority under 35USC §119 to Japanese patent application No. 2007-262471, filed on Oct. 5, 2007, the contents of which are incorporated by reference herein.

BACKGROUND OF THE INVENTION

1. Field of the Invention

The present invention relates to a semiconductor storage device and a manufacturing method thereof.

2. Related Background Art

Various proposals have been submitted to realize a single electron memory that can operate at room temperature. The single electron memory is a memory that utilizes a Coulomb blockade phenomenon observed in a quantum dot, and a fundamental principle thereof is summarized in U.S. Pat. No. 6,323,504. A single electron memory element with silicon crystal grains having a diameter of 6 nm is proposed in, e.g., Japanese Laid open (kokai) No. 2004-343128.

However, for the single electron memory element proposed in Japanese laid open (kokai) No. 2004-343128, stable mass production thereof is difficult due to the difficulty in controlling the size of such micro crystal grains.

Further, in U.S. Pat. No. 6,894,352B2 is proposed a single electron transistor that is operable on a trial production stage with each quantum dot of 80 nm or below being confined to an electric field. However, in U.S. Pat. No. 6,894,352B2, manufacture must be carried out by using EB (Electron Beam) lithography, and hence there is a drawback that mass production is difficult.

PROCEEDINGS OF THE IEEE Vol. 87 No. 4, April 1999 (which will be referred to as a "Non-patent document 1" hereinafter) discloses the world's first single electron memory that operates at room temperature, and spontaneous formation of an extra fine current path or a charge storage region which is as large as a crystal grain is realized by utilizing irregularities of a polysilicon film.

However, the element disclosed in Non-patent document 1 is not only insufficient in controllability over processes but also has a drawback that peripheral circuits have a large scale. For example, a variation compensating circuit is required.

In 2005 IEEE International Electron Device Meeting (2005 IEDM), Lecture No. 19.4 (which will be referred to as a "Non-patent document 2" hereinafter) is proposed a memory cell having a two-dimensional structure achieved by aligning thin lines vertically and horizontally and providing four gates. However, the element disclosed in Non-patent document 2 likewise has a drawback that mass production is difficult since EB exposure is required.

SUMMARY OF THE INVENTION

According to a first aspect of the present invention, there is provided a semiconductor storage device comprising:

a substrate having a semiconductor layer at least on a surface thereof; and a plurality of quantum dot elements forming a charge storage layer formed above the semiconductor layer via a first insulating film that becomes a tunnel insulating film in such a manner that the quantum dot elements are connected with a bit line in series, wherein each quantum dot element forms a single electron memory.

According to a second aspect of the present invention, there is provided a manufacturing method for a semiconductor storage device comprising:

cyclically repeatedly forming a plurality of quantum dot elements forming a charge storage layer above a semiconductor layer of a substrate having the semiconductor layer at least on a surface thereof via a first insulating film forming a tunnel insulating film by using lithography processes and sidewall mask etching processes, wherein each quantum dot element forms a single electron memory.

BRIEF DESCRIPTION OF THE DRAWINGS

In the accompanying drawings,

FIGS. 4 to 37B are partial cross-sectional views for explaining a manufacturing method for the semiconductor storage device depicted in FIG. 1;

FIGS. 38A to 39B are partial cross-sectional views for explaining a manufacturing method for the semiconductor storage device depicted in FIG. 1;

FIG. 39C is a partial plan view for explaining a manufacturing method for the semiconductor storage device depicted in FIG. 1;

FIGS. 40A and 40B are partial cross-sectional views for explaining a manufacturing method for the semiconductor storage device depicted in FIG. 1;

FIG. 40C is a partial plan view for explaining a manufacturing method for the semiconductor storage device depicted in FIG. 1;

FIGS. 41A to 42B are partial cross-sectional views for explaining a manufacturing method for the semiconductor storage device depicted in FIG. 1;

FIG. 42C is a partial plan view for explaining a manufacturing method for the semiconductor storage device depicted in FIG. 1;

FIGS. 45A and 45B are partial cross-sectional views for explaining a manufacturing method for the semiconductor storage device depicted in FIG. 1;

FIG. 45C is a partial plan view for explaining a manufacturing method for the semiconductor storage device depicted in FIG. 1;

FIGS. 52A and 52B are partial cross-sectional views for explaining a manufacturing method for the semiconductor storage device depicted in FIG. 1;

FIG. 52C is a partial plan view for explaining a manufacturing method for the semiconductor storage device depicted in FIG. 1;

DETAILED DESCRIPTION OF THE INVENTION

Figure 1:
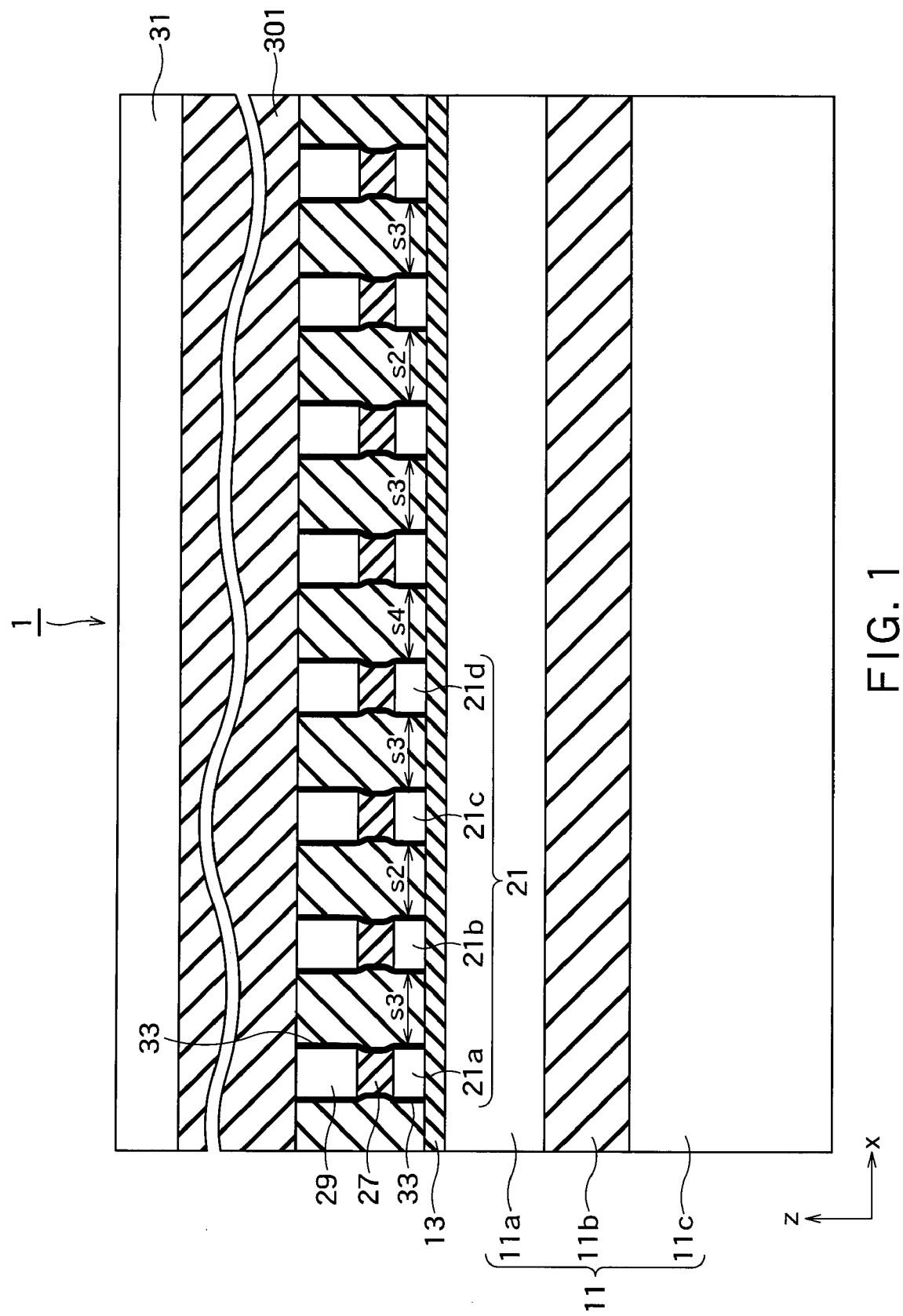
FIG. 1 is a partial cross-sectional view showing a primary part of an embodiment of a semiconductor storage device according to the present invention.

An embodiment according to the present invention will now be explained hereinafter with reference to the drawings. In the respective drawings, like reference numerals denote like parts, thereby appropriately omitting a tautological explanation thereof.

FIG. 1 is a partial cross-sectional view showing a primary part of an embodiment of a semiconductor storage device according to the present invention. A semiconductor storage device 1 depicted in FIG. 1 includes an SOI substrate 11, quantum dots 21, an inter-poly insulating film 27, a line pattern 29, an interlayer insulating film 301, and bit lines 31.

A tunnel oxide film 13 is formed on the SOI substrate 11 and corresponds to, e.g., a first insulating film forming a tunnel insulating film in this embodiment. The quantum dot 21 is a characteristic element in this embodiment, formed of polysilicon above the SOI substrate 11 via the tunnel oxide film 13, thereby forming a charge storage layer. The inter-poly insulating film 27 is formed on the quantum dots 21. The line pattern 29 is formed of polysilicon on the inter-poly insulating film 27 to be extended in a direction vertical to the sheet of FIG. 1, thereby forming each control gate (a word line). Each quantum dot 21 is connected with the bit line 31 in series. The line pattern 29 is formed to have substantially the same width as a width of the quantum dot 21 as shown in FIG. 1. Four sidewalls of the quantum dot 21 and a sidewall of the line pattern 29 in a direction parallel to a bit line are covered with a thermally oxidized film 33.

Here, in the semiconductor storage device 1, quantum dots 21a to 21d form one unit, and this single unit is repeatedly formed in such a manner that the respective units are apart from each other at intervals S4 in a horizontal direction in FIG. 1. In a relationship between the quantum dots 21a to 21d, an interval between the quantum dots 21a and 21b is S3, an interval between the quantum dots 21b and 21c is S2, and an interval between the quantum dots 21c and 21d is S3. In this embodiment, for example, the interval S3 between the quantum dots 21a and 21b corresponds to a first interval, the interval S2 between the quantum dots 21b and 21c corresponds to a second interval, the interval S3 between the quantum dots 21c and 21d corresponds to a third interval, and the interval S4 corresponds to, e.g., a fourth interval.

Here, the first to third intervals are equal to each other because the semiconductor storage device 1 is formed by using a sidewall mask etching process as will be explained later.

Figure 2:
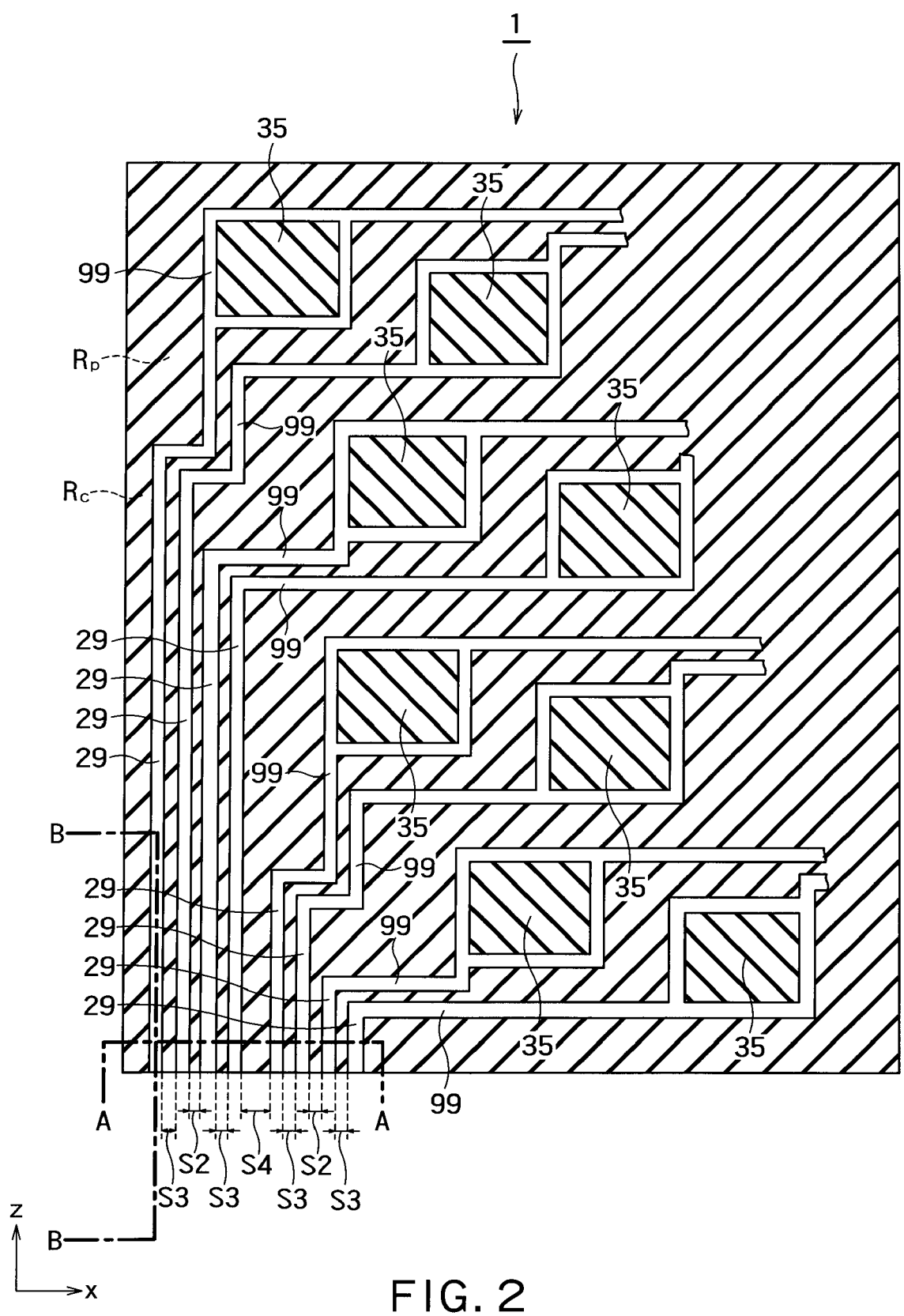
FIG. 2 is a plan view of the semiconductor storage device depicted in FIG. 1.

FIG. 2 is a partial plan view of the semiconductor storage device 1 according to this embodiment. In FIG. 2, the bit lines 31 and the interlayer insulating film 301 are omitted for easy description. Each pad 35 having a sufficient size is formed in a peripheral circuit section Rp around a cell section Rc, thereby enabling an increase in integration degree of the storage device. Each pad 35 is connected with each word line 29 through a line pattern 99 having the same width as the word line 29. The four pads 35 form one unit, and this unit is cyclically repeatedly formed. FIG. 1 is the cross-sectional view taken along a line A-A in FIG. 2.

Figure 3:
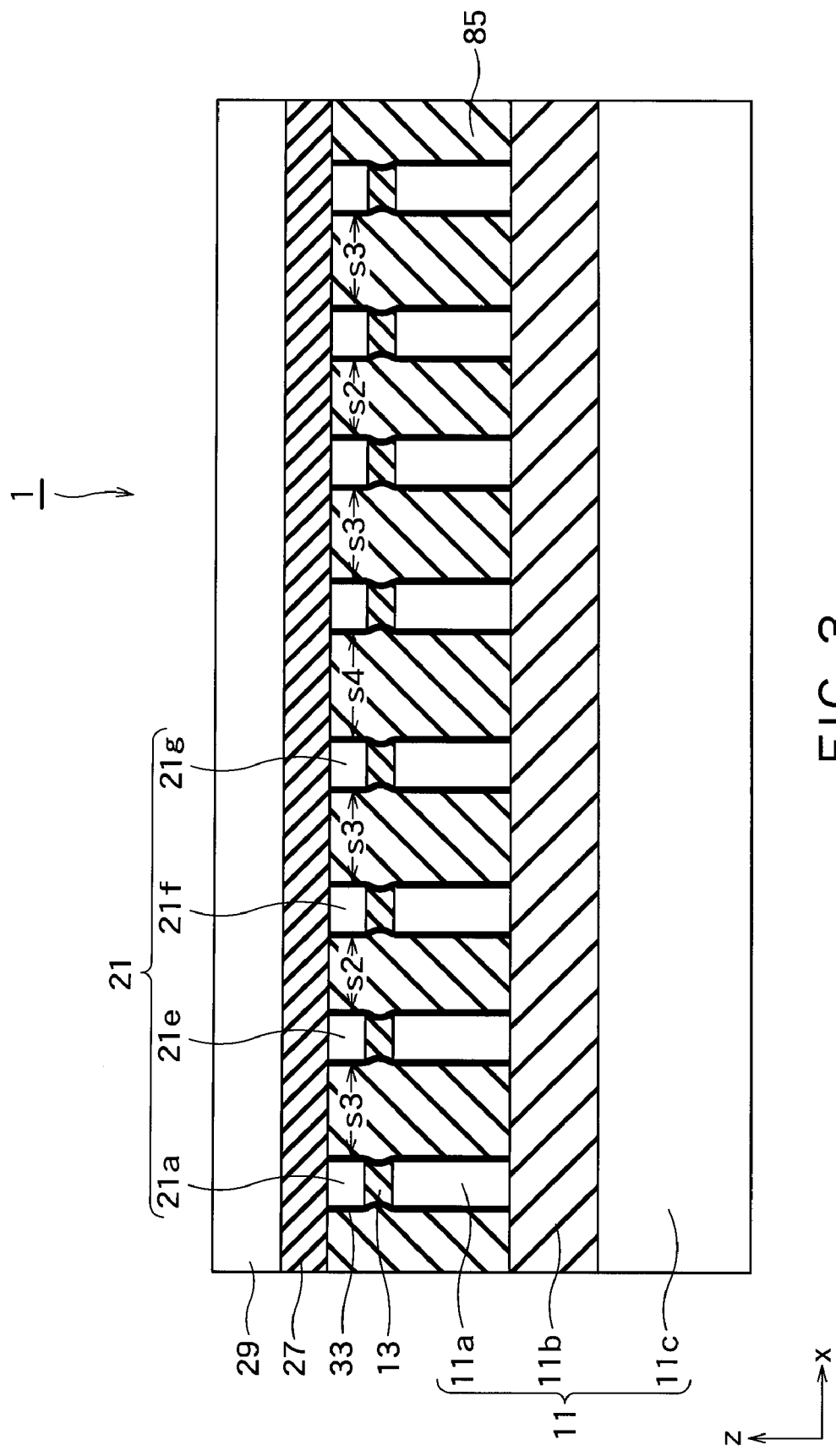
FIG. 3 is a cross-sectional view taken along a line B-B in FIG. 2.

FIG. 3 is a cross-sectional view taken along a line B-B in FIG. 2. As shown in FIG. 3, in a direction parallel to the word lines 29, likewise, the quantum dots 21a, 21e, 21f, and 21g are also formed as one unit, and this unit is repeatedly formed in such a manner that the respective units are apart from each other at the intervals S4 in a horizontal direction in FIG. 3. An interval between the quantum dots 21a and 21e is S3, an interval between the quantum dots 21e and 21f is S2, and an interval between the quantum dots 21f and 21g is S3. The tunnel oxide film 13 and the quantum dots 21 are insulated from other element regions by an element isolation insulating film 85.

Here, a quantum effect of the quantum dot 21 becomes prominent as its size is reduced. At present, a size of the quantum dot must be reduced to 5 nm or below in order to operate the quantum dot formed of a silicon material at room temperature. In this embodiment, the size of the quantum dot 21 is 5 nm×5 nm×5 nm. It is to be noted that, in this specification, "5 nm or below" includes an effective digit, and it should be noticed that "5 nm or below" does not merely mean "5.0 nm or below" but it also includes 5.1 nm to 5.4 nm.

The semiconductor storage device 1 according to this embodiment having each quantum dot of such a small size can be manufactured by a combination of a lithography process and a sidewall mask etching process. That is because the semiconductor storage device can be finely processed based on the sidewall mask etching process without being restricted to a resolution of the lithography process. Further, uniform quantum dot storage elements can be cyclically aligned like this embodiment because the size of each quantum dot 21 is not affected by a variation in the lithography process.

Figure 64A:
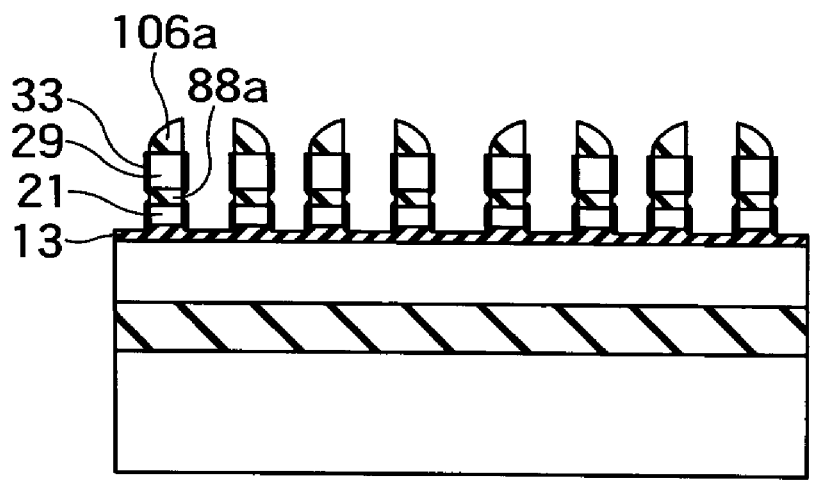
FIGS. 64A and 64B are partial cross-sectional views for explaining a manufacturing method for the semiconductor storage device depicted in FIG. 1.
Figure 64B:
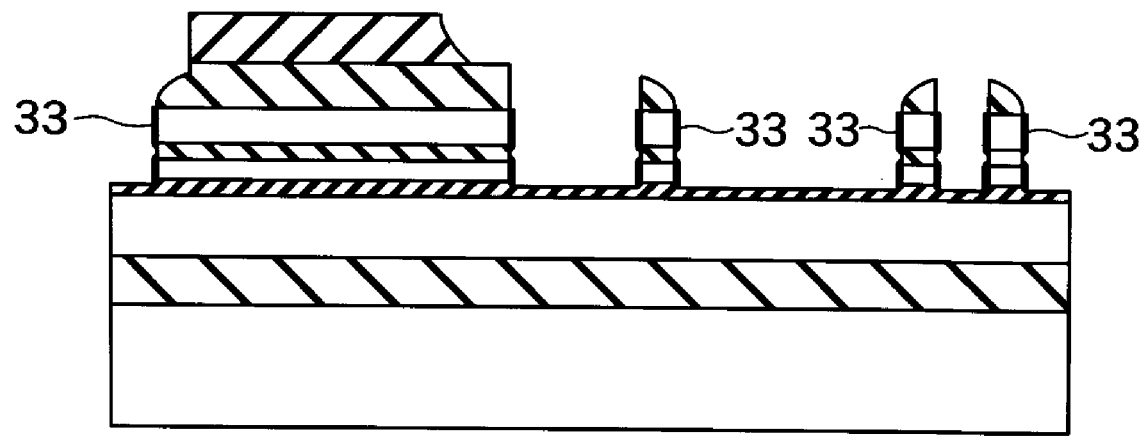

A manufacturing method for the highly integrated semiconductor storage device 1 will now be explained with reference to FIGS. 4 to 64B.

Figure 4:
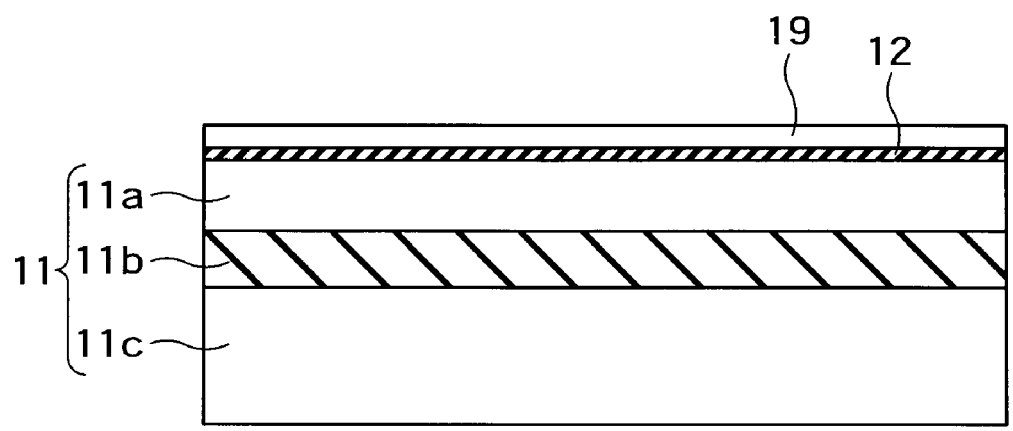

First, as shown in a partial cross-sectional view of FIG. 4, an insulating film 12 and a polycrystalline silicon film 19 are sequentially formed on the SOI substrate 11. The insulating film 12 is processed at subsequent steps to be finally turned to the tunnel oxide film 13. The SOI substrate 11 is formed of a laminated body including a silicon layer 11c, an oxide film 11b, and a silicon single crystal film 11a. The silicon single crystal film 11a in the uppermost layer is subjected to impurity ion implantation and activation based on a heat treatment before deposition of the insulating film 12, and turned to a channel region of a semiconductor storage element by a subsequent etching process. It is to be noted that the SOI substrate is exemplified as a substrate in this embodiment, but the present invention is not restricted thereto, and the same quantum dots can be formed on, e.g., a silicon substrate. However, it is expected that the semiconductor storage device having superior element characteristics can be manufactured when the SOI substrate is adopted.

The polycrystalline silicon film 19 is a layer that finally becomes the quantum dots 21 by subsequent processes. Therefore, a film thickness of the polycrystalline silicon film 19 is a height of the quantum dots. In this embodiment, the film thickness of the polycrystalline silicon film 19 is 5 nm.

Figure 5:
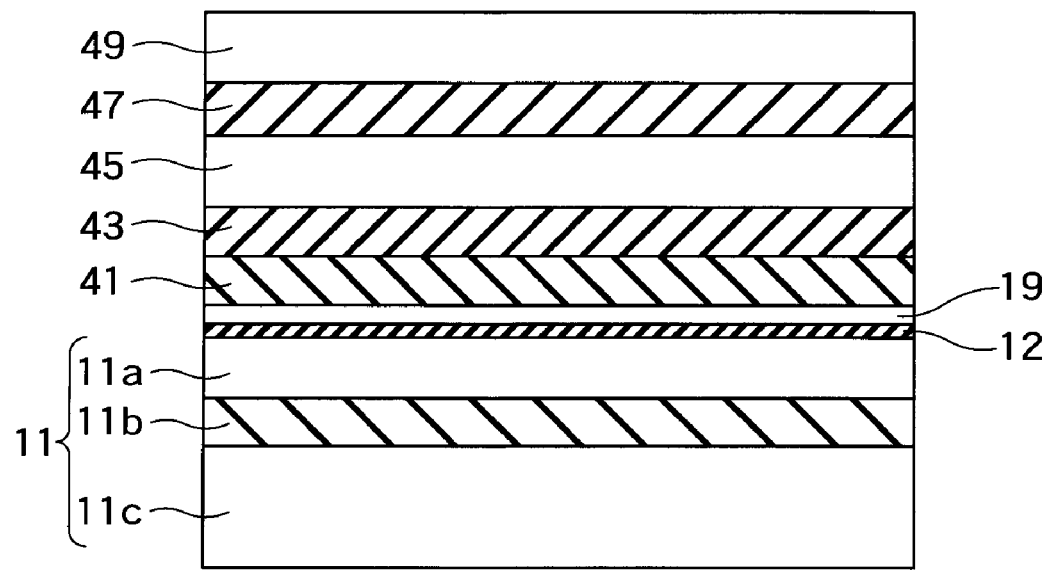

Then, as shown in a partial cross-sectional view of FIG. 5, a nitride film 41, an insulating film 43, an amorphous silicon film 45, an insulating film 47, and an amorphous silicon film 49 are sequentially deposited on the polycrystalline silicon film 19. Both the insulating films 43 and 47 are TEOS (Tetra Ethoxy Silage) films.

Subsequently, an anti-reflection film 55 is formed on the amorphous silicon film 49, a photoresist is applied to the anti-reflection film 55, and the photoresist is selectively removed based on patterning using lithography, thereby forming line patterns LP1 and LP3 formed of the photoresist as shown in partial cross-sectional views of FIGS. 6A and 6B.

Figure 6A:
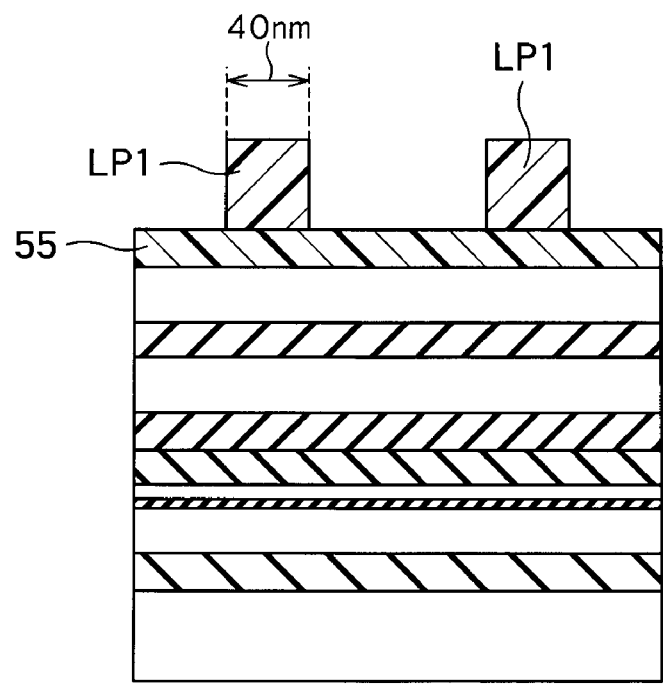
Figure 6B:
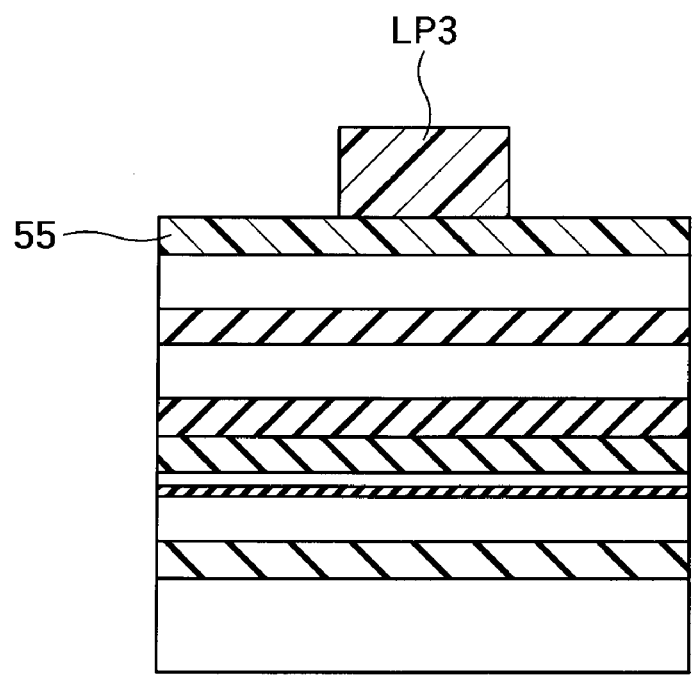

In this embodiment, FIG. 6A corresponds to a cross-sectional view of the cell section Rc where the storage elements are arranged in a direction parallel to the word lines 29, and FIG. 6B corresponds to a cross-sectional view of a wide pattern of a peripheral circuit where the pads 35 and so forth are provided. This point is likewise applied to FIGS. 7A to FIG. 64B.

In this embodiment, in the cell section Rc, when each line pattern LP1 is formed with a width of 40 nm and a space width between the line patterns LP1 and LP1 is 92 nm, the intervals depicted in FIG. 3 are the interval S2=18 nm, the interval S3=20 nm, and the interval S4=22 nm. As the device, aligning cell arrays at equal intervals is desirable, but one of characteristic points lies in that the use of the sidewall mask etching process according to this embodiment causes an actually formed pattern to take such a cyclic arrangement even if equal intervals are targeted. The line pattern LP3 in the peripheral circuit section Rp is formed to have an arbitrary wide width, e.g., 150 nm.

Figure 7A:
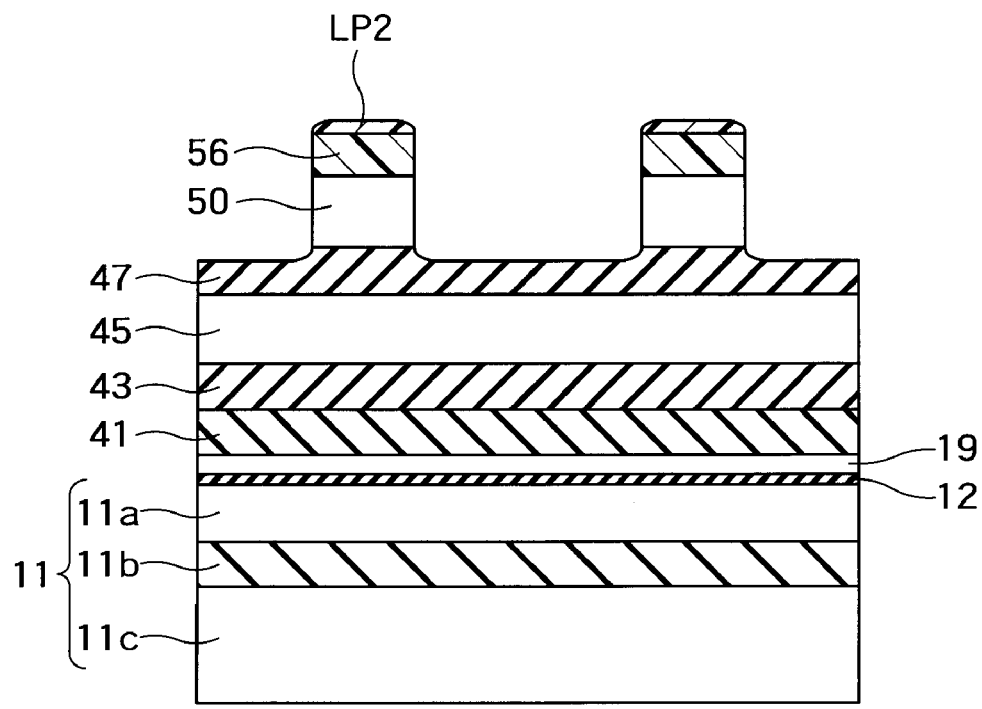
Figure 7B:
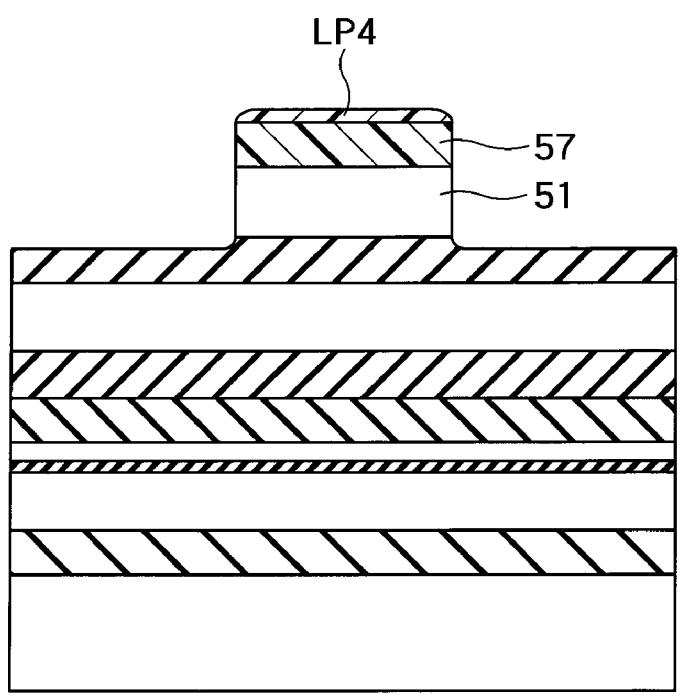
Figure 8A:
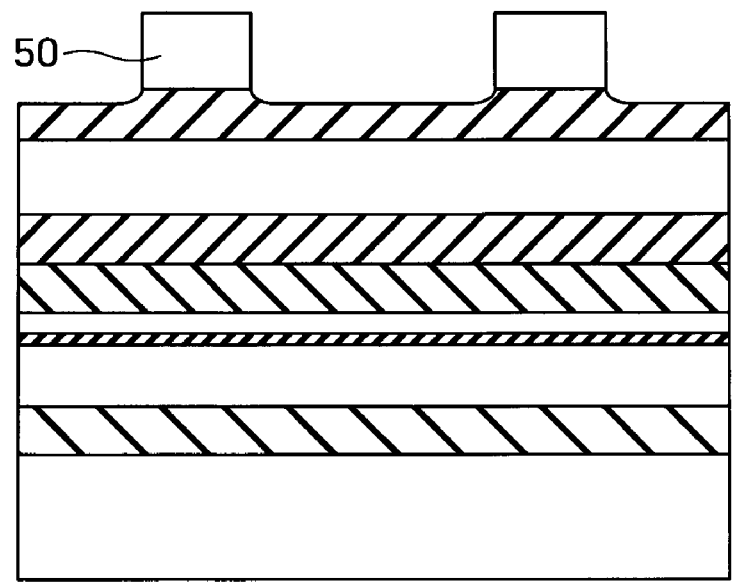
Figure 8B:
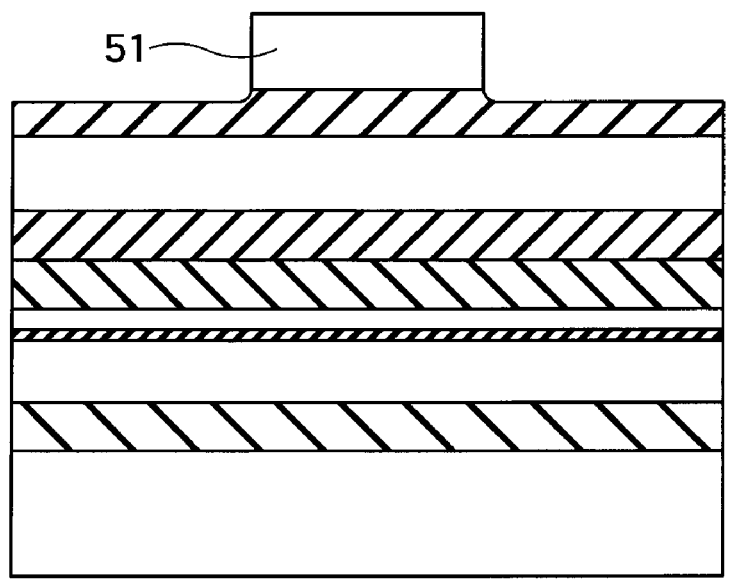

Subsequently, as shown in partial cross-sectional views of FIGS. 7A and 7B, an anti-reflection film 51 and the amorphous silicon film 49 are selectively removed based on anisotropic etching using the line patterns LP1 and LP3 as masks to provide anti-reflection films 56 and 57 and amorphous silicon films 50 and 51. Then, as shown in partial cross-sectional views of FIGS. 8A and 8B, remaining parts LP2 and LP4 of the line patterns LP1 and LP3 formed of the anti-reflection films 56 and 57 and the photoresist are delaminated by ashing.

Figure 9A:
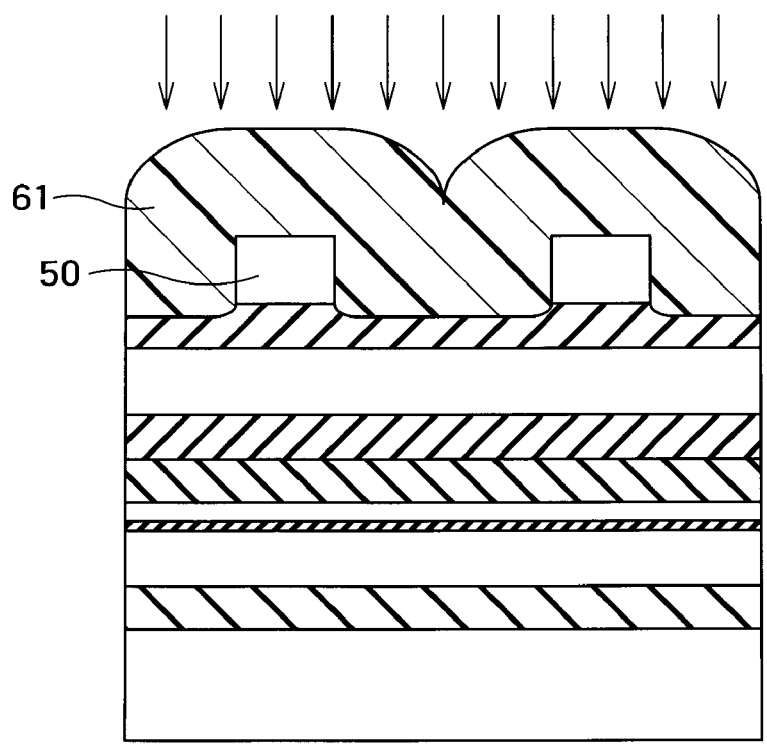
Figure 9B:
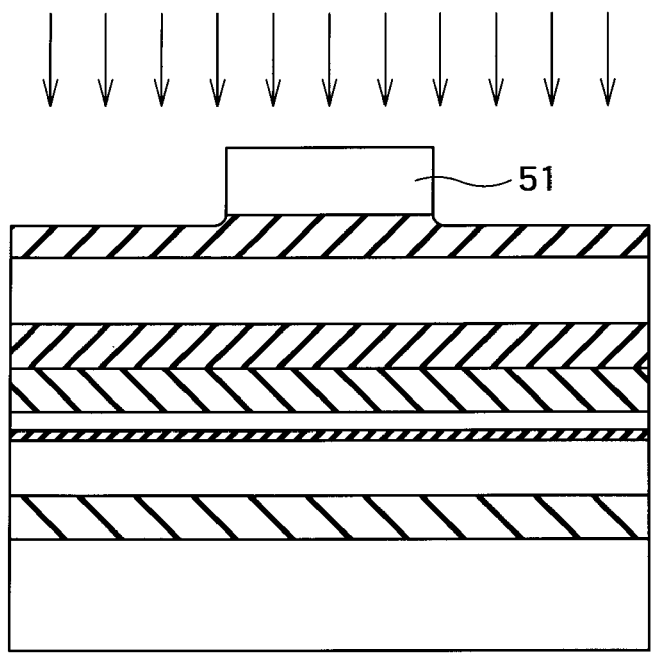

Subsequently, as shown in partial cross-sectional views of FIGS. 9A and 9B, boron is implanted into an entire surface based on patterning using the photoresist while remaining the photoresist 61 in the cell section Rc alone. As a result, a line pattern 50 formed of amorphous silicon in the cell section Rc is not subjected to implantation since it is covered with the photoresist 61 and, on the other hand, a line pattern 51 formed of amorphous silicon in the peripheral circuit section Rp is turned to P-type silicon based on boron implantation.

Figure 10A:
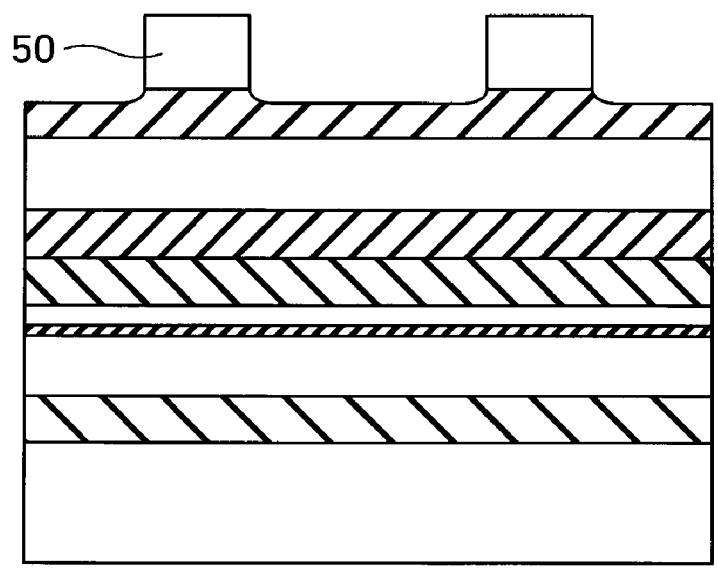
Figure 10B:
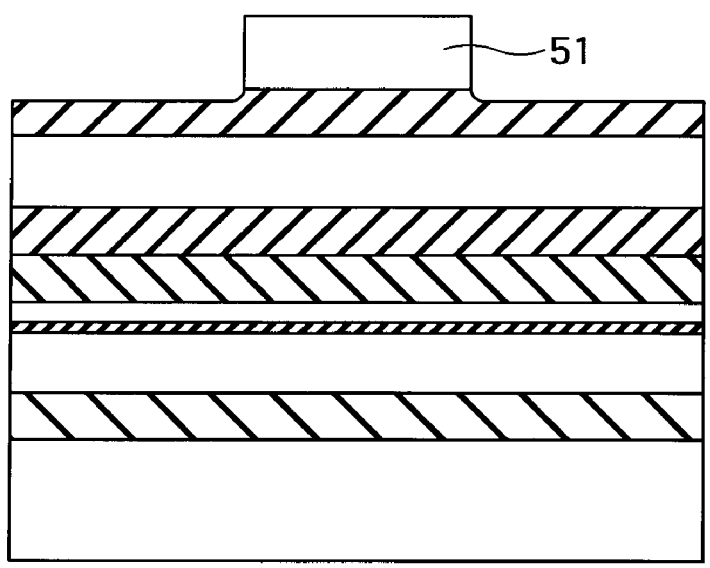
Figure 11A:
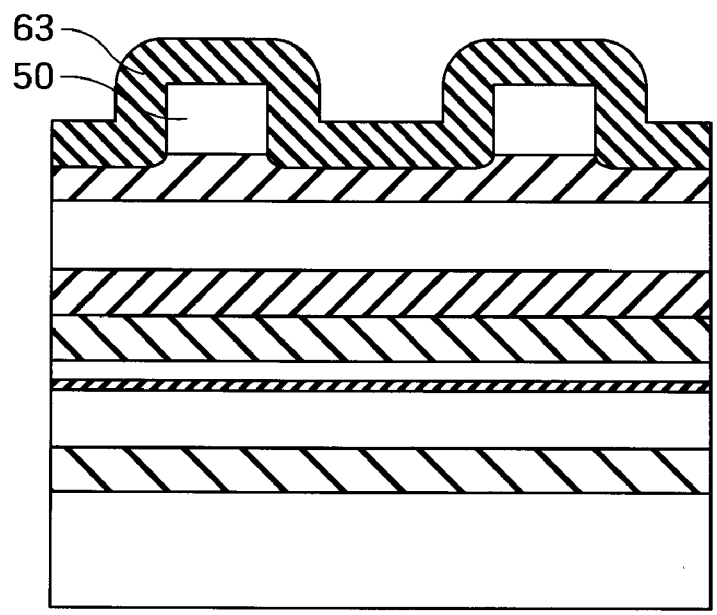
Figure 11B:
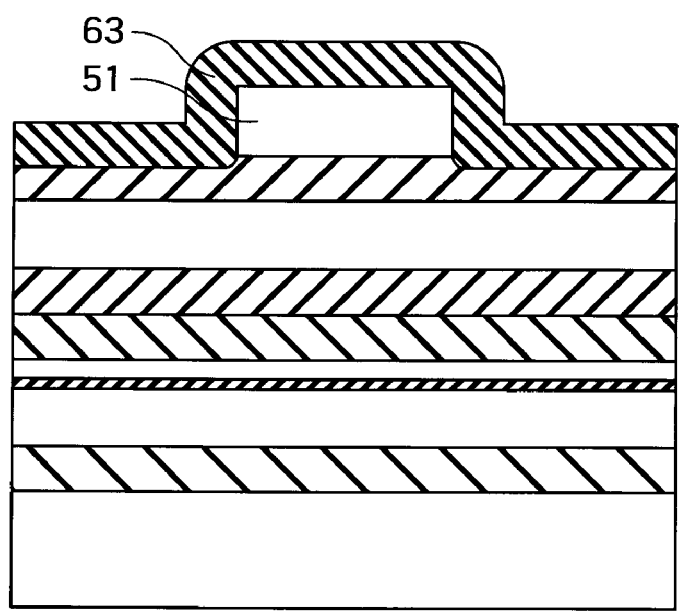

Then, as shown in partial cross-sectional views of FIGS. 10A and 10B, the photoresist 61 is delaminated by ashing, and a nitride film 63 is then deposited on the entire surface as depicted in partial cross-sectional views of FIGS. 11A and 11B. A film thickness of the nitride film 63 is 22 nm in this embodiment.

Figure 12A:
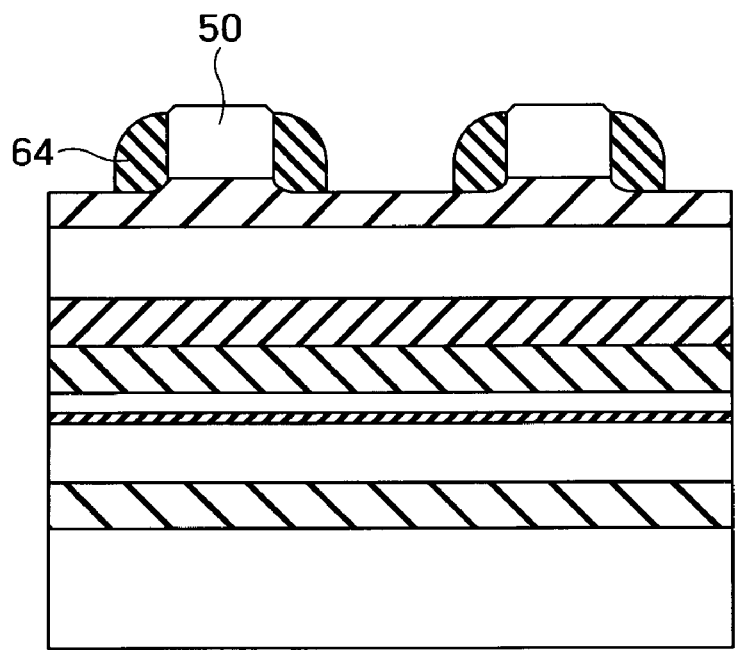
Figure 12B:
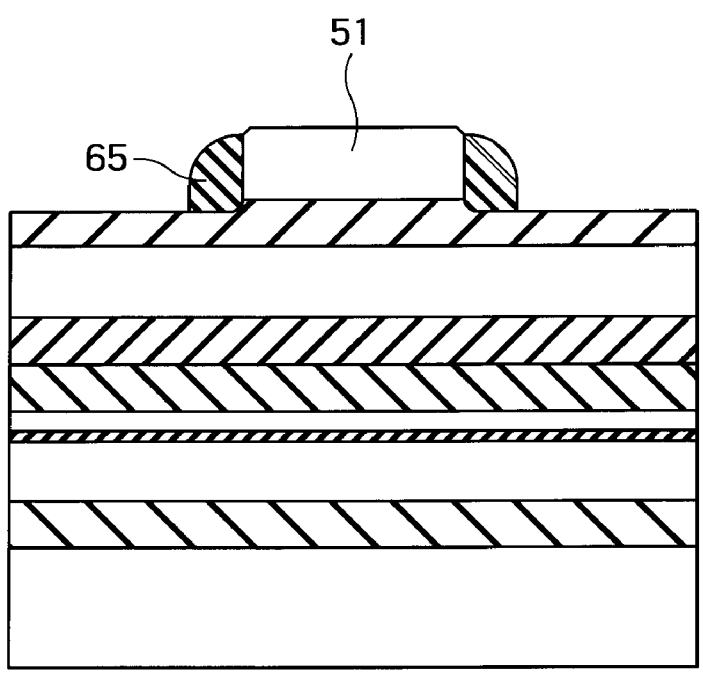

Thereafter, as shown in partial cross-sectional views of FIGS. 12A and 12B, a flat surface portion of the nitride film 63 is selectively removed by anisotropic etching to form sidewall films 64 and 65 while leaving sidewall portions of the line patters 50 and 51.

Figure 13A:
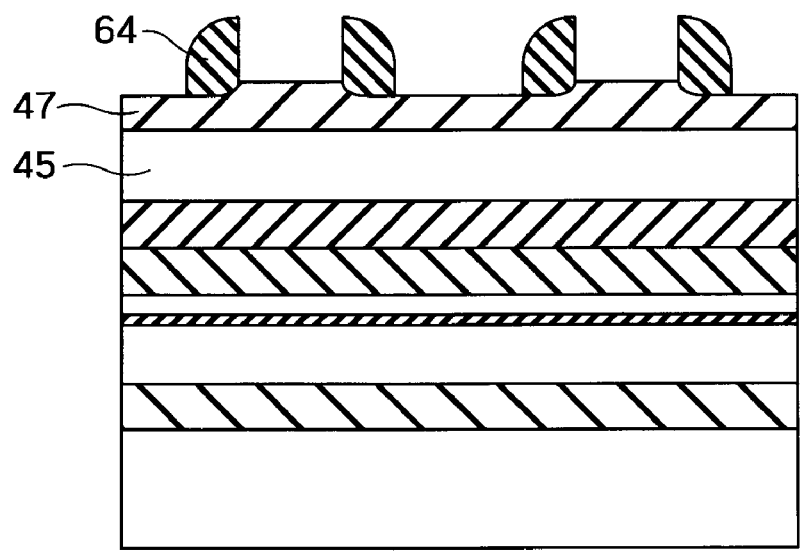
Figure 13B:
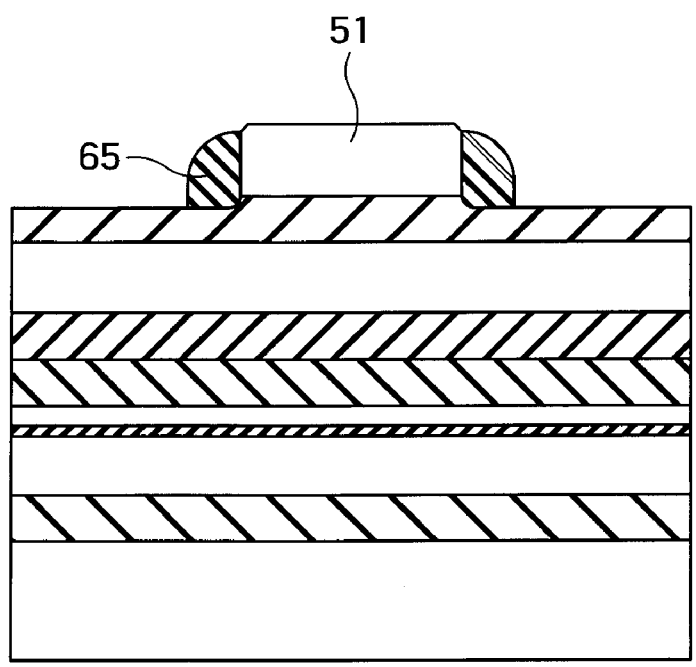

Subsequently, as shown in partial cross-sectional views of FIGS. 13A and 13B, the line pattern 50 alone in the cell section Rc that is not doped with boron is removed by selective wet etching, thereby keeping the boron-doped line pattern 51 in the peripheral circuit section Rp.

Figure 14A:
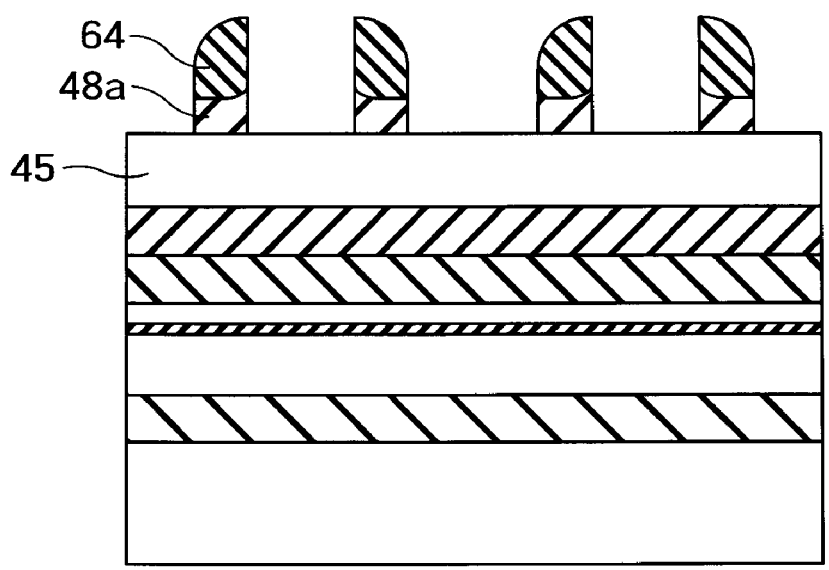
Figure 14B:
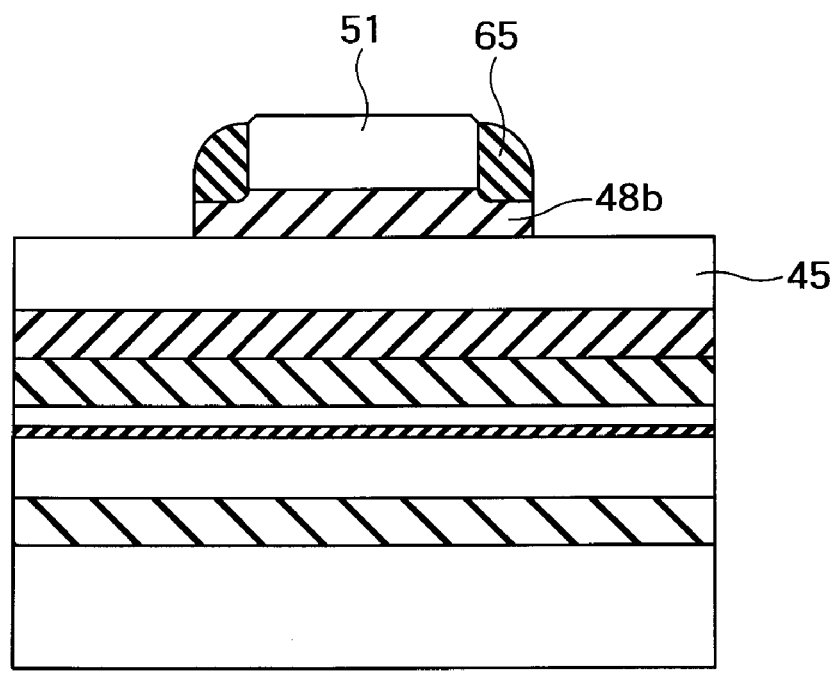

Then, as shown in partial cross-sectional views of FIGS. 14A and 14B, the TEOS film 47 is selectively removed based on anisotropic etching to provide TEOS films 48a and 48b. A process of forming a sidewall film on a sidewall of a pattern, then removing the pattern, and etching an underlying film of the removed pattern with the remaining sidewall film being used as a mask in this manner is called a sidewall forming process. The pattern to be removed after forming the sidewall film is called a "mandrel material".

Figure 15A:
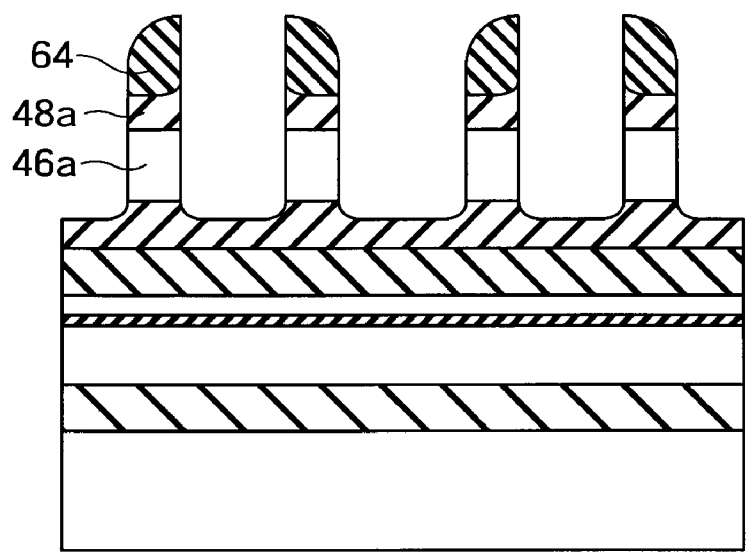
Figure 15B:
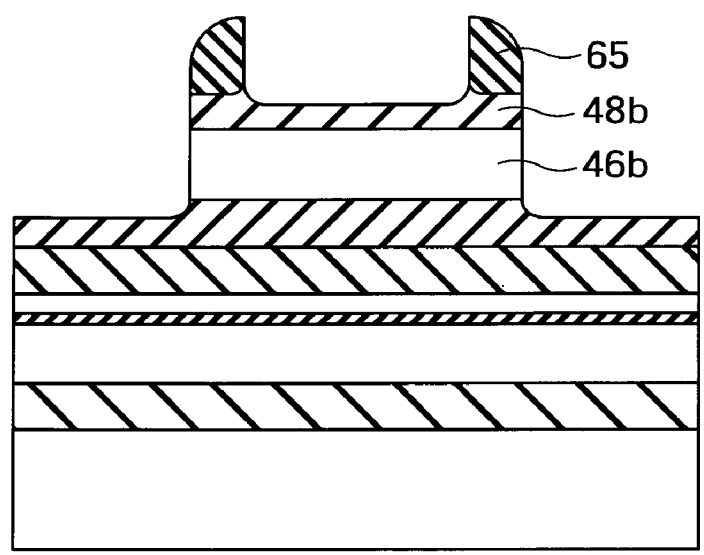
Figure 16A:
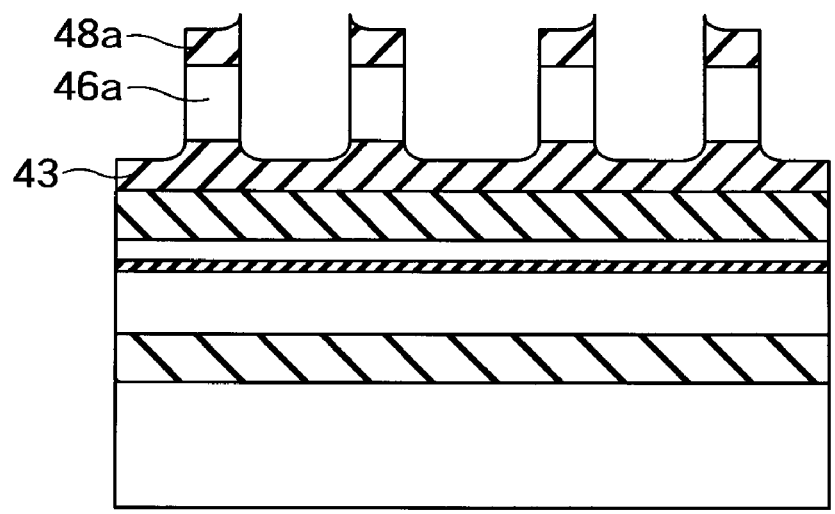
Figure 16B:
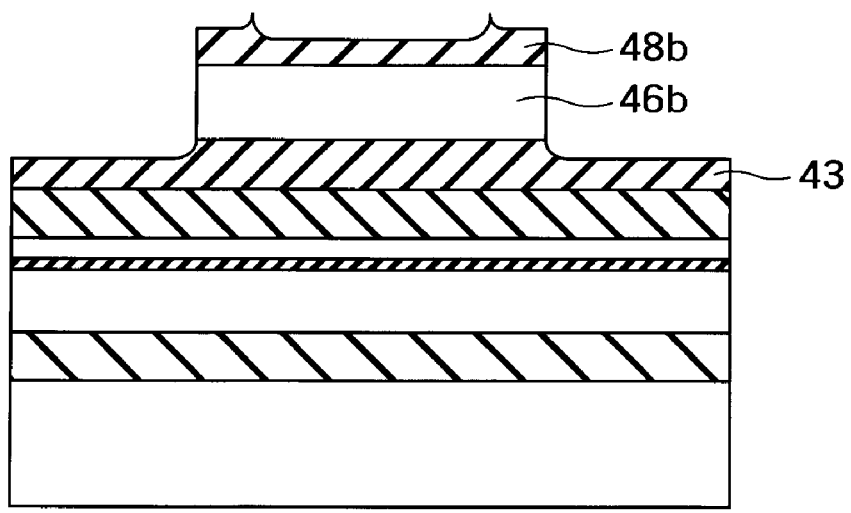

Subsequently, as shown in partial cross-sectional views of FIGS. 15A and 15B, the amorphous silicon film 45 is selectively removed based on anisotropic etching to provide amorphous silicon films 46a and 46b. Thereafter, as shown in partial cross-sectional views of FIGS. 16A and 16B, the nitride films 64 and 65 are completely removed by wet etching. Then, as shown in partial cross-sectional views of FIGS. 17A and 17B, the TEOS film 43 is selectively removed by anisotropic etching to provide TEOS films 44a and 44b. At this time, the TEOS films 48a and 48b are also completely removed.

Figure 17A:
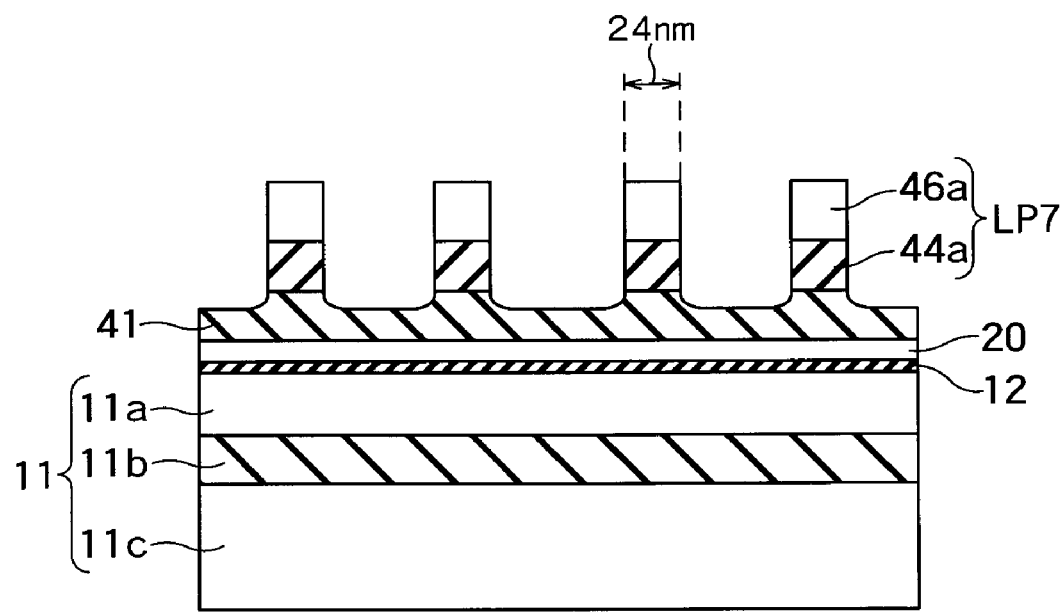
Figure 17B:
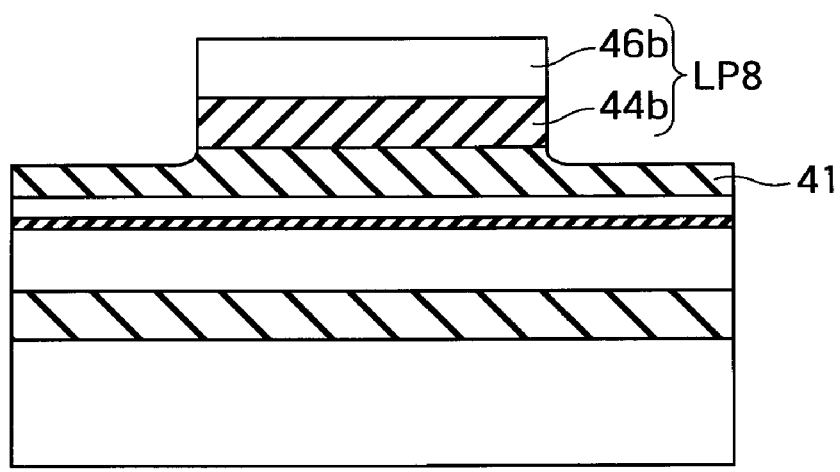

With the above-explained series of processes, in the cell section Rc, as shown in FIG. 17A, a line pattern LP7 that is formed of the TEOS film 44a and the amorphous silicon film 46a and has a width of 24 nm is formed. The width of the line pattern LP7 is larger than a film thickness of each of the sidewall films 64 and 65 as nitride films because of a transformation difference in the anisotropic etching shown in FIGS. 13 to 15. At the same time, in the peripheral circuit section Rp, as shown in FIG. 17B, a wide line pattern LP8 consisting of the TEOS film 44b and the amorphous silicon film 46b can be formed. It is to be noted that, as shown in FIGS. 9 to 17, the line patterns LP7 and LP8 having different dimensions are formed in the cell section Rc and the peripheral circuit section Rp by separately performing implantation in each of the cell section Rc and the peripheral circuit section Rp in this embodiment, but any method other than the method of separately performing implantation may be adopted as long as such line patterns as depicted in FIGS. 17A and 17B can be left. Further, any different combination of film structures above the TEOS film 43 and etching processes may be adopted as long as such line patterns as depicted in FIGS. 17A and 17B can be left.

The processing now enters a second sidewall mask etching process in order to form the quantum dots 21 and the element isolation insulating film 85 depicted in FIG. 3.

Figure 18A:
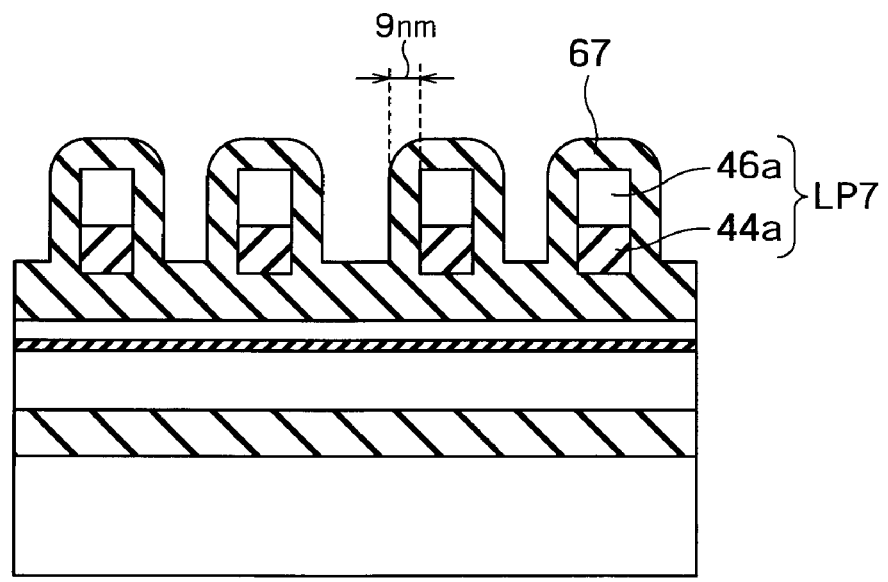
Figure 18B:
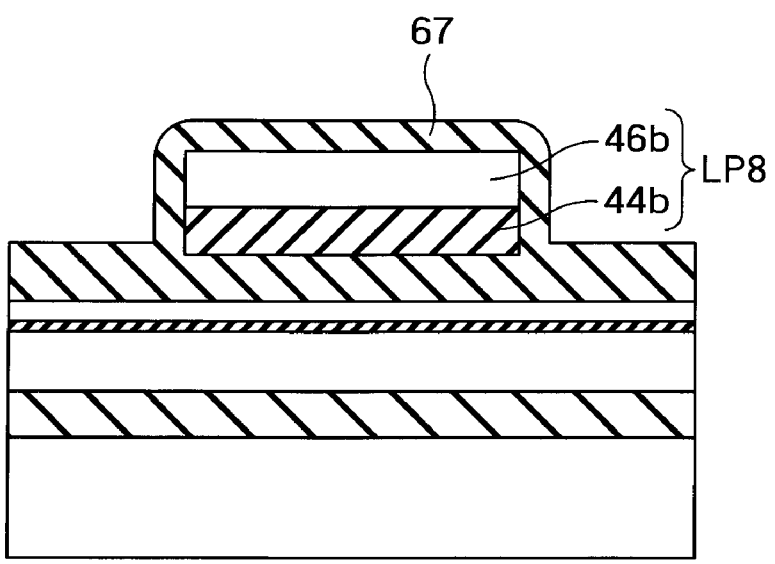

First, as shown in partial cross-sectional views of FIGS. 18A and 18B, a nitride film 67 is deposited on the entire surface to cover the line patterns LP7 and LP8. In this embodiment, a film thickness of the nitride film 67 is 9 nm.

Figure 19A:
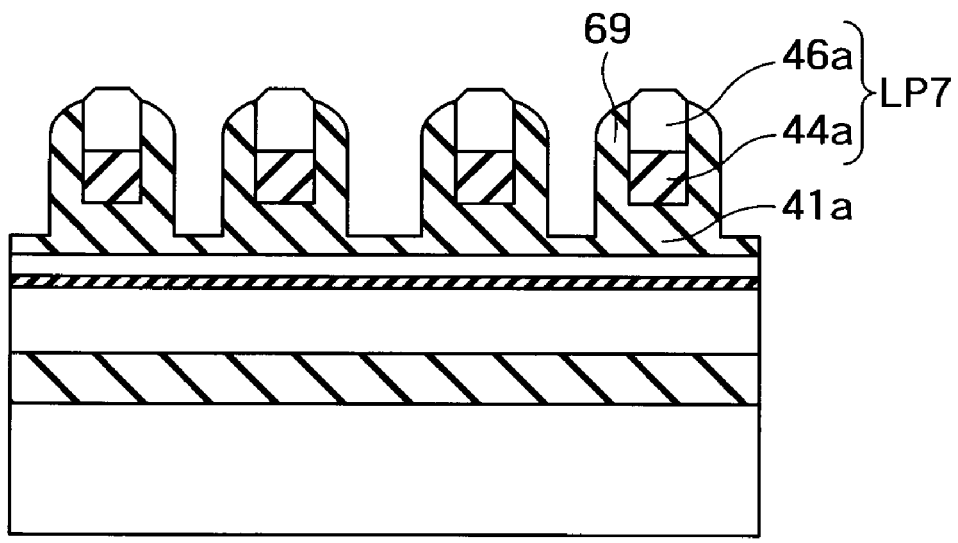
Figure 19B:
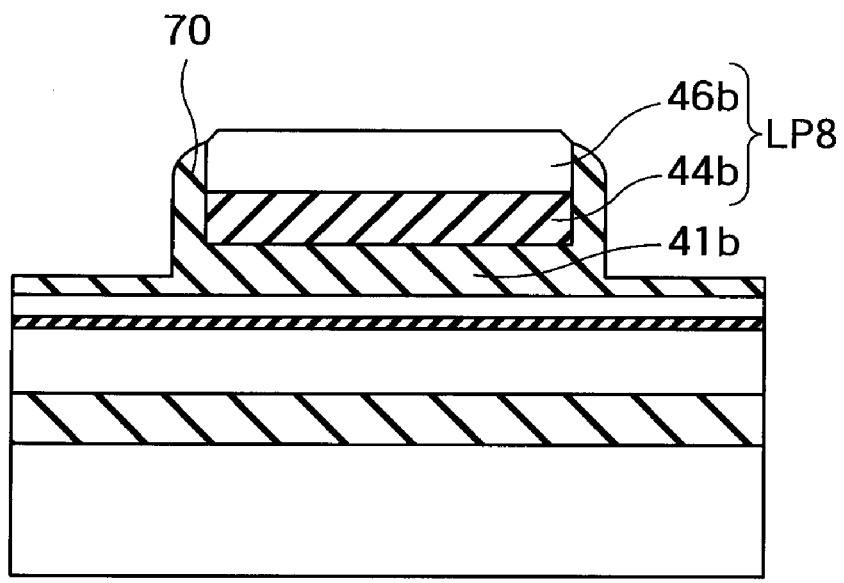

Then, as shown in partial cross-sectional views of FIGS. 19A and 19B, a flat surface portion of the nitride film 67 is selectively removed by anisotropic etching to form sidewall films 69 and 70 while keeping the sidewall portions of the line patterns LP7 and LP8.

Figure 20A:
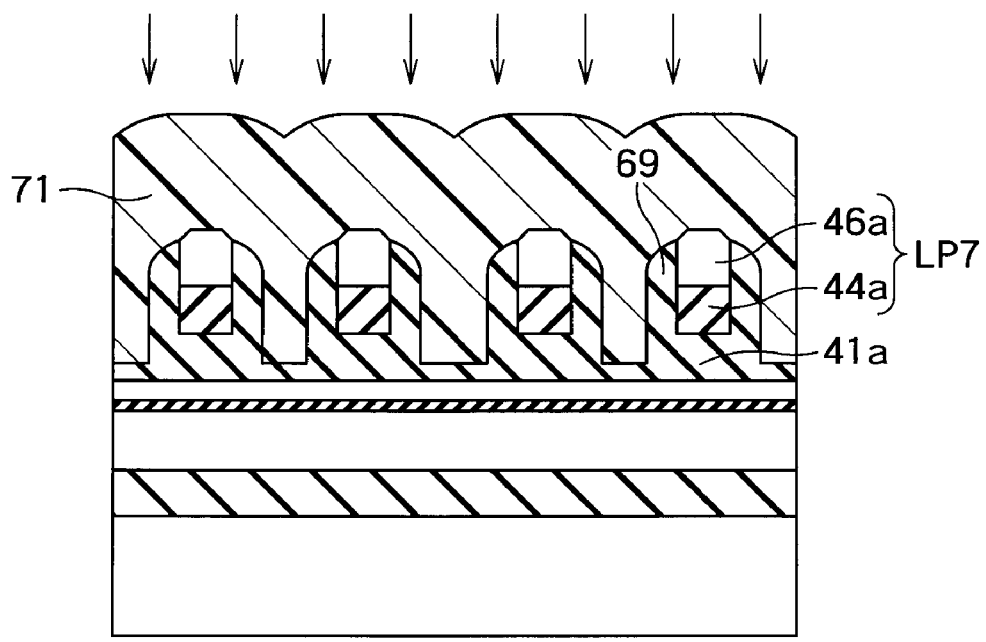
Figure 20B:
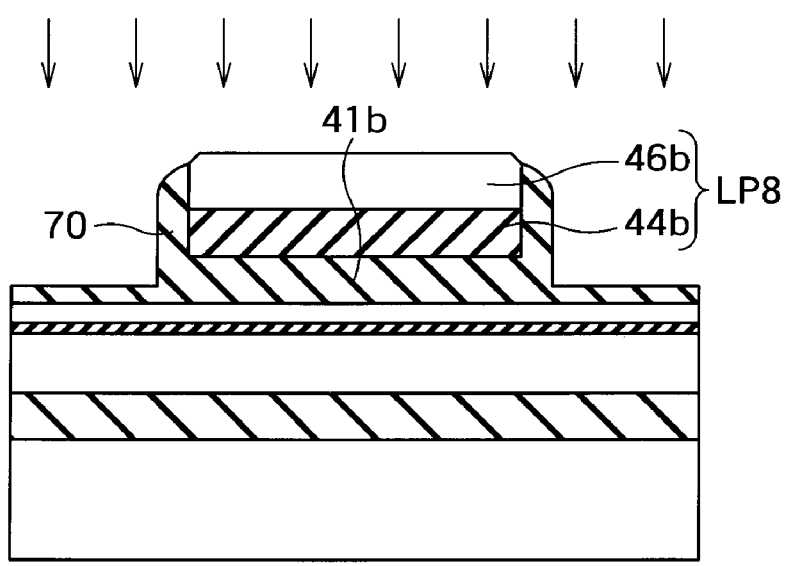

Subsequently, as shown in partial cross-sectional views of FIGS. 20A and 20B, boron is implanted into the entire surface based on patterning using a photoresist while leaving a photoresist 71 in the cell section Rc alone. The upper amorphous silicon 46a of the line pattern LP7 in the cell section Rc is not subjected to implantation since it is covered with the photoresist 71 and, on the other hand, the upper amorphous silicon 46b of the line pattern LP8 in the peripheral circuit section Rp is turned to P-type silicon based on boron implantation.

Figure 21A:
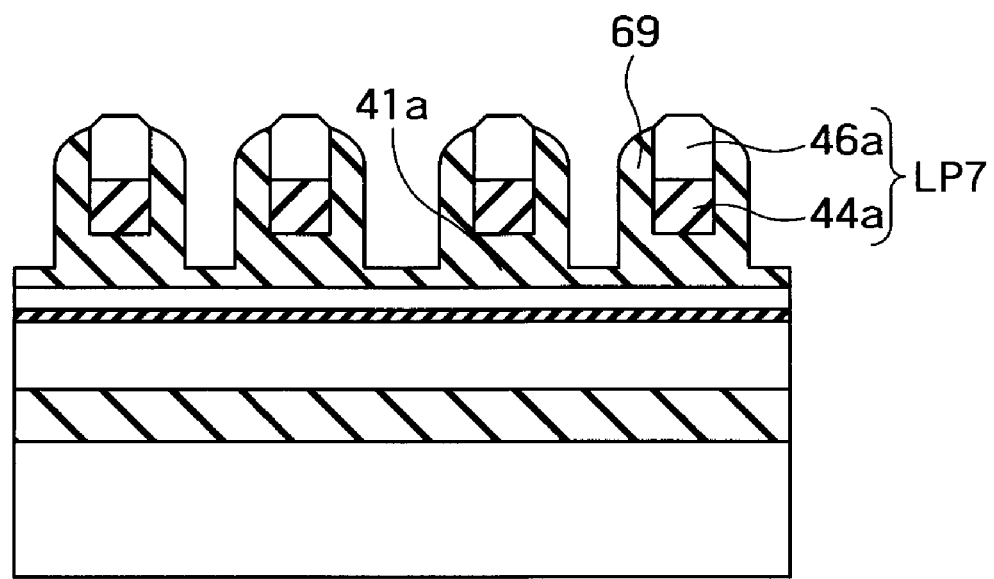
Figure 21B:
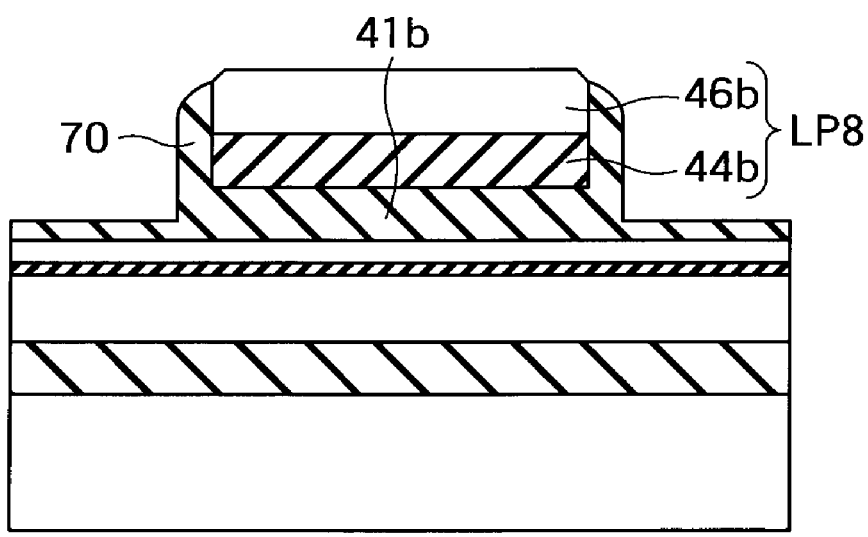
Figure 22A:
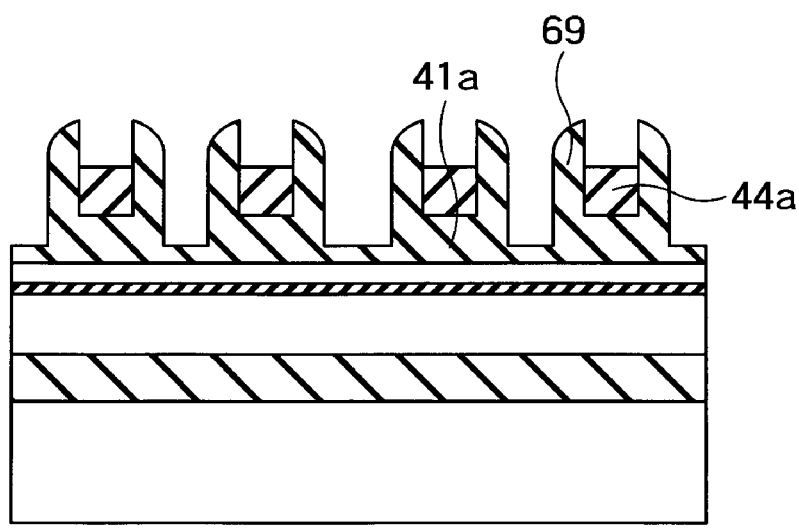
Figure 22B:
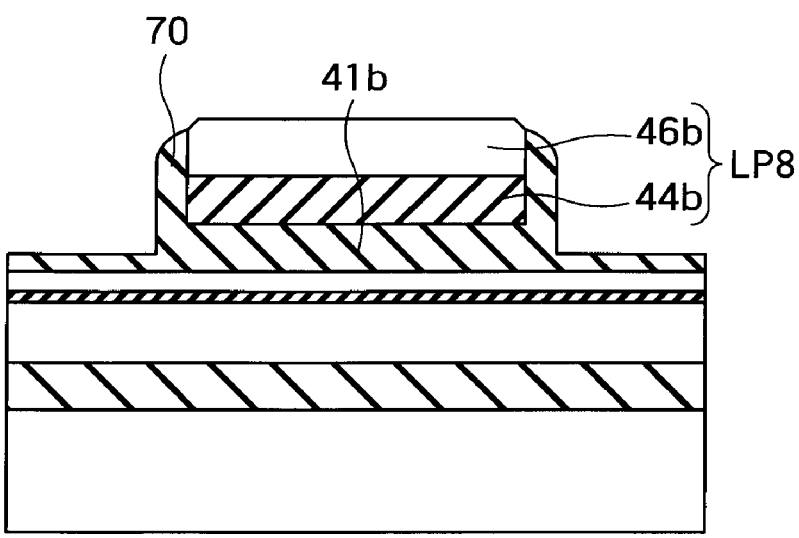

Subsequently, as shown in partial cross-sectional views of FIGS. 21A and 21B, the photoresist 71 is delaminated by ashing. Then, as shown in partial cross-sectional views of FIGS. 22A and 22B, the upper amorphous silicon 46a of the line pattern LP7 is removed based on wet etching. At this time, a selection ratio of wet etching is set in such a manner that the amorphous silicon 46a alone in the cell section Rc that is not boron-doped is removed and the amorphous silicon 46b in the peripheral circuit section Rp remains.

Figure 23A:
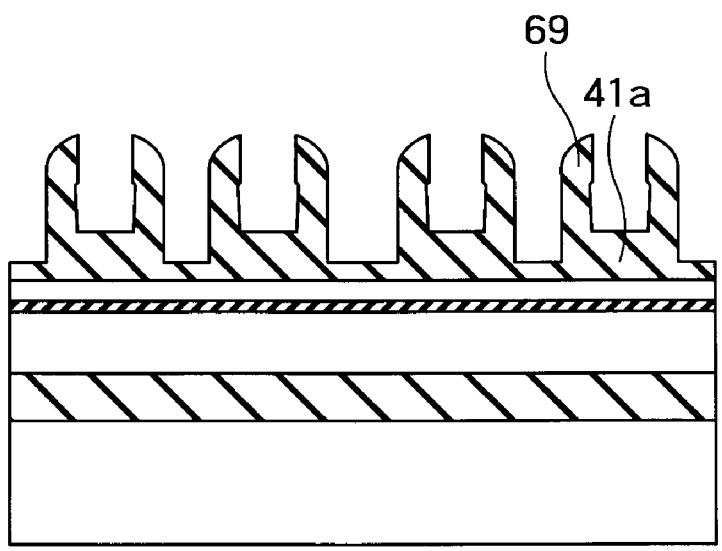
Figure 23B:
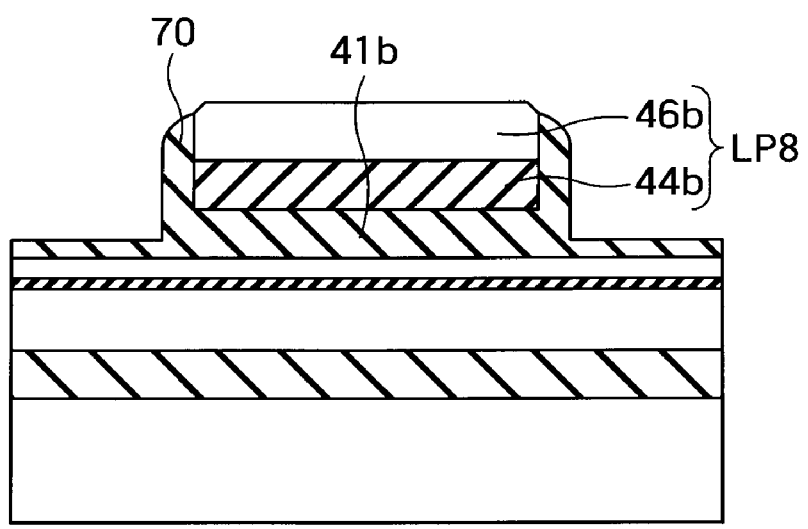

Subsequently, as shown in partial cross-sectional views of FIGS. 23A and 23B, the TEOS film 44a alone in the cell section Rc is selectively removed based on anisotropic etching. Furthermore, as shown in partial cross-sectional views of FIGS. 24A and 24B, the nitride film 41a in the cell section Rc is selectively removed based on anisotropic etching. As a result, the sidewall film 73 remains in the cell section Rc, and the sidewall film 75, the line pattern LP8, and the nitride film 41b remain in the peripheral circuit section Rp. On this stage, a film thickness of the sidewall film 73 in the cell section Rc becomes 9 nm as illustrated as a film thickness of the nitride film 67 in FIG. 18A.

Figure 24A:
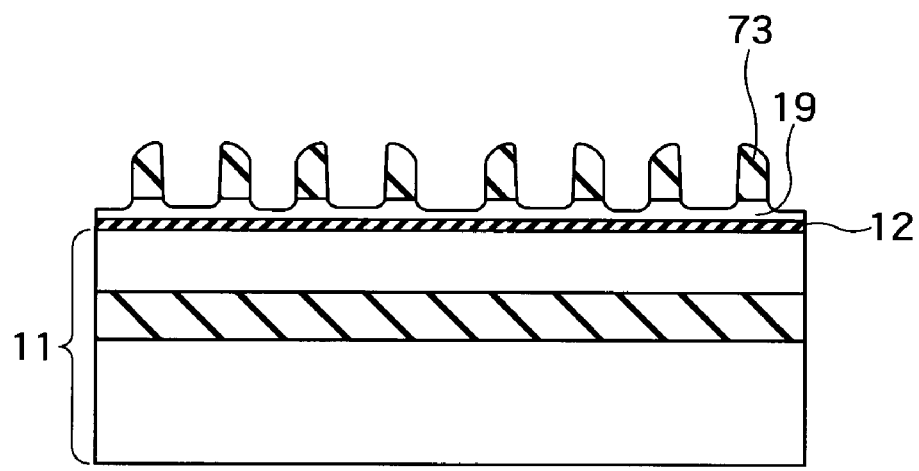
Figure 24B:
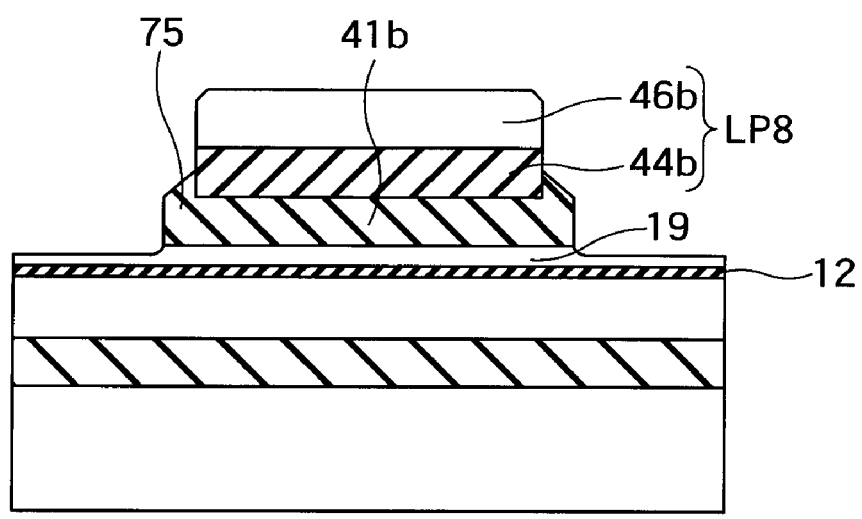

As explained above, in this embodiment, as shown in FIGS. 20A to 24B, the line patterns having different dimensions are formed in the cell section Rc and the peripheral circuit section Rp by separately performing implantation in each of the cell section Rc and the peripheral circuit section Rp. However, any method other than the method of separately performing implantation may be adopted as long as such line patterns as depicted in FIGS. 24A and 24B can be eventually left. Moreover, any combination of film structures above the nitride film 41 and etching processes that are different from those described in the above-explained process may be adopted as long as such line patterns as depicted in FIGS. 24A and 24B can be left.

Figure 25A:
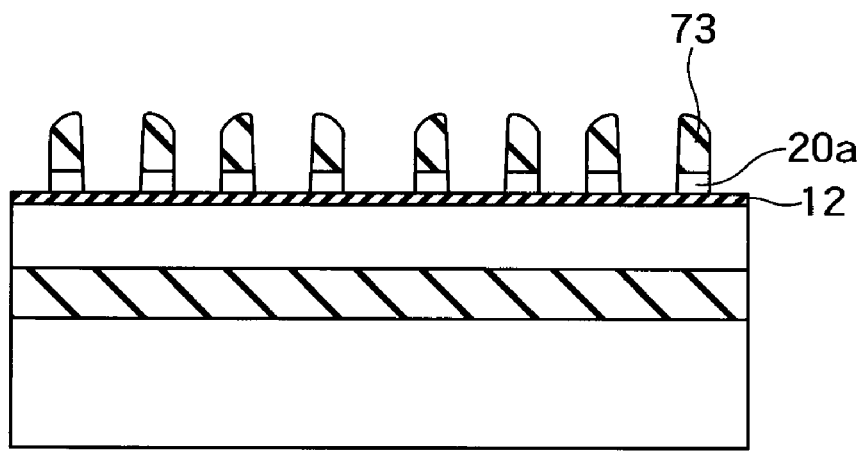
Figure 25B:
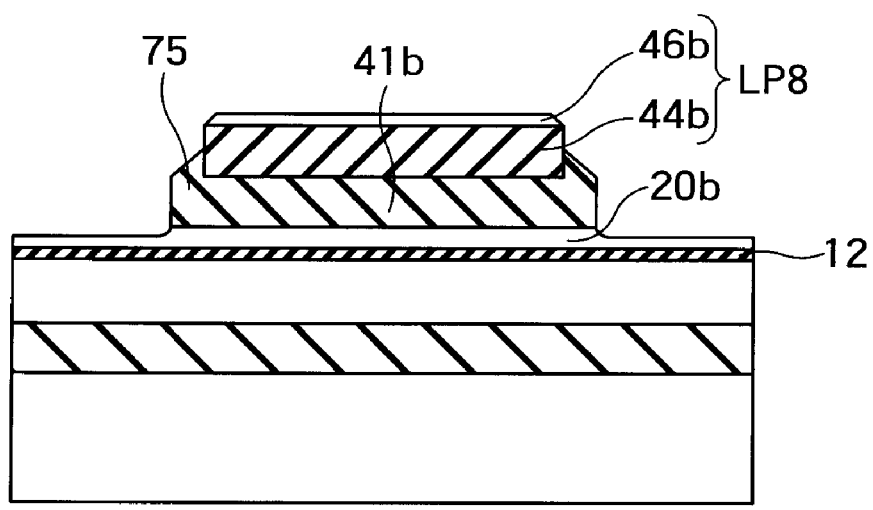
Figure 26A:
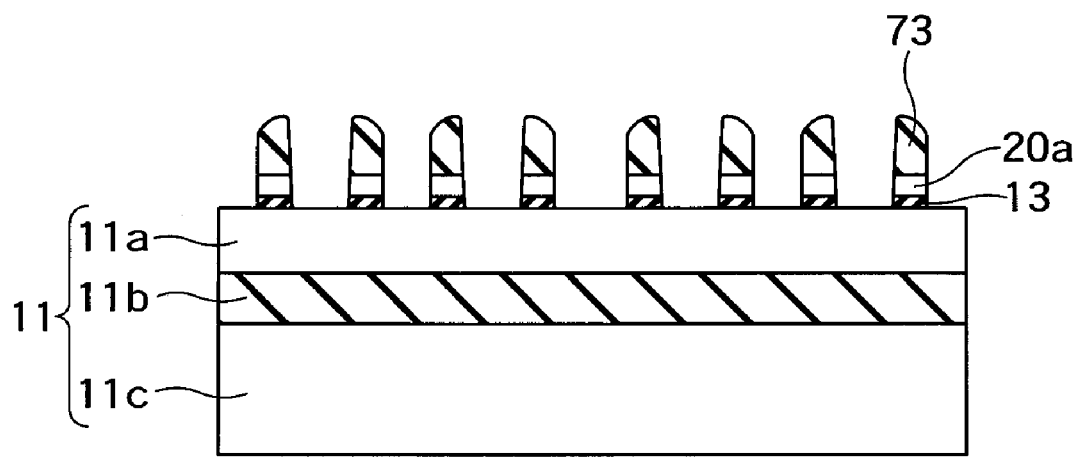
Figure 26B:
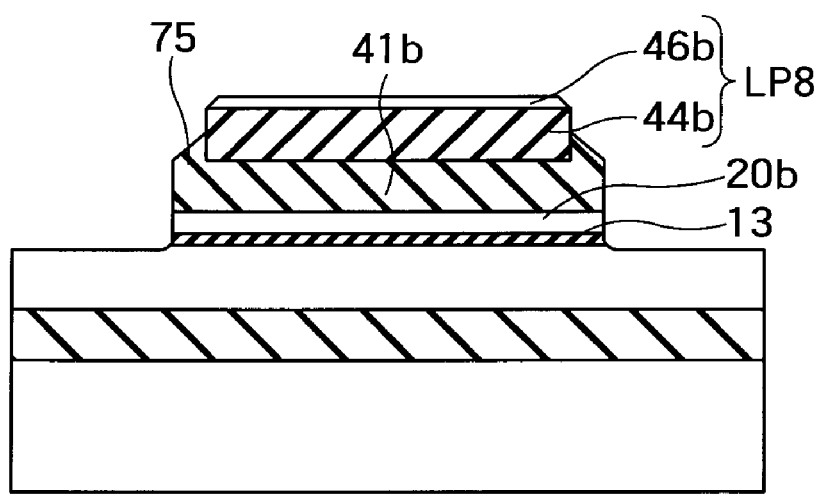
Figure 27A:
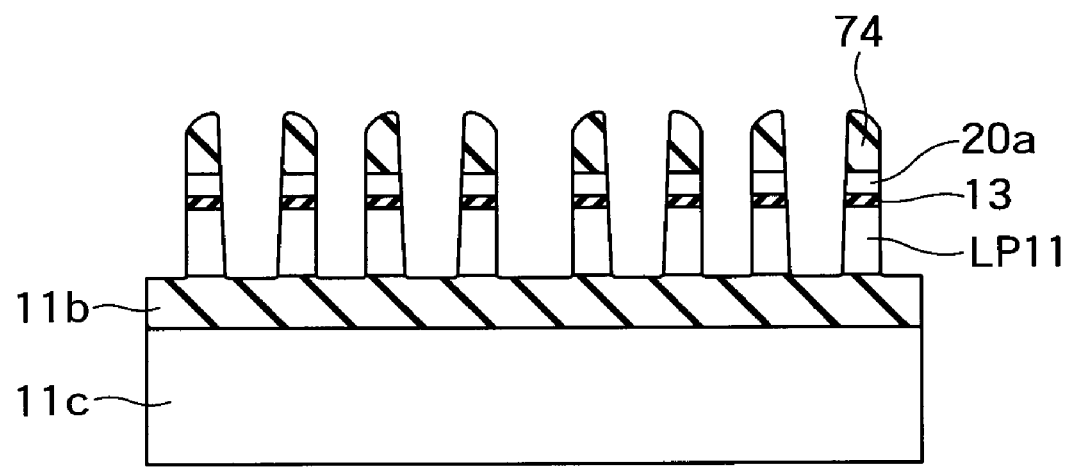
Figure 27B:
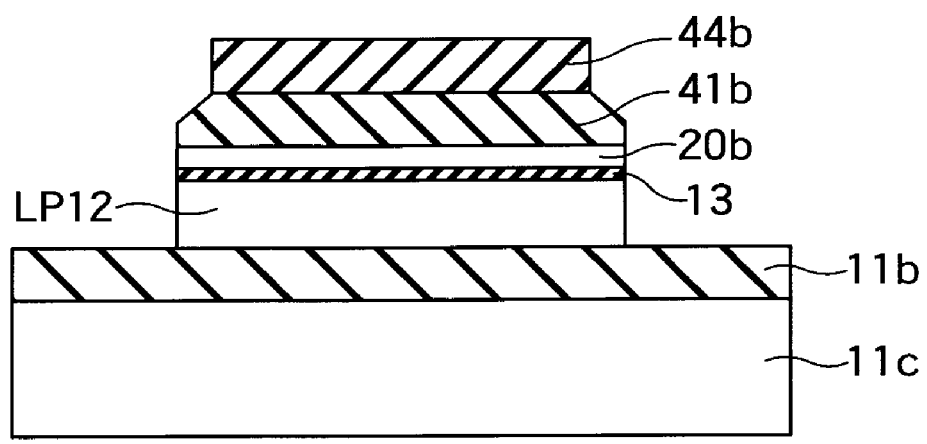

Then, as shown in partial cross-sectional views of FIGS. 25A and 25B, the polysilicon film 19 is selectively removed based on anisotropic etching to provide polysilicon films 20a and 20b. Subsequently, as shown in partial cross-sectional views of FIGS. 20A and 20B, the tunnel oxide film 12 is selectively removed based on anisotropic etching to provide the tunnel oxide film 13. Additionally, as shown in partial cross-sectional views of FIGS. 27A and 27B, the single-crystal silicon 11a forming the upper layer of the SOI substrate 11 is selectively removed based on anisotropic etching, thereby forming single-crystal silicon patterns LP11 and LP12.

Figure 28A:
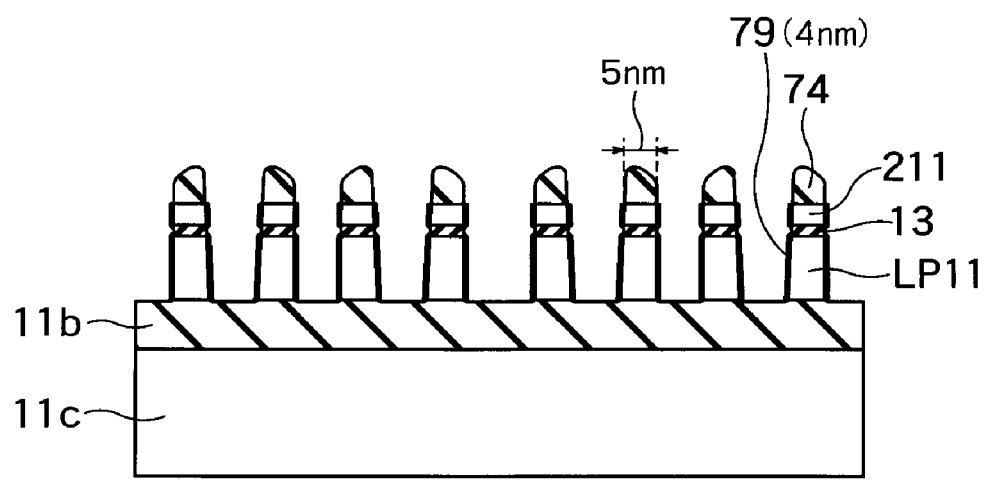
Figure 28B:
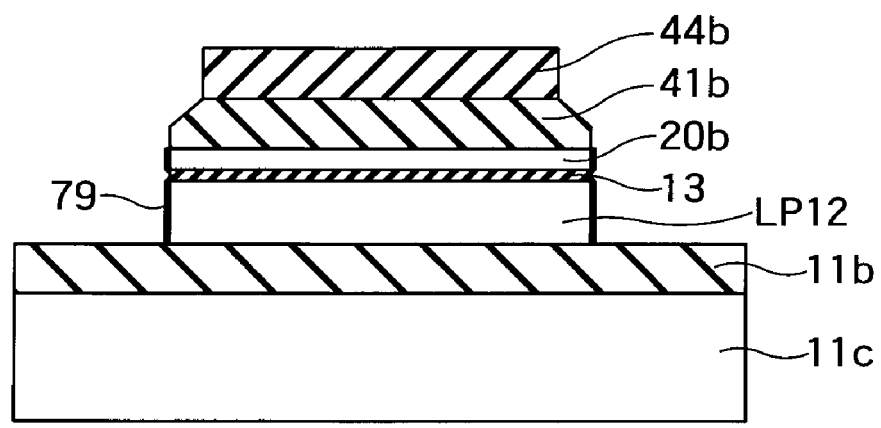

Then, as shown in partial cross-sectional views of FIGS. 28A and 28B, an oxide film 79 is formed on surfaces of the polysilicon films 20a and 20b and the single-crystal silicon patterns LP11 and LP12 based on a thermal oxidation process. In this embodiment, a film thickness of the oxide film 79 is 4 nm. Based on this thermal oxidation process, the polysilicon film 20a is turned to a polysilicon film 211 that finally becomes a charge storage layer, and its film thickness is 5 nm.

Figure 29A:
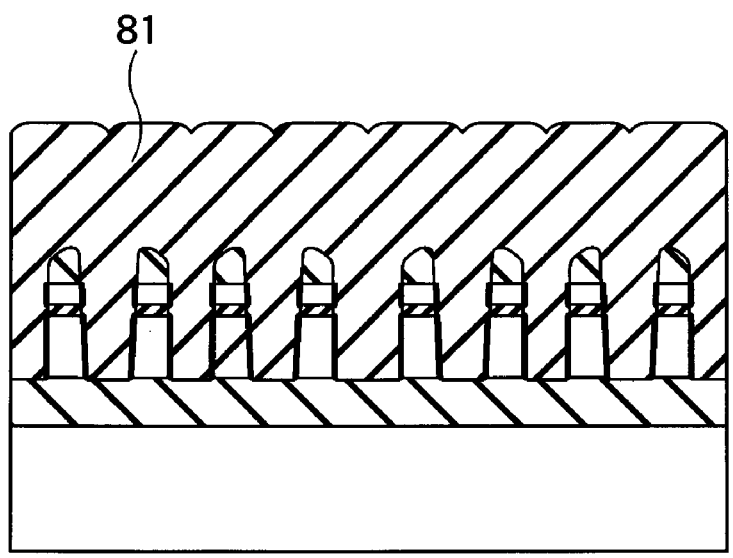
Figure 29B:
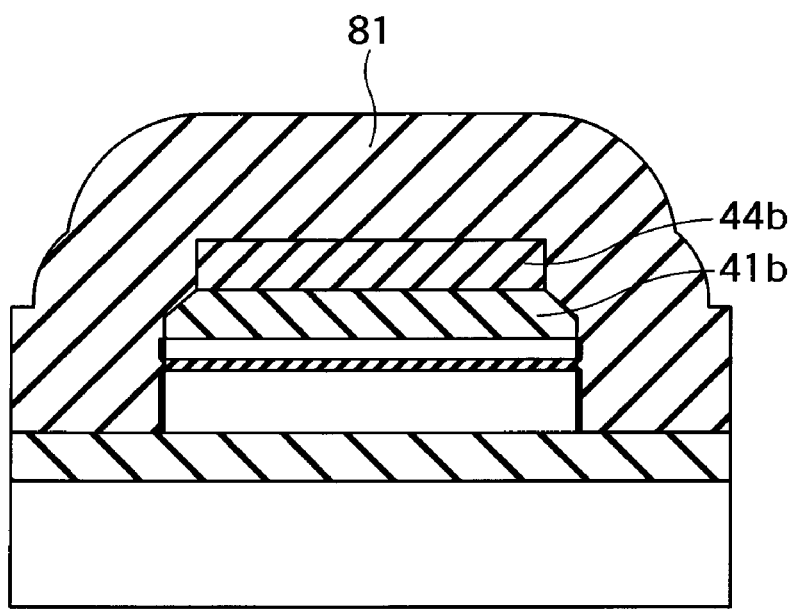
Figure 30A:
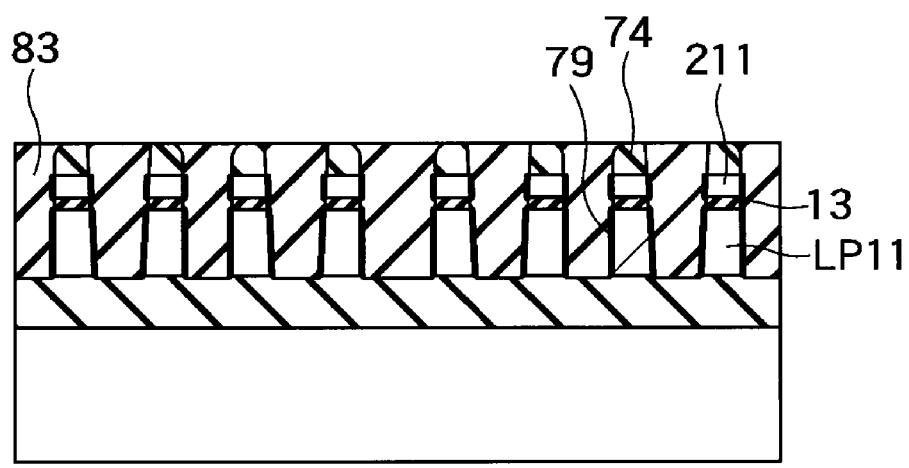
Figure 30B:
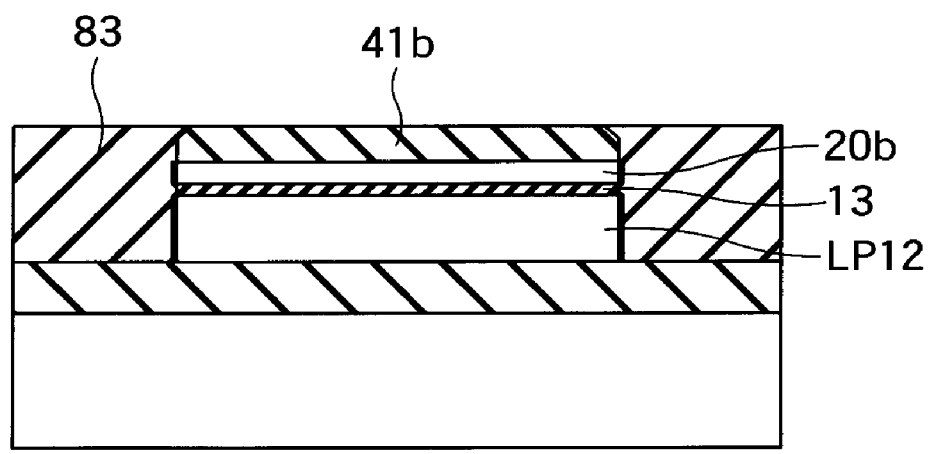
Figure 31A:
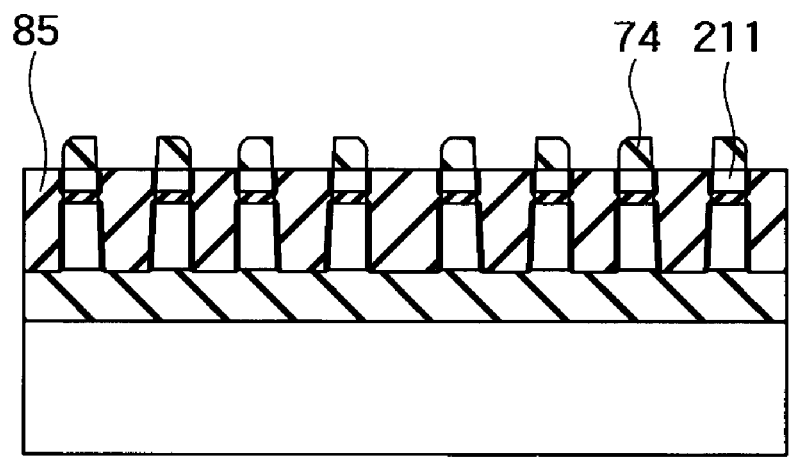
Figure 31B:
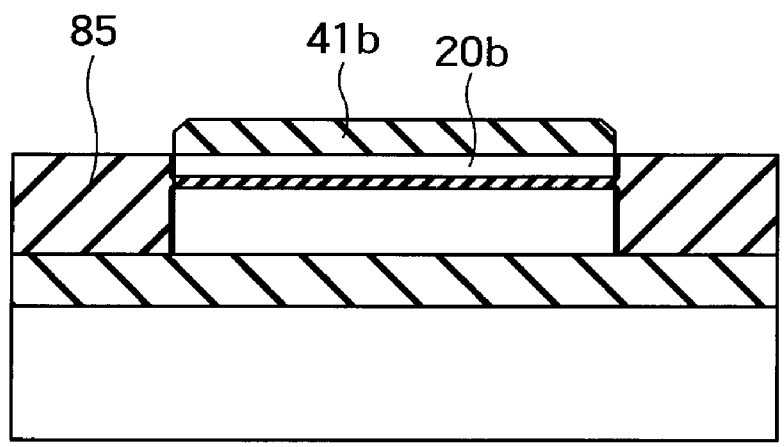
Figure 32A:
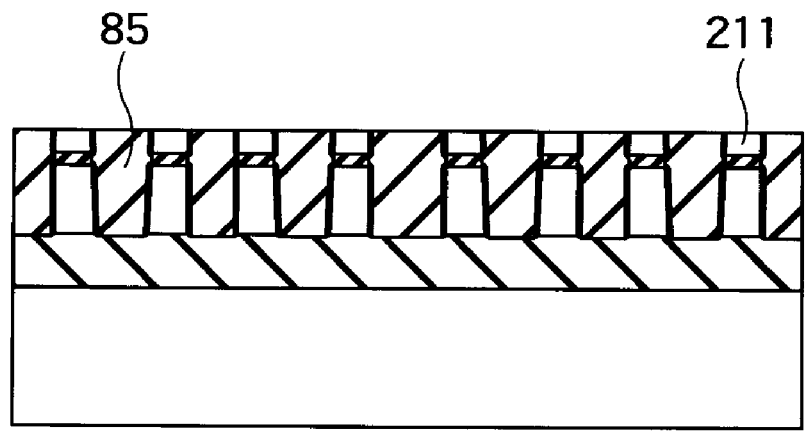
Figure 32B:
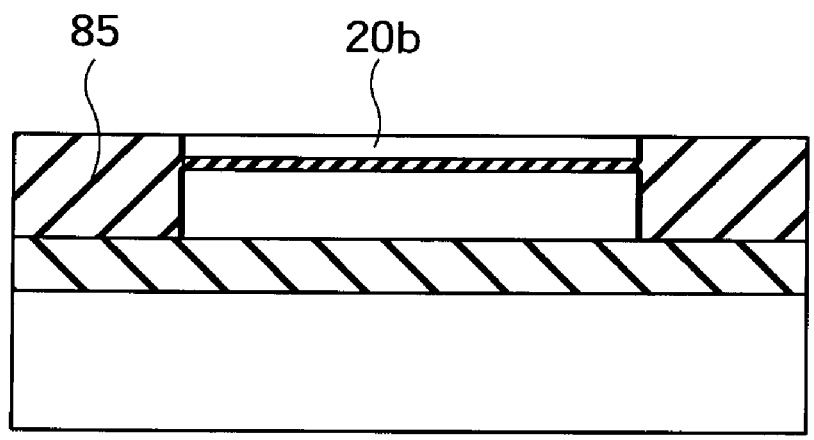

Subsequently, as shown in partial cross-sectional views of FIGS. 29A and 29B, an insulating film 81 is deposited on the entire surface. Then, as shown in partial cross-sectional views of FIGS. 30A and 30B, the nitride film 41b is used as a stopper film to perform flattening processing, thereby providing an insulating film 83. Subsequently, as shown in partial cross-sectional views of FIGS. 31A and 31B, the insulating film 83 is selectively removed so as to be level with a top surface of the polysilicon 211, thereby providing the insulating film 85. Then, as shown in partial cross-sectional views of FIGS. 32A and 32B, the nitride films 74 and 41b are selectively removed based on wet etching.

Figure 33A:
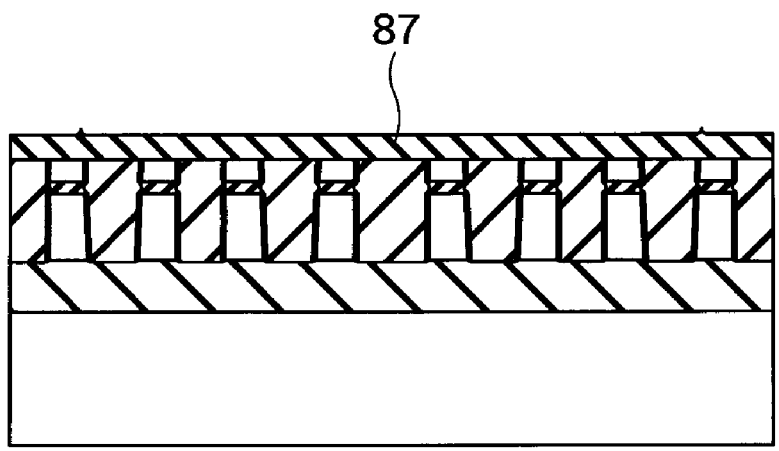
Figure 33B:
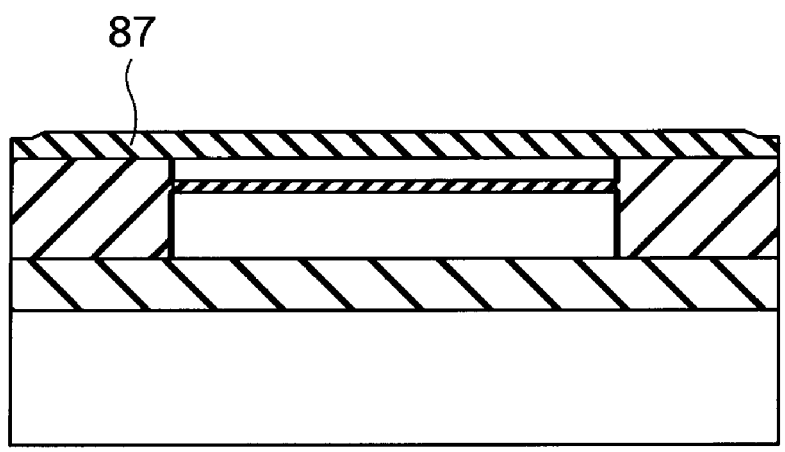

Subsequently, as shown in partial cross-sectional views of FIGS. 33A and 33B, an inter-poly insulting film 87 is deposited on the entire surface. Further, as shown in partial cross-sectional views of FIGS. 34A and 34B, a polysilicon film 89 is formed on the entire surface. The polysilicon film 89 eventually becomes each control gate (the word line) 29 (see FIG. 1) by subsequent processes.

The processing now enters a process of forming each control gate (the word line) 29 and each quantum dot 21 (see FIG. 1) based on third and fourth sidewall mask etching processes. Each quantum dot consisting of polysilicon having a width of 5 nm is eventually formed from a lithography pattern having a width of 40 nm (see LP1 in FIG. 6A and LP15 in FIG. 37A) by performing the third and fourth sidewall mask etching processes in directions perpendicular to those of the first and second sidewall mask etching processes, respectively.

Figure 34A:
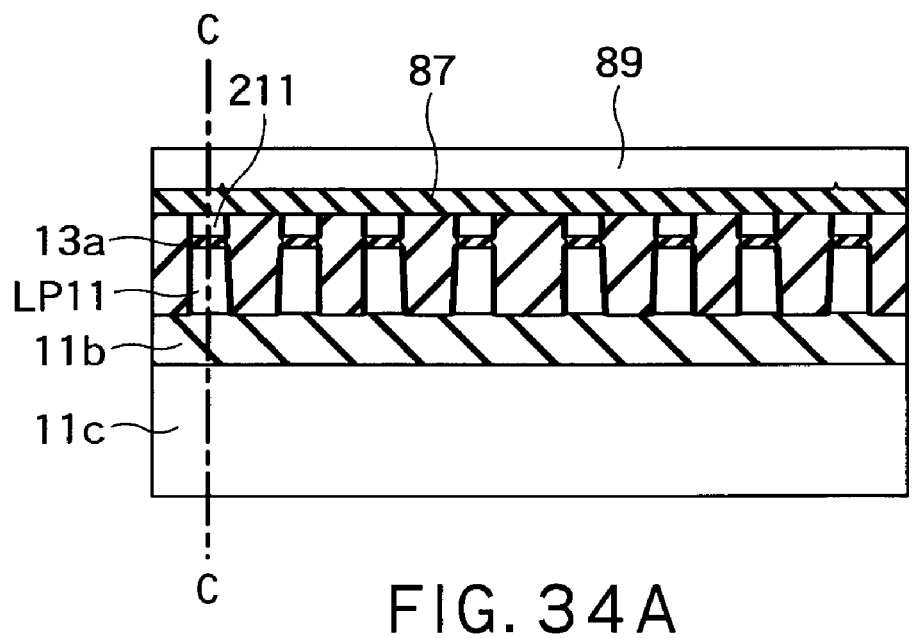
Figure 34B:
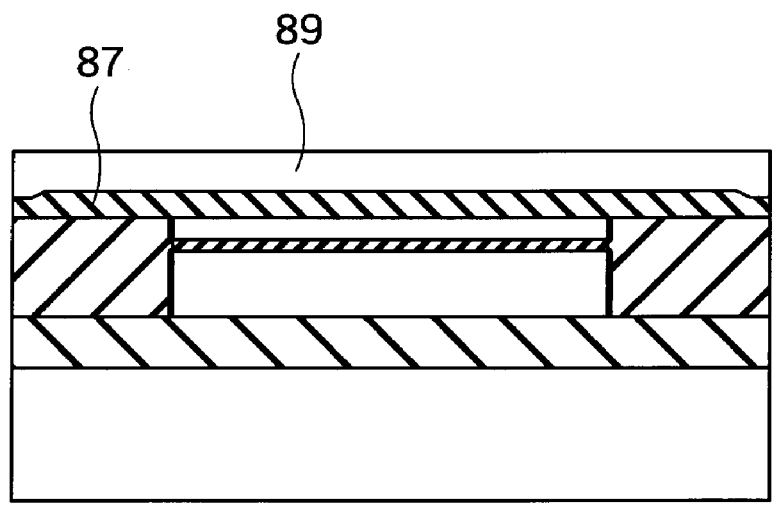
Figure 35:
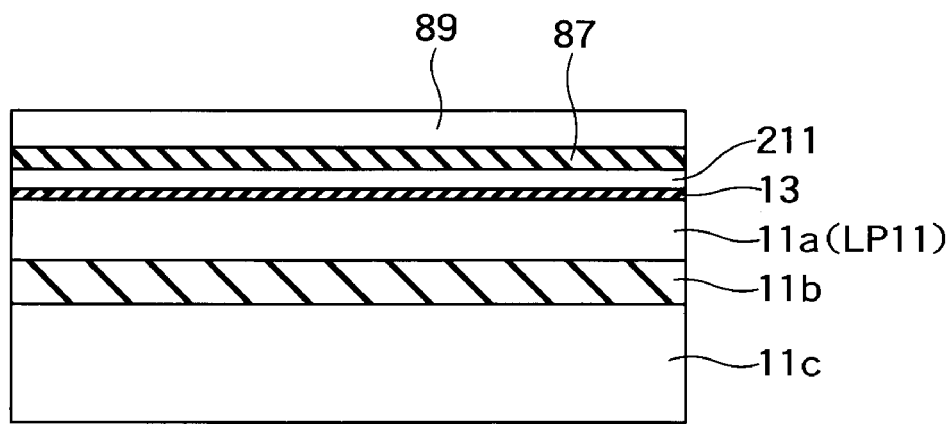

FIG. 35 is a partial cross-sectional view taken along a cutting-plane line C-C in FIG. 34A. Not only FIG. 35 but also respective partial cross-sectional views of FIGS. 36 to 64B are cross-sectional views taken along a direction perpendicular to a cross-sectional direction of FIGS. 4 to 34, i.e., cross-sectional views in a direction vertical to each sheet of the cross-sectional views of FIGS. 4 to 34B.

Figure 36:
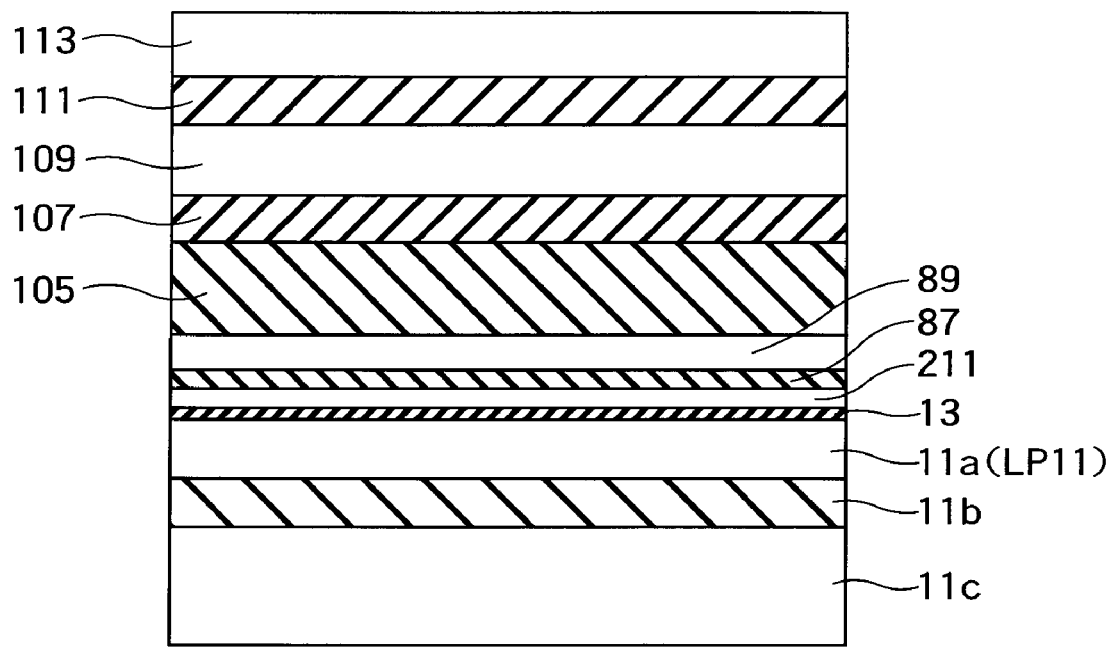

First, as shown in a partial cross-sectional view of FIG. 36, a nitride film 105, a TEOS film 107, an amorphous silicon film 109, a TEOS film 111, and an amorphous silicon film 113 are sequentially deposited on the polysilicon film 89.

Figures 37A, 37B:
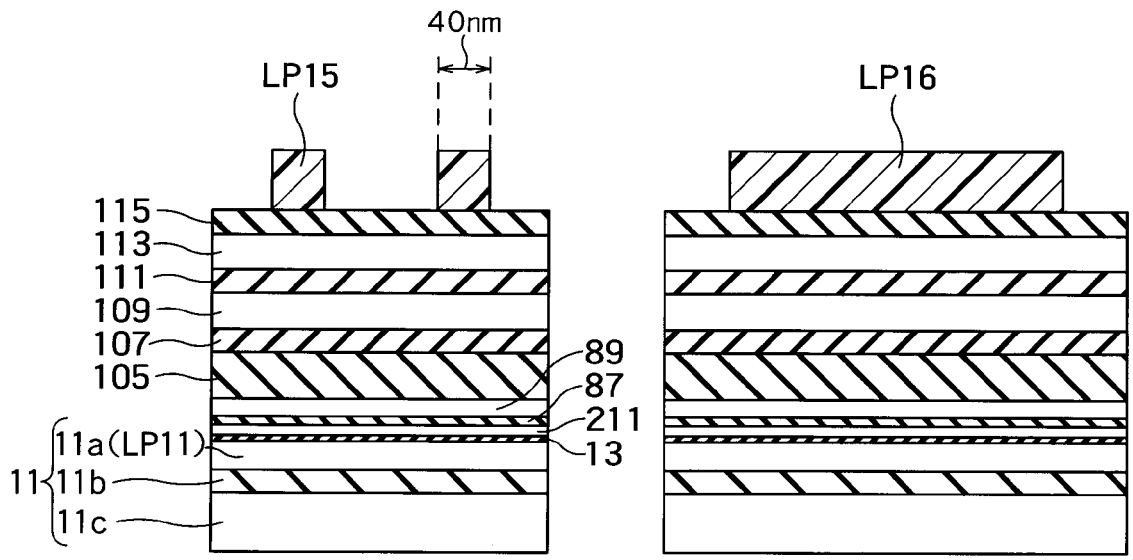
Figure 37C:
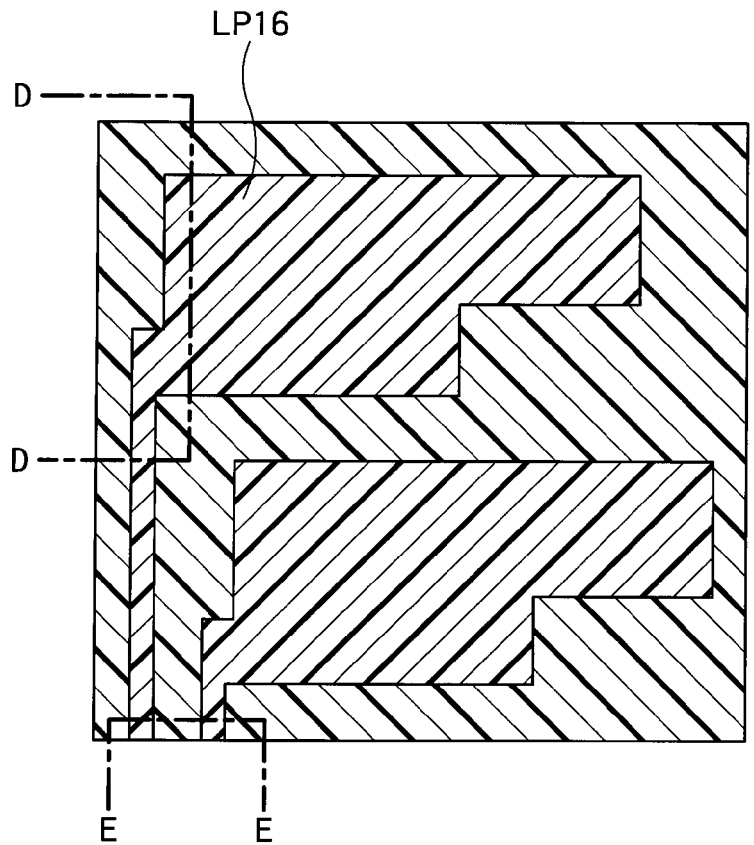
FIG. 37C is a partial plan view for explaining a manufacturing method for the semiconductor storage device depicted in FIG. 1.

Then, as shown in partial cross-sectional views of FIGS. 37A and 37B, an anti-reflection film 115 is formed on the amorphous silicon film 113, a photoresist film is applied to an upper side of the anti-reflection film 15, the photoresist film is selectively removed by patterning using lithography, thereby forming line patterns LP15 and LP16 each consisting of the photoresist film. FIG. 37A corresponds to a cross-sectional view in a direction parallel to the bit lines 31 in the cell section Rc (a direction parallel to a line A-A in FIG. 2), and FIG. 37B corresponds to a cross-sectional view in a direction parallel to the word lines in the peripheral circuit section Rp (see FIG. 2). FIG. 37C is a plan view on this stage. FIG. 37A is a cross-sectional view taken along a cutting-plane line E-E in FIG. 37, and FIG. 37B is a cross-sectional view taken along a cutting-plane line D-D in the same. In this embodiment, in the cell section Rc, when the line pattern LP15 is formed with a width of 40 nm and each space width between the line patterns LP15 and LP15 is 92 nm, the interval S2=18 nm, the interval S3=20 nm, and the interval S4=22 nm depicted in FIG. 1 are provided. As the device, a structure where the cell arrays are aligned at equal intervals is desirable, but one of characteristic points lies in that the use of the sidewall mask etching process according to this embodiment causes an actually formed pattern to take such a cyclic arrangement even if equal intervals are targeted. The line pattern LP16 in the peripheral circuit section Rp is formed so as to have an arbitrary large width, e.g., 252 nm.

Figure 38A:
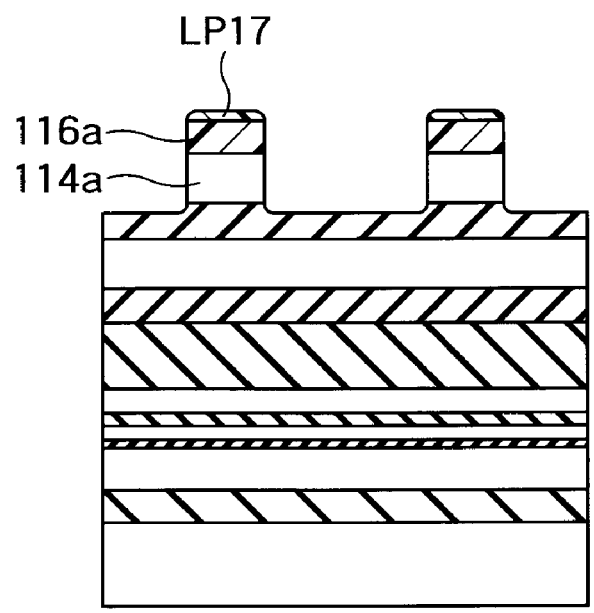
Figure 38B:
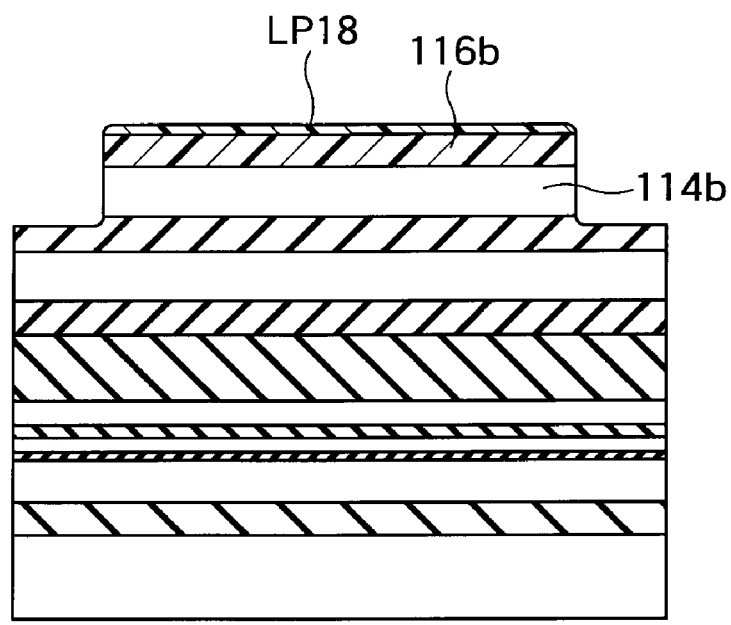

Then, as shown in partial cross-sectional views of FIGS. 38A and 38B, the anti-reflection film 115 and the line patterns LP15 and LP16 are selectively removed based on anisotropic etching to provide anti-reflection films 116a and 116b and line patterns LP17 and LP18, and the amorphous silicon film 113 provided below these films is processed to provide amorphous silicon films 114a and 114b. Subsequently, as shown in partial cross-sectional views depicted in FIGS. 39A and 39B, the anti-reflection films 116a and 116b and the line patterns LP17 and LP18 are delaminated based on ashing. FIG. 39C is a top view showing this stage.

Subsequently, as shown in partial cross-sectional views of FIGS. 40A and 40B, a photoresist film 131 is left on the entire surface of the cell section Rc by patterning using a photoresist. On the other hand, the photoresist film 131 is partially removed in the peripheral circuit section Rp. FIG. 40C is a top view showing this stage. As shown in FIG. 40B, a width W1 that the photoresist film 131 covers an island pattern of the amorphous silicon 114b is 153 nm in this embodiment.

Figure 41A:
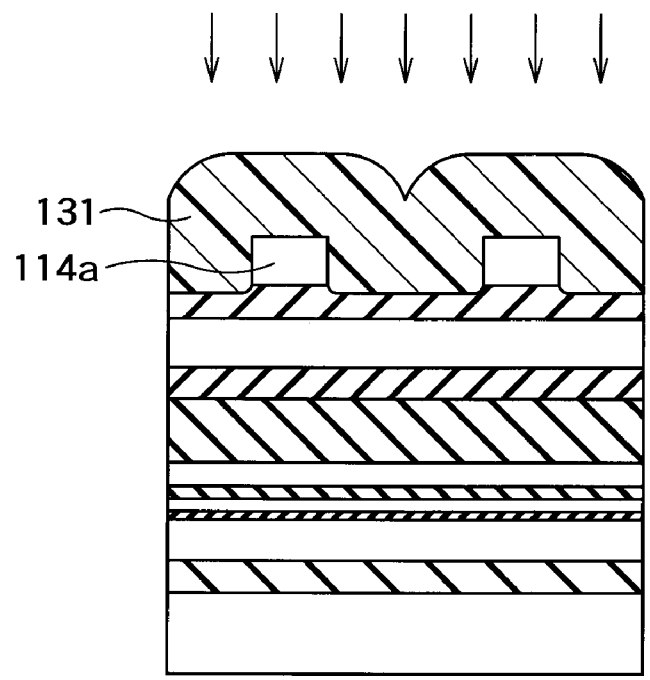
Figure 41B:
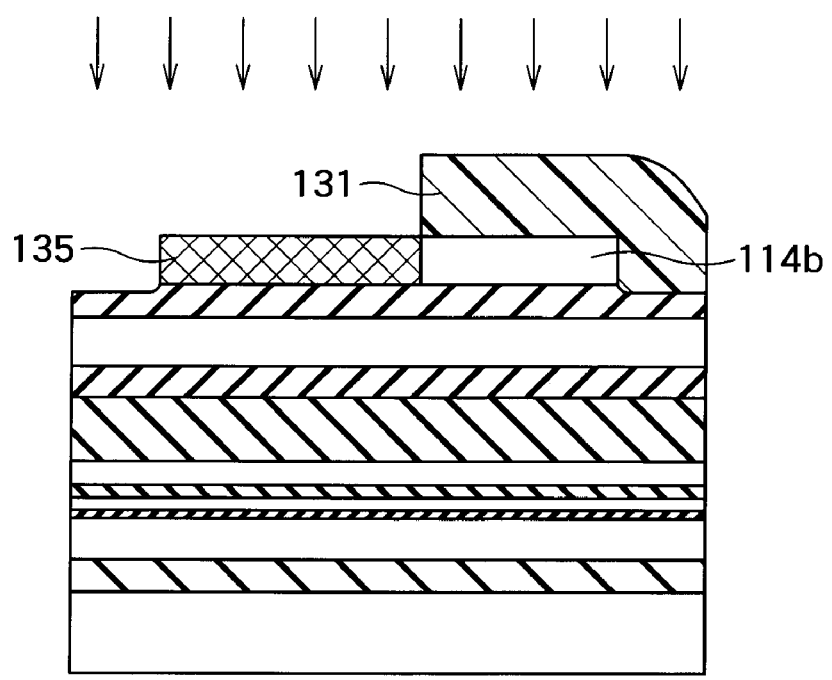

Then, as shown in partial cross-sectional views of FIGS. 41A and 41B, boron is implanted into the entire surface. In a part of each of the cell section Rc and the peripheral circuit section Rp, a part of the amorphous silicon film 114b covered with the photoresist 131 is not subjected to implantation since it is covered with the photoresist. On the other hand, a part of the peripheral circuit section Rp that is not covered with the photoresist 131 is turned to P-type silicon 135 based on boron implantation.

Subsequently, as shown in partial cross-sectional views of FIGS. 42A and 42B, the photoresist 131 is delaminated by ashing. FIG. 42C is a top view showing this stage.

Figure 43A:
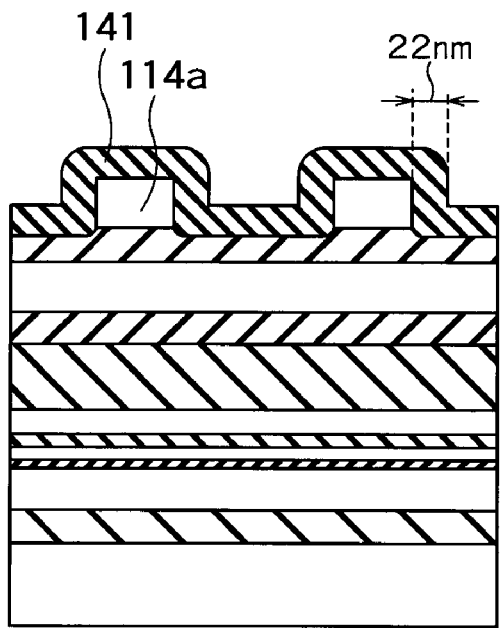
FIGS. 43A to 44B are partial cross-sectional views for explaining a manufacturing method for the semiconductor storage device depicted in FIG. 1.
Figure 43B:
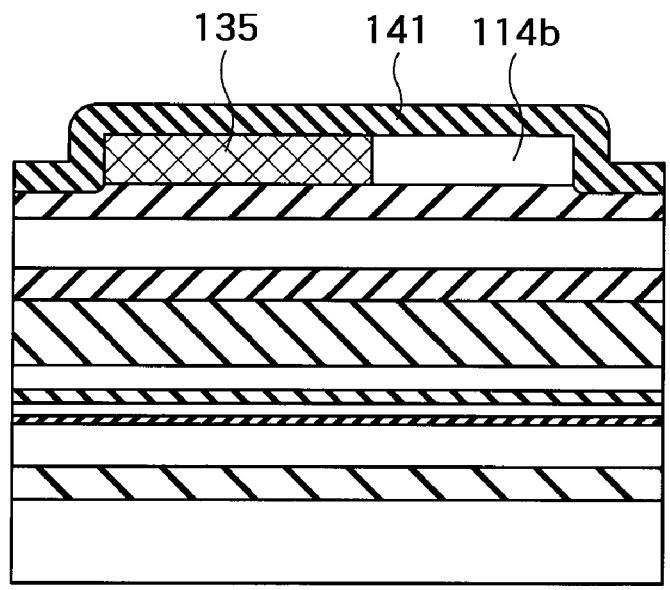
Figure 44A:
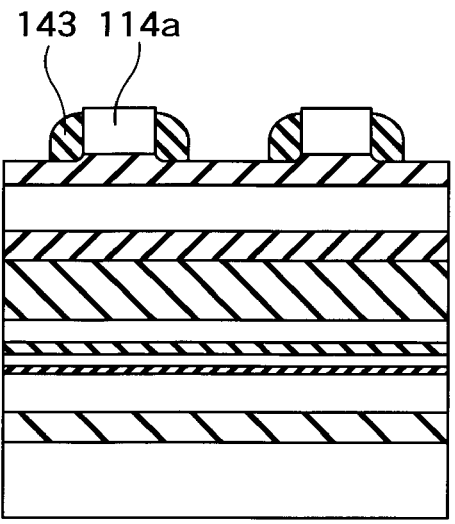
FIG. 44C is a partial plan view for explaining a manufacturing method for the semiconductor device depicted in FIG. 1.
Figure 44B:
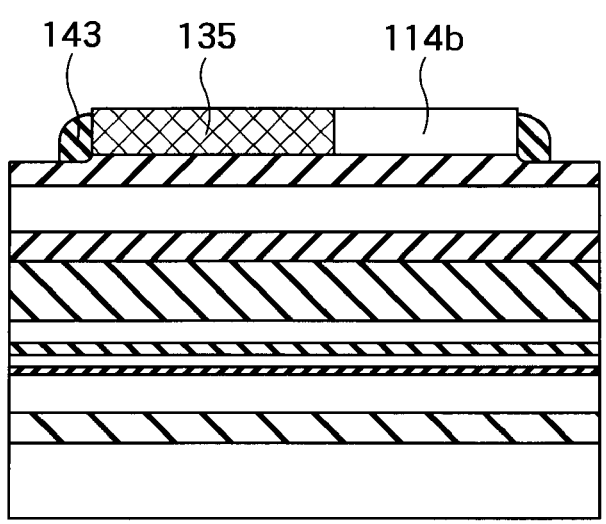
Figure 44C:
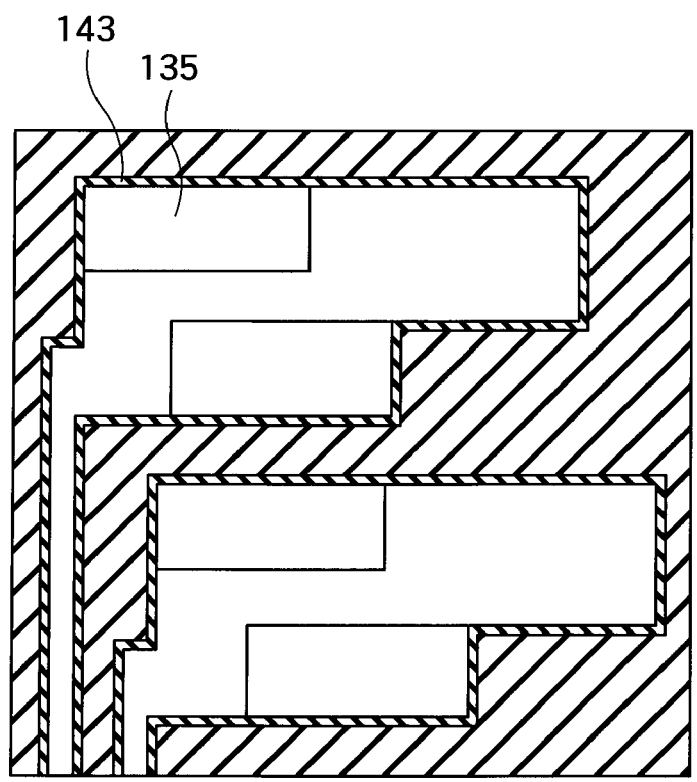

Then, as shown in partial cross-sectional views of FIGS. 43A and 43B, a nitride film 141 is deposited on the entire surface. A film thickness of the nitride film 141 is 22 nm in this embodiment. Subsequently, as shown in partial cross-sectional views of FIGS. 44A and 44B, a flat surface portion of the nitride film 141 is selectively removed based on anisotropic etching to form a sidewall film 143 while leaving a sidewall portion of the amorphous silicon film 114a and a sidewall portion of the amorphous silicon film 114b and the island pattern of the P-type silicon 135. FIG. 44C is a top view showing this stage.

Then, as shown in partial cross-sectional views of FIGS. 45A and 45B, the amorphous silicon films 114a and 114b are selectively removed by wet etching. At this time, a selection ratio of wet etching is set in such a manner that a boron-doped region, e.g., the P-type silicon 135 can remain. FIG. 45C is a top view showing this stage.

Figure 46A:
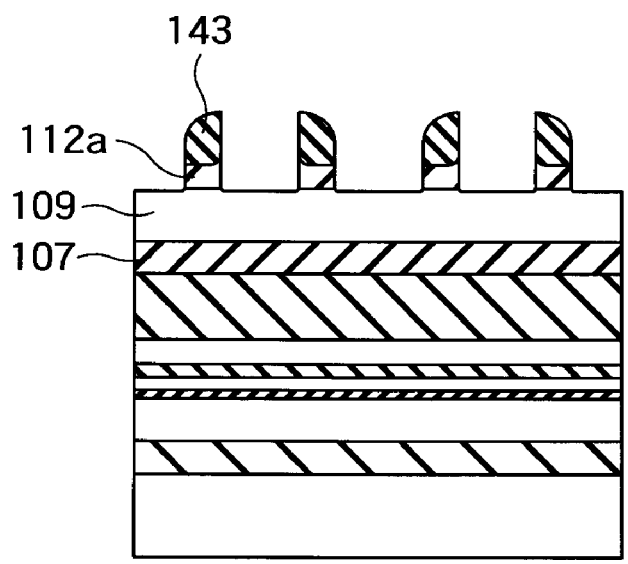
FIGS. 46A to 49B are partial cross-sectional views for explaining a manufacturing method for the semiconductor storage device depicted in FIG. 1.
Figure 46B:
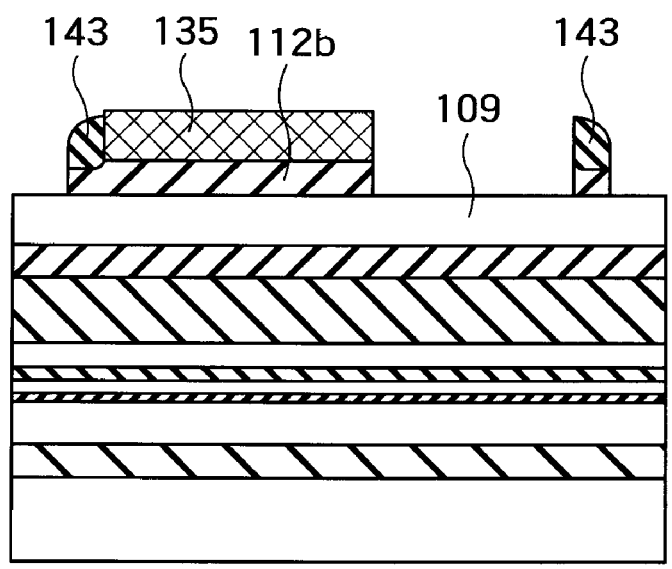

Subsequently, as shown in partial cross-sectional views of FIGS. 46A and 46B, the TEOS film 111 is selectively removed by anisotropic etching to provide TEOS films 112a and 112b.

Figure 47A:
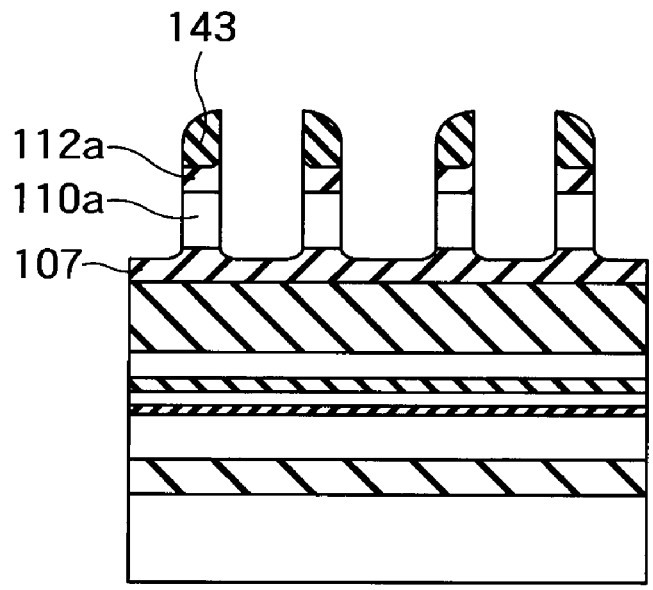
Figure 47B:
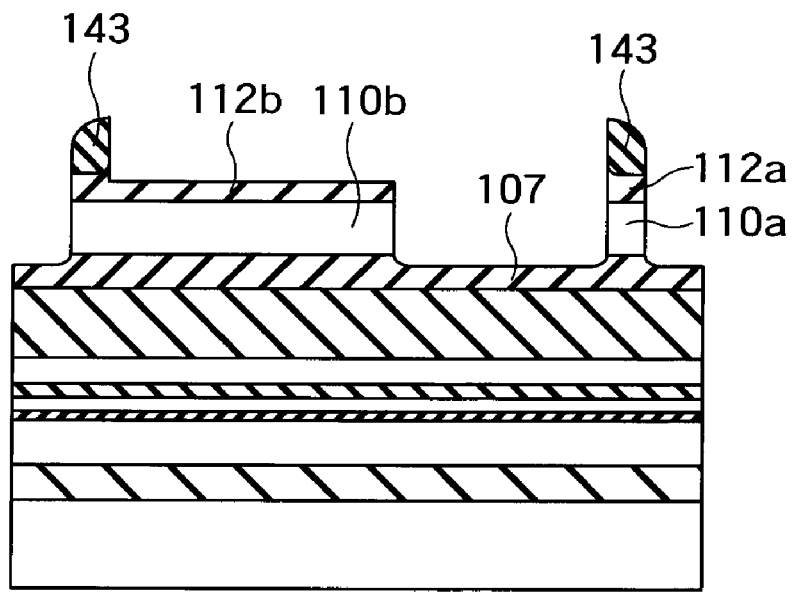

Then, as shown in partial cross-sectional views of FIGS. 47A and 47B, the amorphous silicon film 109 is selectively removed by anisotropic etching to provide amorphous silicon films 110a and 110b.

Figure 48A:
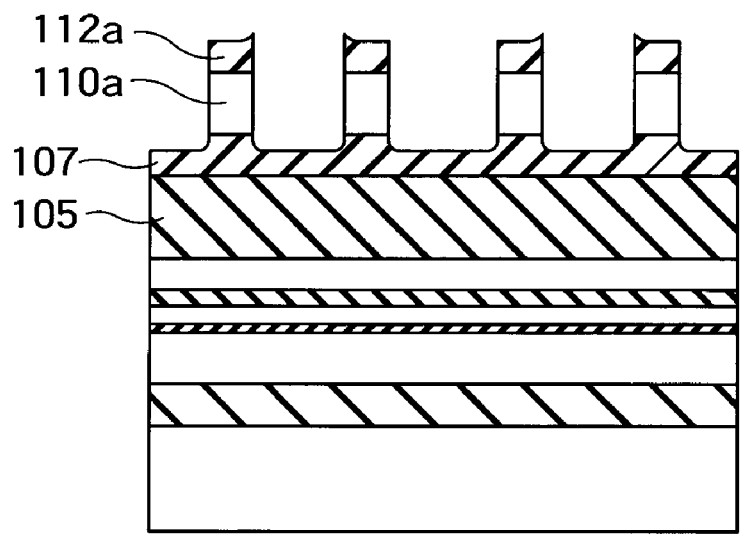
Figure 48B:
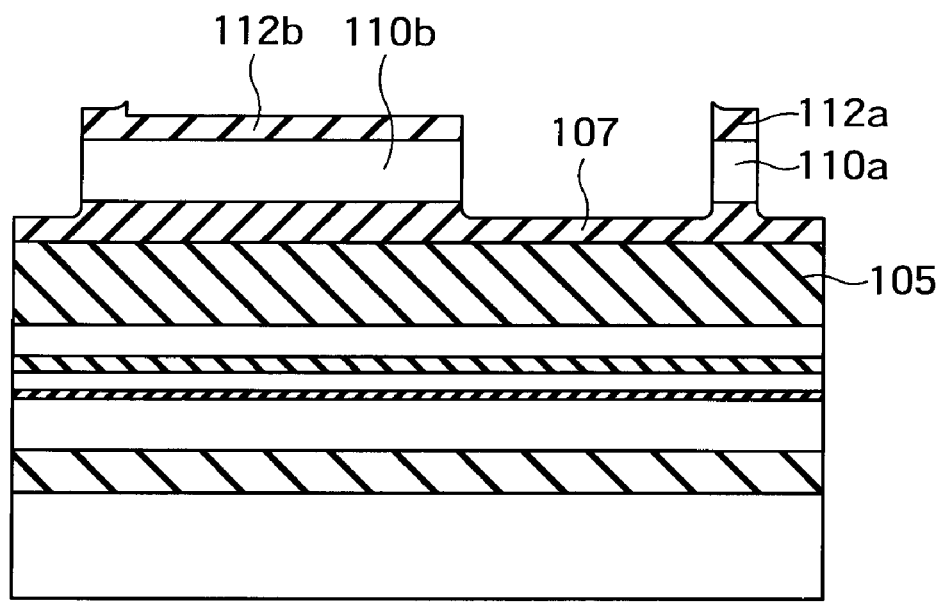

Thereafter, as shown in partial cross-sectional views of FIGS. 48A and 48B, the sidewall 143 formed of the nitride film is removed by wet etching. Further, the TEOS film 107 is selectively removed by anisotropic etching to provide TEOS films 108a and 108b as depicted in partial cross-sectional views of FIGS. 49A and 49B. FIG. 49C is a top view showing this stage.

Figure 49A:
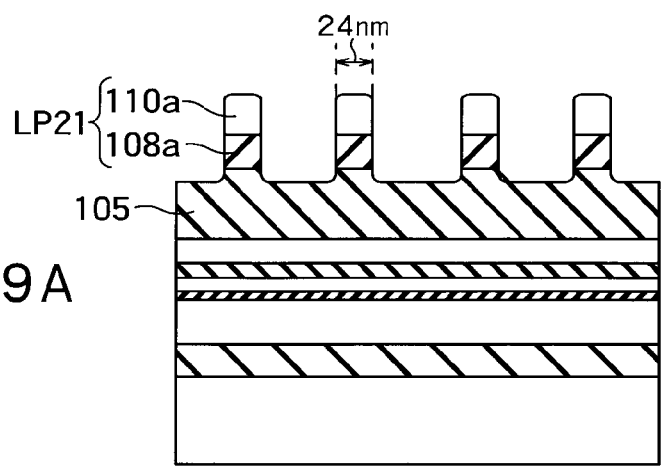
FIG. 49C is a partial plan view for explaining a manufacturing method for the semiconductor storage device depicted in FIG. 1.
Figure 49B:
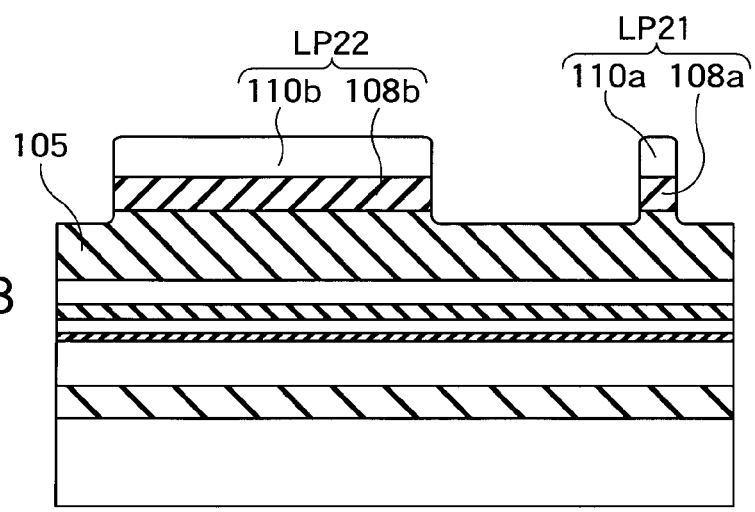
Figure 49C:
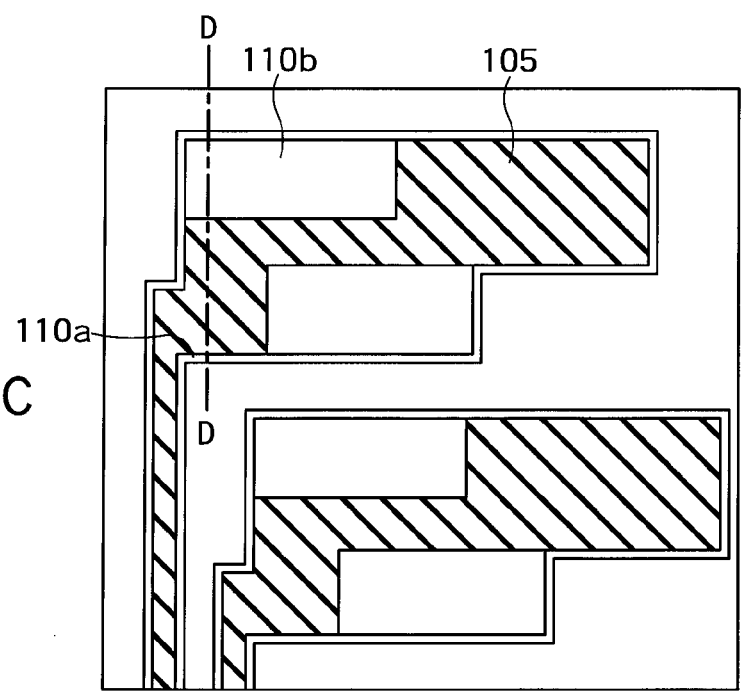

With the above-explained series of processes, in the cell section Rc, as shown in FIG. 49A, a line pattern LP 21 that consists of the TEOS film 110a and the amorphous silicon film 108a and has a width of 24 nm is formed. The width of the line pattern LP21 is larger than a film thickness of the sidewall film 143 as the nitride film due to a transformation difference in anisotropic etching shown in FIGS. 45 to 47. In the peripheral circuit section Rp, as shown in FIGS. 49B and C, the line pattern LP21 having a width of 24 nm and a wide line pattern LP22 including the TEOS film 110b and the amorphous silicon film 108b are formed.

In the series of processes depicted in FIGS. 40 to 49, the method of separately performing implantation is adopted as the method of forming the wide pattern in the peripheral circuit section Rp, but the present invention is not restricted thereto. However, as long as the respective line patterns denoted by reference characters LP21 and 22 and the island pattern in FIGS. 49A to 49C can be formed, any combination different from that of film configurations above the TEOS film 107 and the etching process may be used.

The processing now enters a fourth sidewall mask etching process to form each quantum dot 21 and each control gate (the word line) 29 depicted in FIG. 3.

Figure 50A:
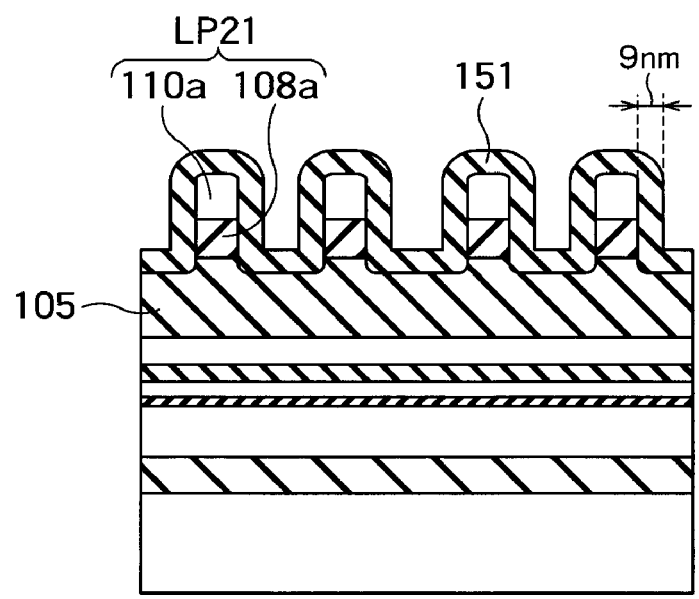
FIGS. 50A to 51B are partial cross-sectional views for explaining a manufacturing method for the semiconductor storage device depicted in FIG. 1.
Figure 50B:
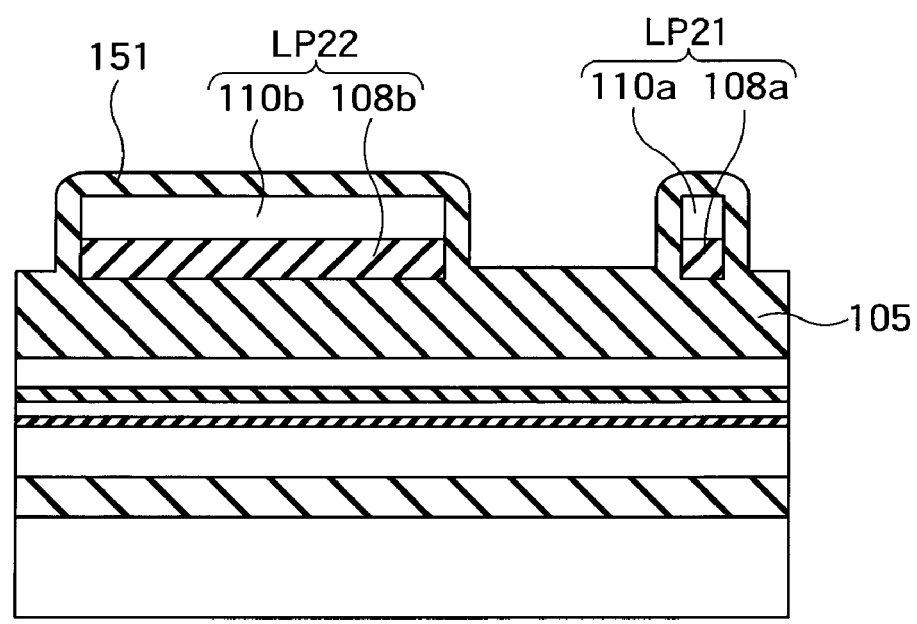

First, as shown in partial cross-sectional views of FIGS. 50A and 50B, a nitride film 151 is deposited on the entire surface to cover the line patterns LP21 and LP22. A film thickness of the nitride film 151 is 9 nm in this embodiment.

Figure 51A:
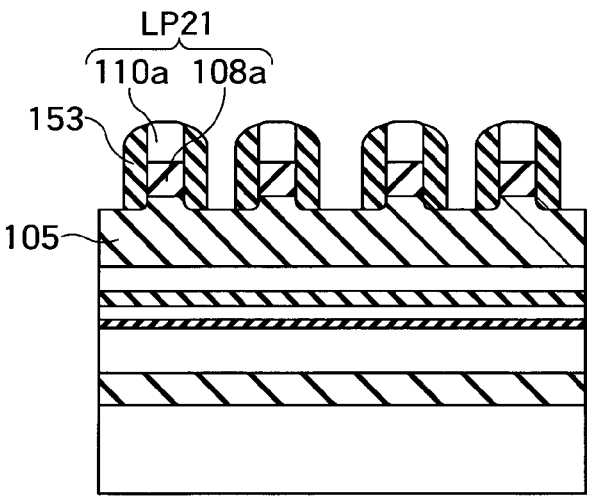
FIG. 51C is a partial plan view for explaining a manufacturing method for the semiconductor storage device depicted in FIG. 1.
Figure 51B:
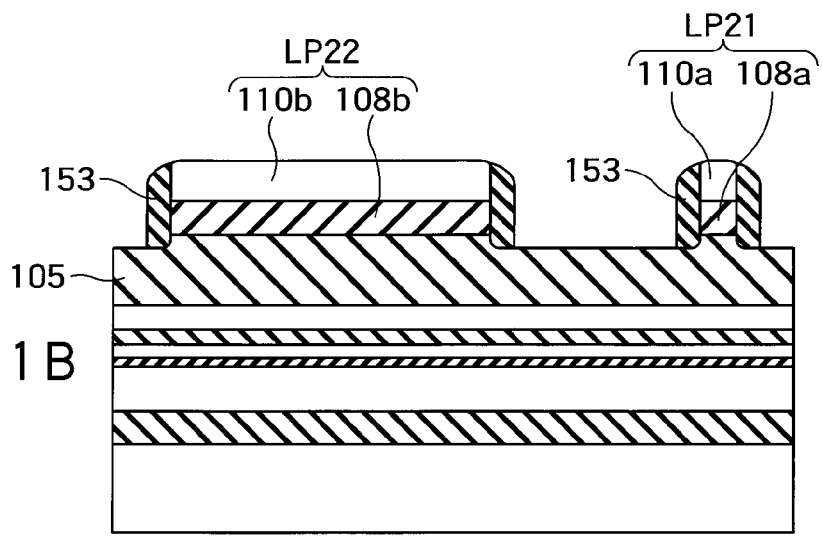
Figure 51C:
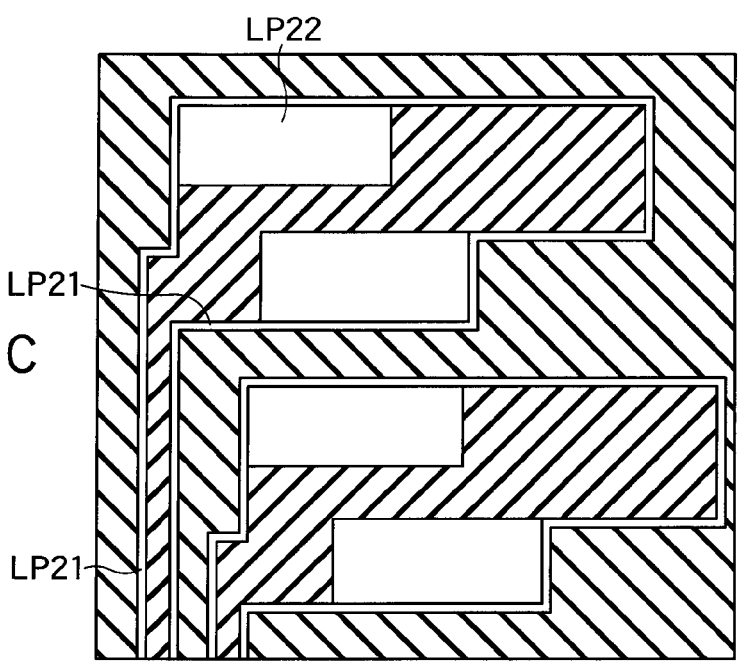

Then, as shown in partial cross-sectional views of FIGS. 51A and 51B, a flat surface portion of the nitride film 151 is selectively removed by anisotropic etching to form a sidewall film 153 while leaving sidewall portions of the line patterns LP21 and LP22. FIG. 51C is a top view showing this stage.

Subsequently, as shown in partial cross-sectional views of FIGS. 52A and 52B, a photoresist film 161 is left on the entire surface of the cell section Rc by patterning using a photoresist and, on the other hand, the photoresist film 161 is partially removed in the peripheral circuit section Rp. FIG. 52C is a top view showing this stage. As shown in FIG. 52B, a width W2 of the photoresist film 161 covering the island pattern LP22 in the peripheral circuit section Rp is 27 nm in this embodiment.

Figure 53A:
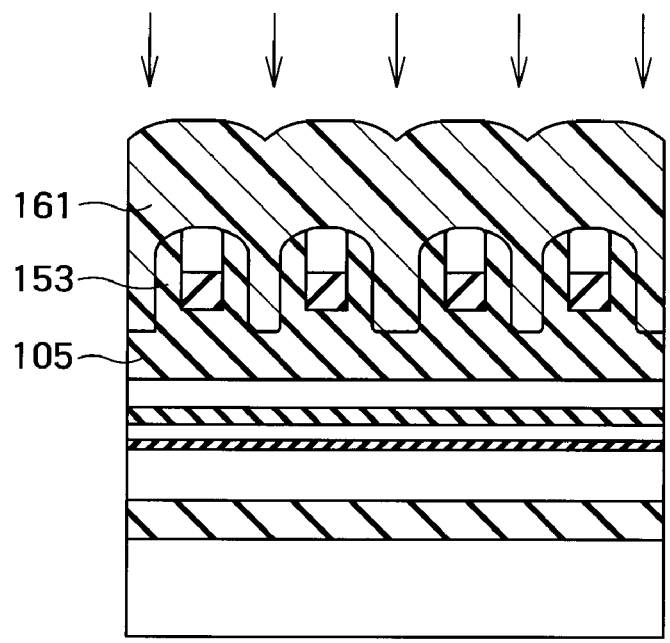
FIGS. 53A to 55B are partial cross-sectional views for explaining a manufacturing method for the semiconductor storage device depicted in FIG. 1.
Figure 53B:
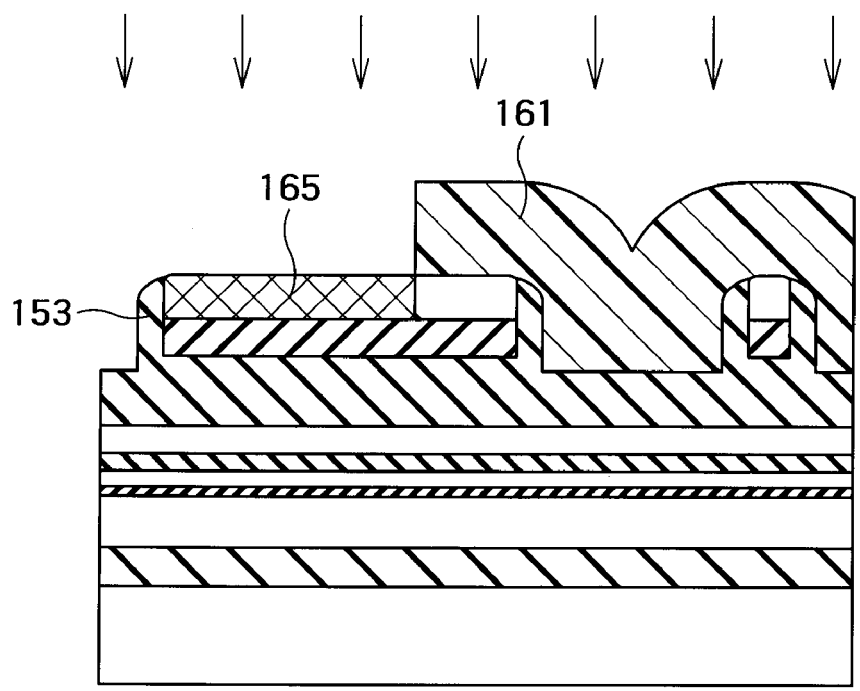

Then, as shown in partial cross-sectional views of FIGS. 53A and 53B, boron is implanted into the entire surface while leaving the photoresist 161 in the cell section Rc alone by patterning using the photoresist. As a result, the line pattern LP21 in the cell section Rc is not subjected to implantation because it is covered with the photoresist 161 and, on the other hand, a part of the line pattern LP22 that is not covered with the photoresist 161 in the peripheral circuit section Rp is turned to P-type silicon 165 based on boron implantation.

Figure 54A:
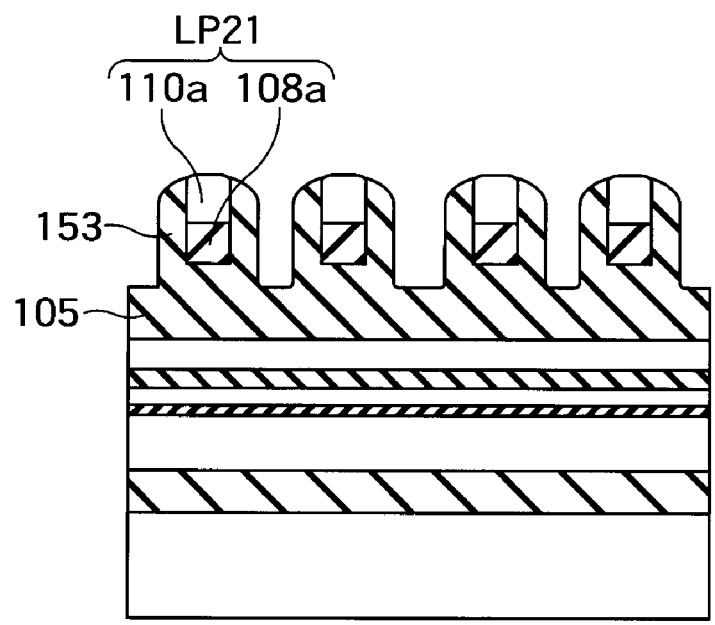
Figure 54B:
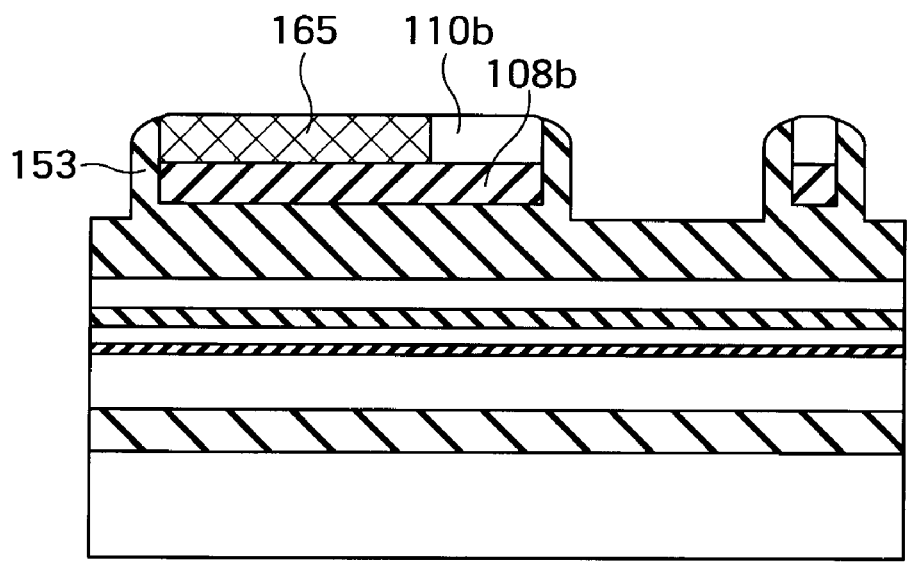
Figure 55A:
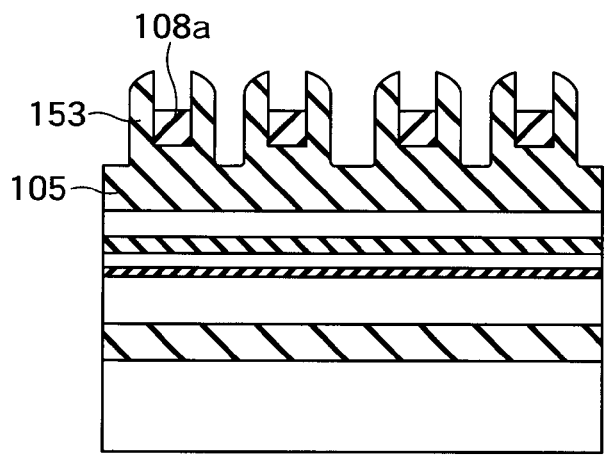
FIG. 55C is a partial plan view for explaining a manufacturing method for the semiconductor storage device depicted in FIG. 1.
Figure 55B:
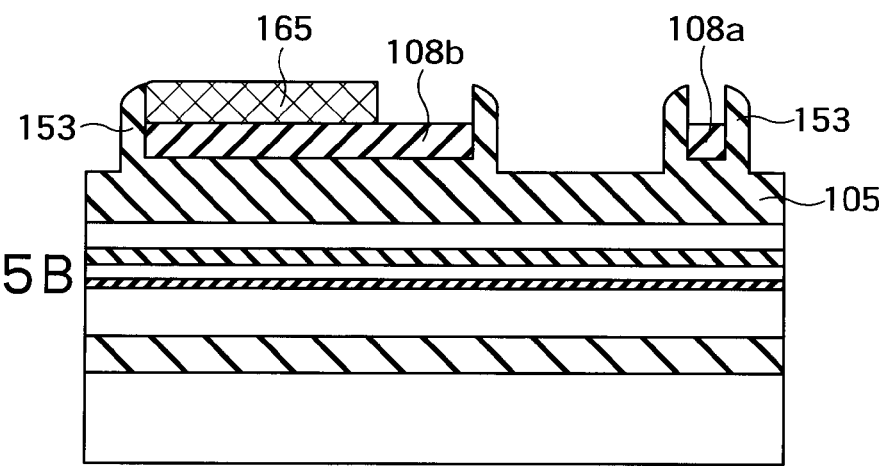
Figure 55C:
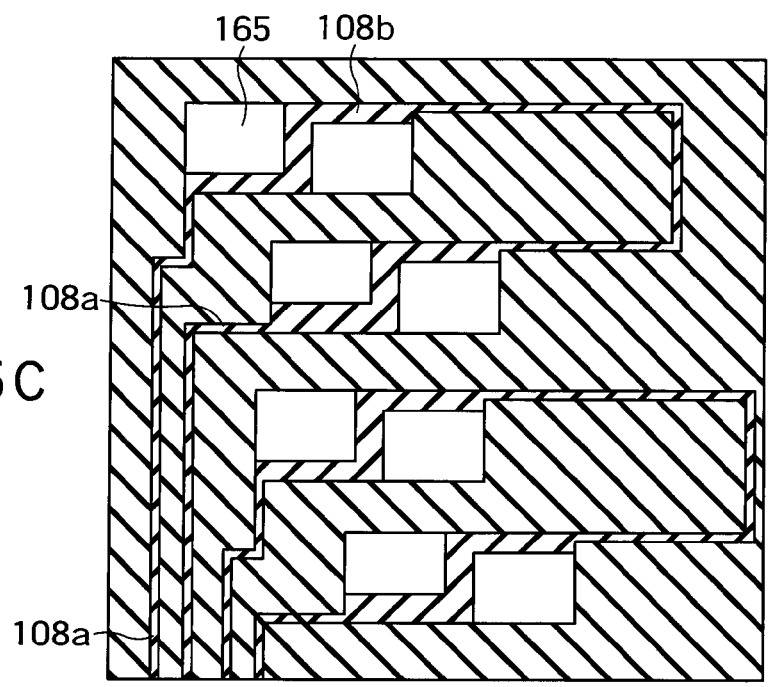

Subsequently, as shown in partial cross-sectional views of FIGS. 54A and 54B, the photoresist 161 is delaminated by ashing. Then, the upper amorphous silicon 110a of the line pattern LP21 is removed by wet etching as shown in partial cross-sectional views of FIGS. 55A and 55B. At this time, a selection ratio of wet etching is set in such a manner that the amorphous silicon 110a alone in the cell section Rc that is not subjected to boron doping is removed and the boron-doped amorphous silicon (the P-type silicon 165) in the peripheral circuit section Rp remains. FIG. 55C is a top view showing this stage.

Figure 56A:
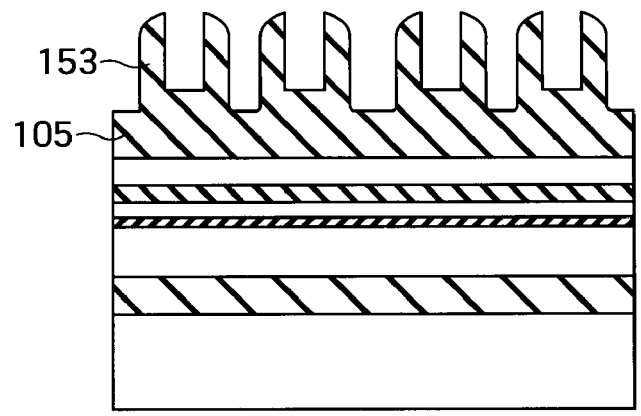
FIGS. 56A and 56B are partial cross-sectional views for explaining a manufacturing method for the semiconductor storage device depicted in FIG. 1.
Figure 56B:
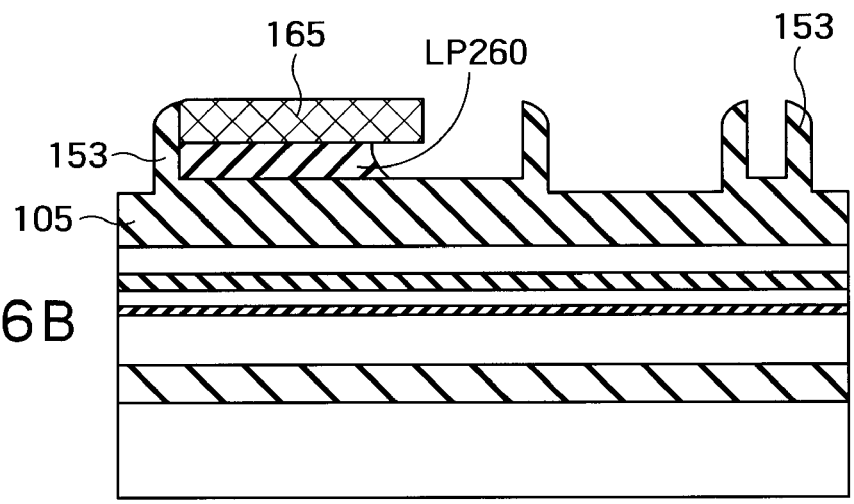
Figure 56C:
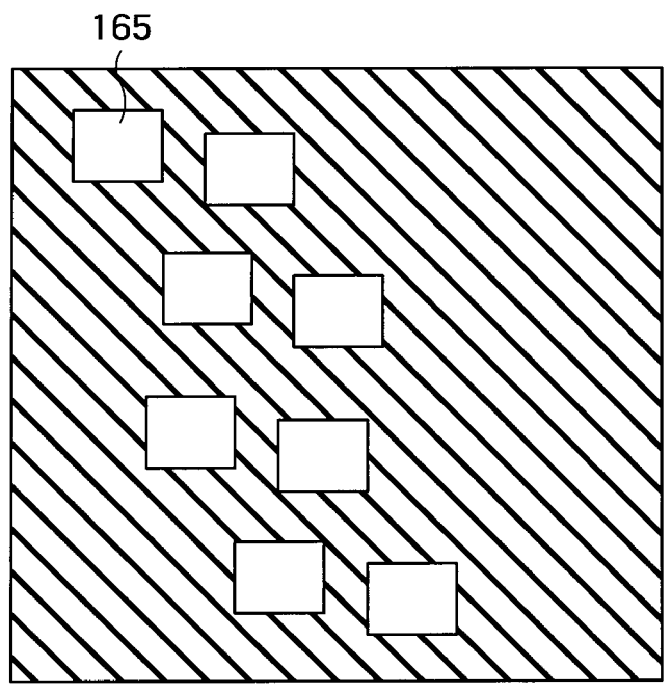
FIG. 56C is a partial plan view for explaining a manufacturing method for the semiconductor storage device depicted in FIG. 1.

Then, as shown in partial cross-sectional views of FIGS. 56A and 56B, the TEOS film 108a and a part of the TEOS film 108b are selectively removed by wet etching using the sidewall film 153 and the P-type silicon 165 as masks. As a result, in the peripheral circuit section Rp, as shown in FIG. 56B, a line pattern LP260 remains. FIG. 56C is a top view showing this stage.

Figure 57A:
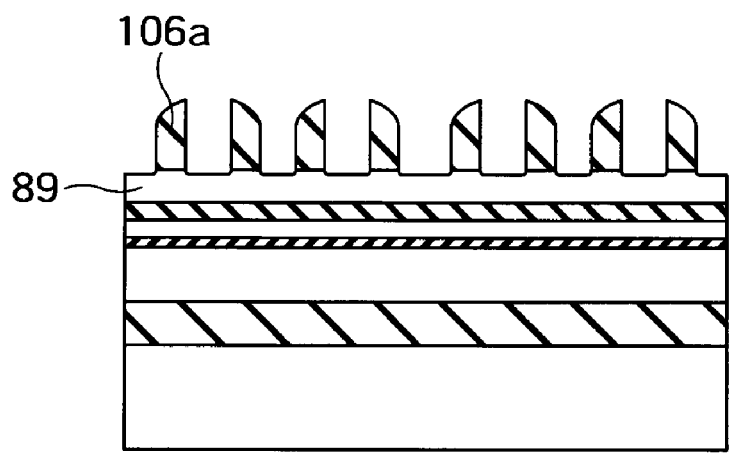
FIGS. 57A to 58B are partial cross-sectional views for explaining the semiconductor storage device depicted in FIG. 1.
Figure 57B:
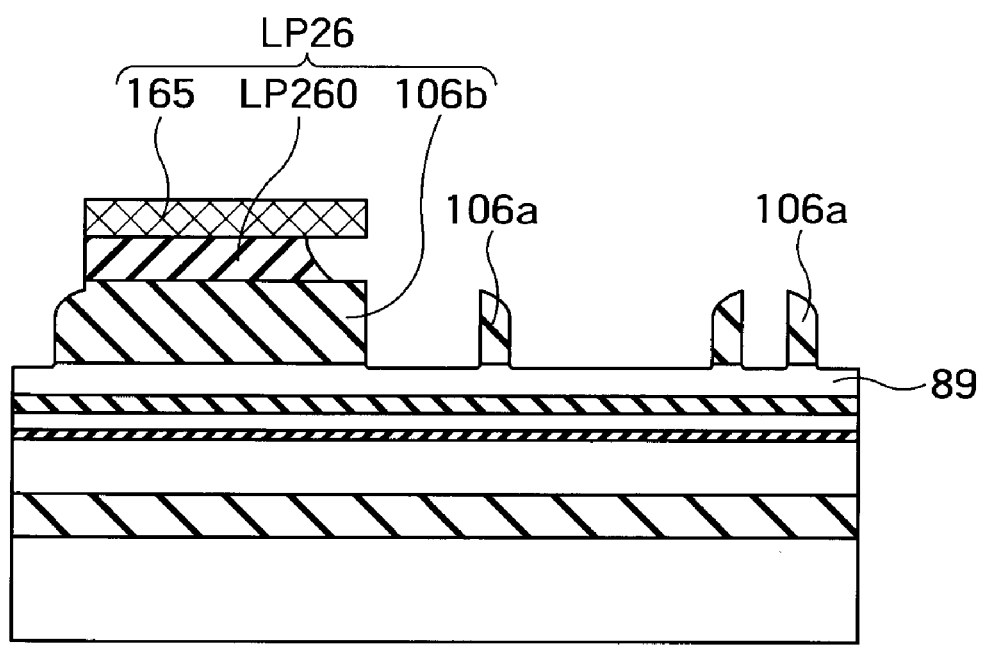

Subsequently, as shown in partial cross-sectional views of FIGS. 57A and 57B, the nitride film 105 is selectively removed based on anisotropic etching using the sidewall film 153 and the P-type silicon 165 as masks to form a fine mask pattern 106a formed of a nitride film and a mask pattern LP26 consisting of a nitride film 106b, the line pattern LP260 of the TEOS film and the P-type silicon 165.

Figure 58A:
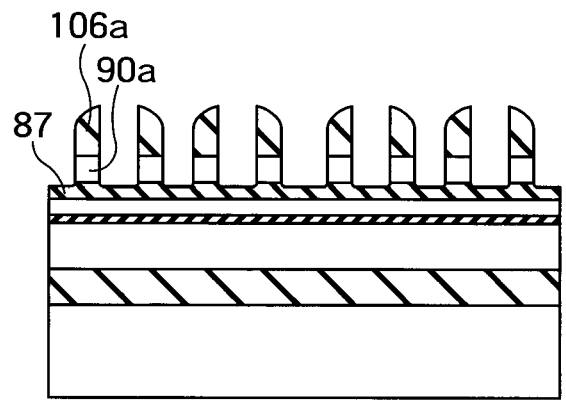
FIG. 58C is a partial plan view for explaining a manufacturing method for the semiconductor storage device depicted in FIG. 1.
Figure 58B:
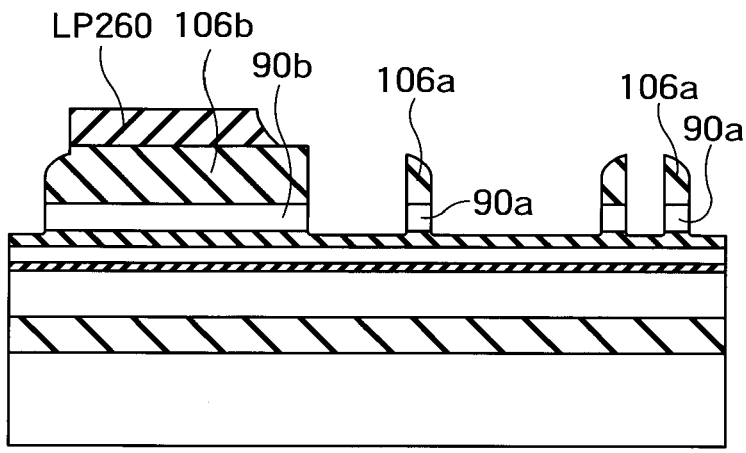
Figure 58C:
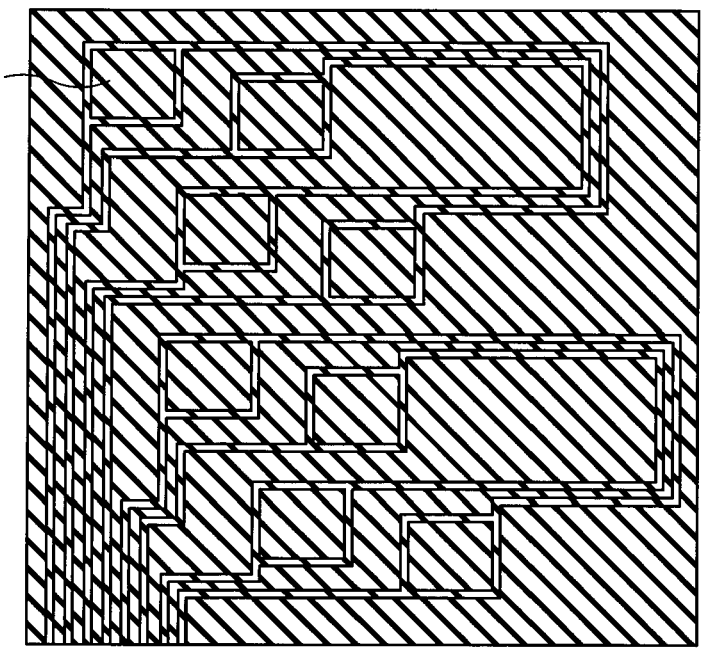

Then, as shown in partial cross-sectional views of FIGS. 58A and 58B, the polysilicon film 89 is selectively removed based on anisotropic etching using the mask patterns 106a and LP26 as masks. As a result, the polysilicon film 89 becomes a polysilicon film 90a in the cell section Rc, and it becomes a polysilicon film 90b in the peripheral circuit section Rp. FIG. 58C is a top view showing this stage.

Figure 59A:
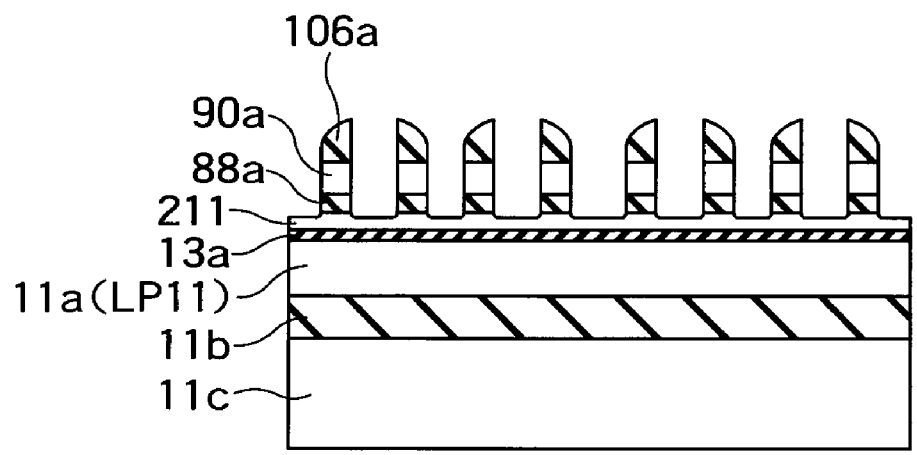
FIGS. 59A to 60B are partial cross-sectional views for explaining a manufacturing method for the semiconductor storage device depicted in FIG. 1.
Figure 59B:
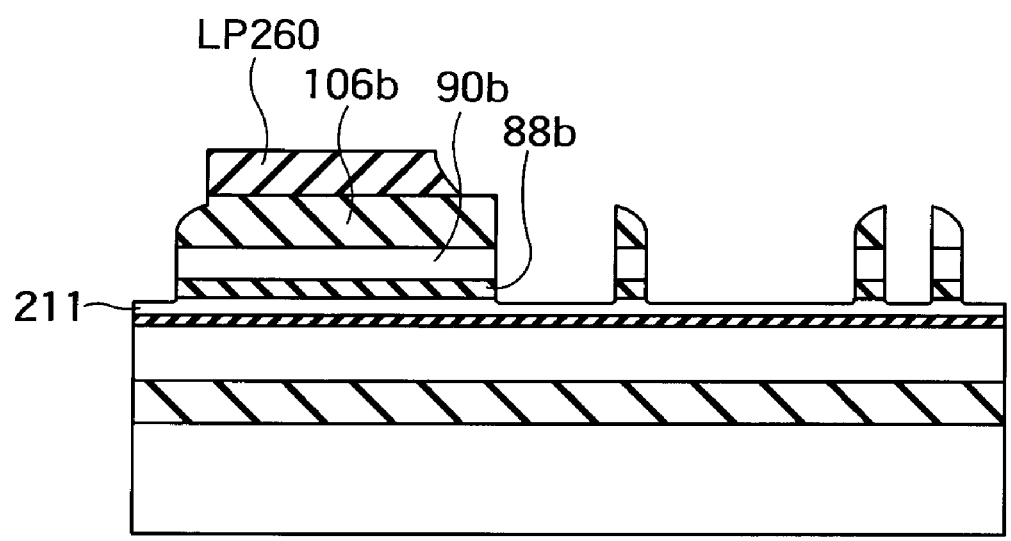
Figure 60A:
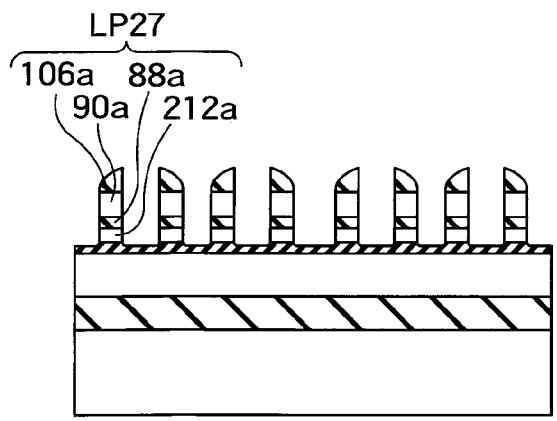
FIG. 60C is a partial plan view for explaining a manufacturing method for the semiconductor storage device depicted in FIG. 1.
Figure 60B:
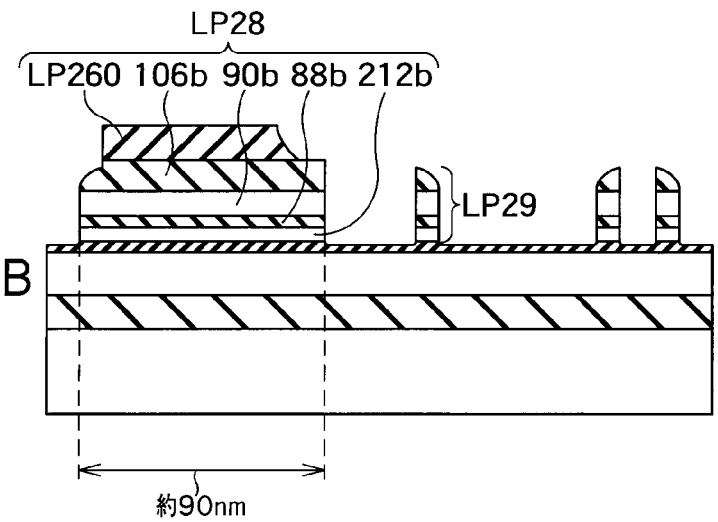
Figure 60C:
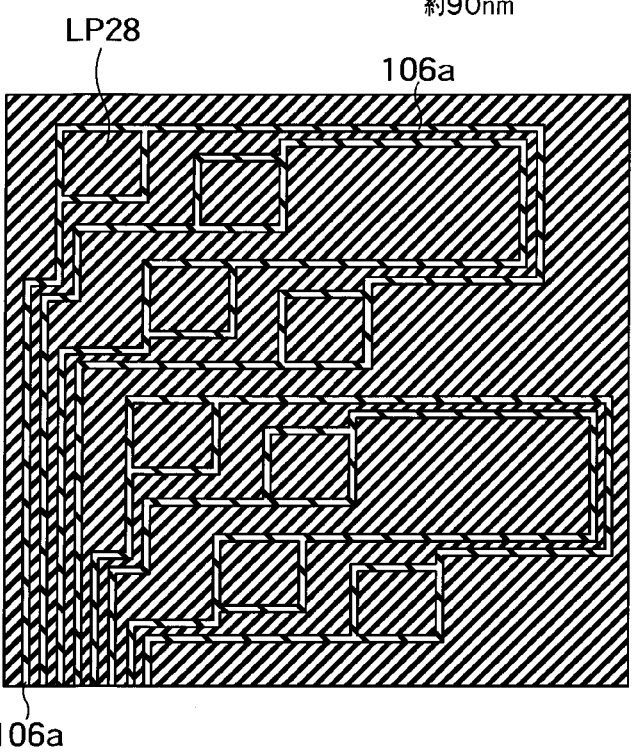

Subsequently, as shown in partial cross-sectional views of FIGS. 59A and 59B, the inter-poly insulating film 87 is selectively removed based on anisotropic etching to provide inter-poly insulating films 88a and 88b. Furthermore, as shown in partial cross-sectional views of FIGS. 60A and 60B, the polysilicon film 211 is selectively removed based on anisotropic etching to provide polysilicon films 212a and 212b. FIG. 60C is a top view showing this stage.

With the above-explained processes, in the cell section Rc, the polysilicon film 90a with a width of 9 nm that eventually becomes each word line 29 is formed, and a polysilicon dot region 212a is formed below the polysilicon film 90a so as to sandwich the inter-poly insulating film 88a therebetween. At the same time, in the peripheral circuit region Rp, an island pattern LP28 having a width of approximately 90 nm is formed for each polysilicon film 90b.

Figure 61:
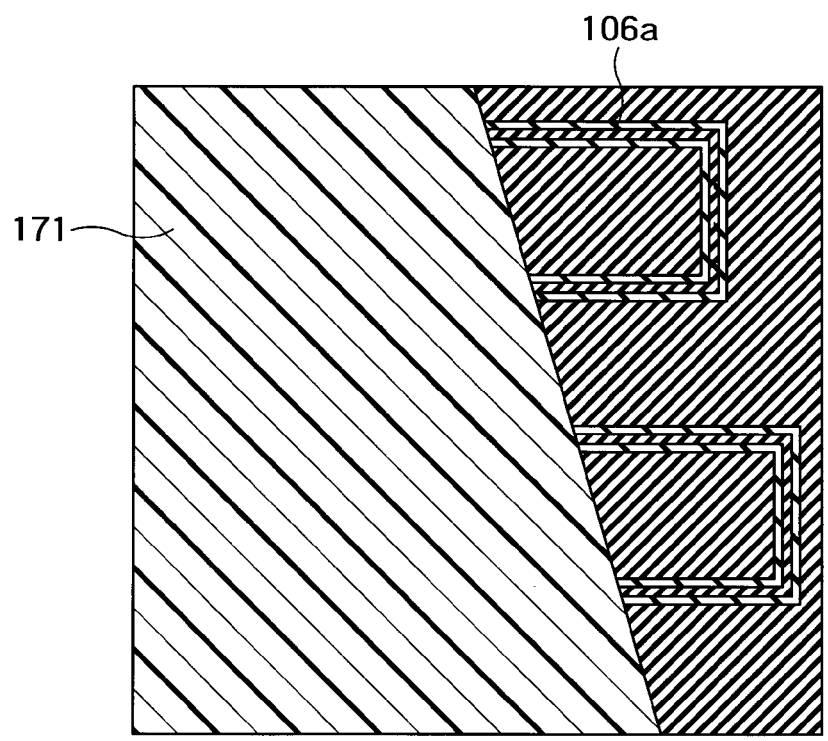
FIGS. 61 to 63 are partial plan views for explaining a manufacturing method for the semiconductor storage device depicted in FIG. 1.

Then, as shown in a plan view of FIG. 61, a photoresist 171 is formed by patterning using a photoresist in such a manner that portions of fine patterns close to each other in the peripheral circuit section Rp are alone exposed. At this time, the cell section Rc is completely covered with the photoresist 171.

Figure 62:
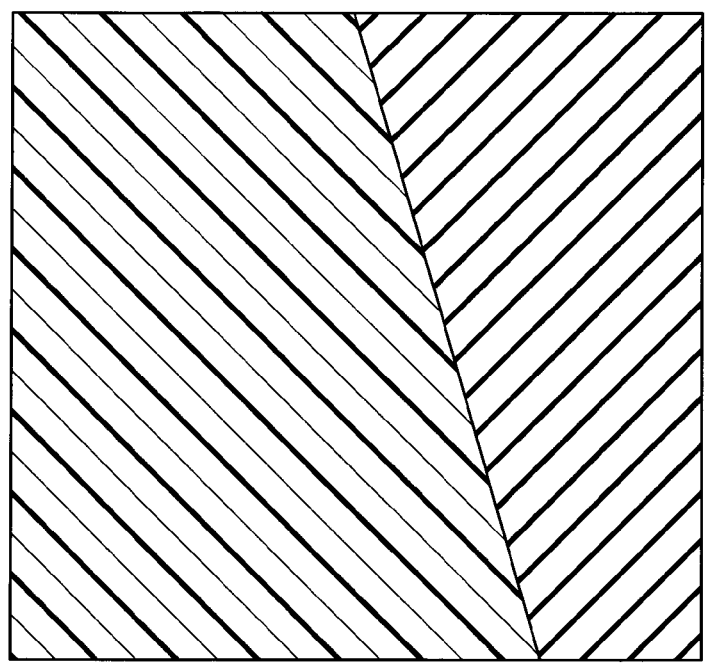
Figure 63:
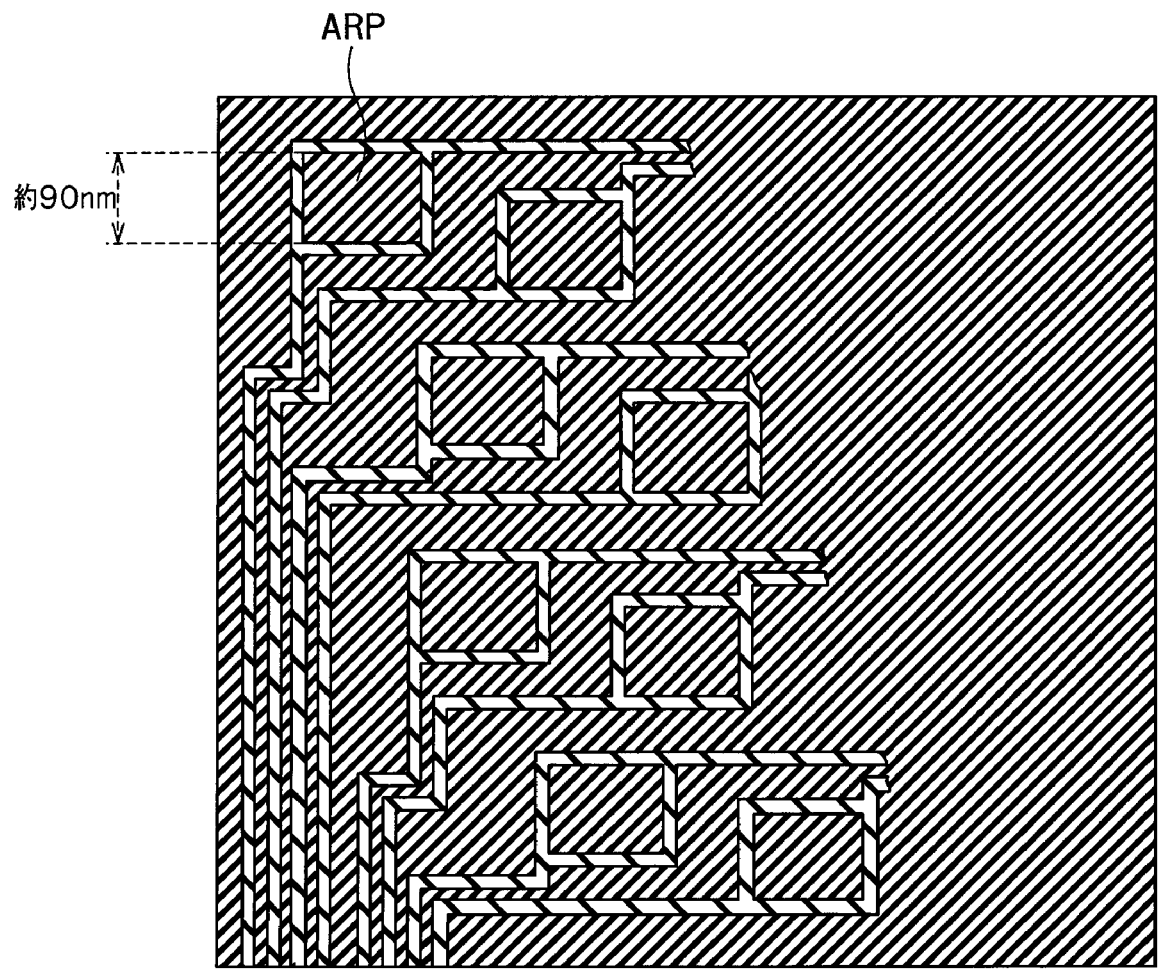

Subsequently, as shown in a plan view of FIG. 62, a part of the line pattern LP29 that lies below a part of the line pattern LP29 and is not covered with the photoresist 171 is selectively removed based on anisotropic etching using the photoresist 171 as a mask. Then, the photoresist 171 is removed by ashing. Consequently, as shown in a plan view of FIG. 63, a loop portion of the line pattern LP29 that connects the island patterns with each other is disconnected in the peripheral circuit section Rp, and each pad region ARP having a width of approximately 90 nm is formed for each word line.

Subsequently, as shown in partial cross-sectional views of FIGS. 64A and 64B, a polysilicon oxide film 33 is formed on respective sidewalls of the line patterns LP27, LP28, and LP29 based on a thermal oxidation process. In this embodiment, a film thickness of the oxide film 33 is set to 4 nm. As a result, a film thickness of the polysilicon dot region 212a is reduced to be turned to the quantum dot 21 having a width of 5 nm, and a film thickness of the polysilicon film 90a is likewise reduced to be turned to the word line 29 having a width of 5 nm.

Thereafter, the interlayer insulating film 301 is formed through deposition of an interlayer insulating film, flattening using the nitride film 106a as a stopper, and deposition of an insulating film, and each bit line 31 and others are formed, thereby obtaining the semiconductor storage device 1 shown in FIGS. 1 to 3.

With the above-explained processes, there can be provided the semiconductor storage device including the quantum dots having a high integrity formed by defining the quantum dots 21a to 21d aligned at the intervals S3, S2, and S3 as one unit in the bit line direction, repeating this unit at the intervals S4, defining the quantum dots 21a, 21e, 21f, and 21g aligned at the intervals S3, S2, and S3 as one unit in the word line direction, and repeating this unit at the intervals S4. In this embodiment, a size of the quantum dot memory element is 5 nm×5 nm×5 nm, and the respective intervals between the quantum dots are the interval S2=18 mm, the interval S3=20 nm, and the interval S4=22 nm, thus forming the memory array structure having the high integrity. Additionally, the pad structure in the peripheral circuit section Rp can also be formed.

According to this embodiment, a size of the quantum dot 21 as a single storage element is determined by a film thickness of the mask pattern and a thermal oxidation amount in the sidewall mask etching process without being dependent on a resolution of lithography. With respect to the mask pattern in the sidewall mask etching process, a film of several nm can be formed with excellent uniformity by the current process technology, and an oxidation amount based on thermal oxidation can also be controlled with excellent uniformity in units of several nm. Therefore, using the manufacturing method according to this embodiment enables manufacturing the semiconductor storage device including the nano-scale quantum dots with excellent uniformity based on the current process technology for mass production. Further, according to this embodiment, the semiconductor storage device can be manufactured with a high throughput at a low manufacturing cost.

Energy E required for one electron to be tunneled to the quantum dot can be represented as the following expression by charge storage energy Ec of the quantum dot and a quantum energy level Ek in the quantum dot:

$$E = Ec + Ek \qquad \text{Expression (1)}$$

Here, the charge storage energy Ec can be expressed as follows:

$$E_c = \frac{e^2}{C} \qquad \text{Expression (2)}$$

In case of a quantum dot confined with an infinite potential, Ek can be represented by the following expression:

$$E_k(n, m, l) = \left(\frac{\hbar^2}{2m^*}\right)\left\{\left(\frac{n\pi}{Lz}\right)^2 + \left(\frac{m\pi}{Ly}\right)^2 + \left(\frac{l\pi}{Lx}\right)^2\right\}, \qquad \text{Expression (3)}$$

$$(l, m, n = 1, 2, 3, \ldots)$$

e is an electron charge amount, C is a junction capacitance of the quantum dot, m* is an electron effective mass, ℏ is a Dirac constant, and Lx, Ly and Lz are lengths of the quantum dot in an x direction, a y direction, and a z direction. In this embodiment, when the tunnel insulating film 13 is formed with a film thickness of 5 nm, the junction capacitance C is calculated as $1.7 \times 10^{-19}$ F, and Ec is calculated as 960 meV. On the other hand, thermal energy of the electron is approximately 26 meV at room temperature (300 K), Coulomb energy Ec is sufficiently larger than this energy, and it can be said that a Coulomb blockade phenomenon can be utilized even though a thermal fluctuation of the electron are taken into consideration.

Furthermore, the electron written in the quantum dot sequentially occupies quantum energy levels in the quantum dot from lower one to higher one. Approximately calculating Ek in this embodiment from Expression (3), a first quantum energy level E0 is 130 meV, a second quantum energy level E1 is 260 meV, and there is an energy difference of approximately 130 meV between the levels. Considering a variation in the actual manufacturing process, when a size of the quantum dot varies ±10%, an energy difference between E0 and E1 is a difference of approximately 50 meV. That is, the first eigenstate and the second eigenstate are separated in terms of energy even though a process variation or a thermal fluctuation of the electron is taken into consideration, and a state where one electron is present in the quantum dot and a state where two electrons are present in the same are discriminated. The same estimation can be performed with respect to the second and subsequent quantum energy levels. As understood from the above, according to this embodiment, x, y and z direction energies of each quantum dot element are quantized, respectively, by three-dimensional confinement. Therefore, one of characteristic points of the single electron memory referred to in this embodiment lies in that the writing of electrons can be controlled by the Coulomb blockade phenomenon and a multi-leveled state can be discriminated by the number of the electrons which occupy the respective energy levels in each quantum dot element.

Since a cycle of a quantum dot group formed by the sidewall mask etching process can be controlled by lithography, many quantum dots can be cyclically and regularly aligned by combining the current lithography technology with the sidewall mask etching process. Therefore, the present embodiment is assuredly suitable for mass production as compared with a manufacturing method that is dependent on self-growth of the quantum dot or a manufacturing method of randomly forming the quantum dot in a quantum dot region in conventional techniques.

Moreover, in this embodiment, the sidewall mask etching process to form the element isolation region is carried out twice and the sidewall mask etching process to form each word line is performed twice, thereby forming each quantum dot of 5 nm×5 nm×5 nm. However, when the sidewall mask etching process is carried out for three times or more for formation of the element isolation region and the sidewall process is performed three times or more for formation of each word line, a quantum dot element alignment having, e.g., a dot size of 2.5 nm×2.5 nm×2.5 nm and a quadruple integration degree can be formed from the same lithography pattern as that in this embodiment. The lower limit of the size of each quantum dot element is not particularly present, so long as they can be manufactured in an excellent uniformity. The method of repeatedly performing the sidewall mask etching processes more than once from a single lithography process to form a fine pattern in this manner is called a "multi-sidewall mask etching process".

According to the manufacturing method of this embodiment, since the quantum dots can be regularly formed in a reticular pattern, the storage elements arranged on a channel in series can be connected with the bit lines as is depicted in FIG. 1. Furthermore, since the control gates (the word lines) are formed in a direction perpendicular to the bit lines with the same cycle as the quantum dots and each pad region having a sufficient size is formed at a terminal end of each gate, it is possible to form the storage device having a higher integration degree than that in a structure where a source electrode, a drain electrode, and a gate electrode are pulled out for each storage element which can be seen in a conventional quantum effect device.

Moreover, since the energy levels are dispersed based on the quantum effect in each memory cell, the present embodiment is suitable for realization of multi-level.

Additionally, the quantum dot forming method according to this embodiment can be applied to formation of a semiconductor quantum dot consisting of not only an Si material but also, e.g., a gallium arsenide or an indium arsenide. Further, the method according to this embodiment can be applied to dot formation using an insulating film material such as a silicon nitride or an aluminum oxide which can demonstrate a charge storage effect or a metal.

Furthermore, in this embodiment, the sidewall mask etching process has been applied to the formation of the charge storage region of the memory element, but it can also be applied to the formation of a quantum dot portion of each single electron transistor (SET).

What is claimed is:

1. A semiconductor storage device comprising:
   a substrate having at least one semiconductor layer located on a surface of the substrate; and
   a plurality of quantum dot elements forming a charge storage layer formed above the semiconductor layer via a first insulating film that becomes a tunnel insulating film in such a manner that the quantum dot elements are connected with a bit line in series,
   wherein each quantum dot element forms a single-electron memory.

2. The semiconductor storage device according to claim 1, wherein first to fourth quantum dot elements in the plurality of quantum dot elements which are arranged to be apart from each other at first to third intervals form one unit, and the unit is cyclically repeatedly formed in such a manner that the respective units are apart from each other at fourth intervals in the bit line direction, and the first interval and the third interval are equal to each other.

3. The semiconductor storage device according to claim 1, wherein each quantum dot element has a plurality of quantum energy levels which can be discriminated from each other.

4. The semiconductor storage device according to claim 1, further comprising a word line formed on each quantum dot element in a direction perpendicular to a bit line direction with substantially the same width as each quantum dot element.

5. The semiconductor storage device according to claim 4, further comprising:
   a cell section where the quantum dot elements are formed; and
   a peripheral circuit section placed around the cell section, wherein the peripheral circuit section includes pad sections, the four pad being determined as one unit to be cyclically repeatedly formed, and
   each pad is connected with each word line in a line pattern having the same width as each word line.

6. The semiconductor storage device according to claim 1, wherein the quantum dot element has a substantially cubic shape.

7. The semiconductor storage device according to claim 5, wherein a size of one side of the cube is 5 nm or below.

8. The semiconductor storage device according to claim 1, wherein the quantum dot element is formed of silicon.

9. The semiconductor storage device according to claim 1, wherein the quantum dot element is formed of a gallium arsenide.

10. The semiconductor storage device according to claim 1, wherein the quantum dot element is formed of an indium arsenide.

11. The semiconductor storage device according to claim 1, wherein the quantum dot element is formed of a silicon nitride.

12. The semiconductor storage device according to claim 1, wherein the quantum dot element is formed of an aluminum oxide.

13. The semiconductor storage device according to claim 3, wherein three direction energies crossing at right angles to each other in each quantum dot element are quantized, respectively, by three-dimensional confinement.

* * * * *